United States Patent
Simsek-Ege et al.

(10) Patent No.: US 11,916,032 B2
(45) Date of Patent: Feb. 27, 2024

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventors: Fatma Arzum Simsek-Ege, Boise, ID (US); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 17/562,453

(22) Filed: Dec. 27, 2021

(65) Prior Publication Data
US 2023/0207505 A1 Jun. 29, 2023

(51) Int. Cl.
*H01L 25/065* (2023.01)
*H01L 23/00* (2006.01)
(Continued)

(52) U.S. Cl.
CPC .......... *H01L 24/08* (2013.01); *G11C 11/4085* (2013.01); *G11C 11/4091* (2013.01); *H01L 24/80* (2013.01); *H01L 25/0657* (2013.01); *H01L 25/18* (2013.01); *H01L 25/50* (2013.01); *H10B 12/30* (2023.02); *H10B 12/50* (2023.02); *H01L 2224/08145* (2013.01); *H01L 2224/80895* (2013.01); *H01L 2224/80896* (2013.01);
(Continued)

(58) Field of Classification Search
CPC ..... H01L 24/08; H01L 24/80; H01L 25/0657; H01L 25/18; H01L 25/50; H01L 2224/08145; H01L 2224/80895; H01L 2224/80896; H01L 2924/1436; H01L 2924/1431
See application file for complete search history.

(56) References Cited

U.S. PATENT DOCUMENTS 6,778,452 B2 8/2004 Beigel et al.
8,067,286 B2 11/2011 Parekh et al.
(Continued)

*Primary Examiner* — Thanh Y. Tran
(74) *Attorney, Agent, or Firm* — TraskBritt

(57) ABSTRACT

A microelectronic device comprises a first microelectronic device structure comprising a stack structure comprising conductive structures vertically alternating with insulative structures, a staircase structure within the stack structure, and vertical stacks of memory cells. Each vertical stack of memory cells individually comprises a vertical stack of capacitor structures, transistor structures each individually neighboring a capacitor structure of the capacitor structures, and a conductive pillar structure vertically extending through the transistor structures. The microelectronic device further comprises a second microelectronic device structure attached to the first microelectronic device structure, the second microelectronic device structure comprising a sub word line driver region comprising complementary metal-oxide-semiconductor (CMOS) circuits vertically overlying and within a horizontal area of the staircase structure, and conductive contact structures vertically extending between steps of the staircase structure and the sub word line driver region. Related memory devices, electronic systems, and methods are also described.

36 Claims, 34 Drawing Sheets

(51) Int. Cl.
*H01L 25/18* (2023.01)
*H01L 25/00* (2006.01)
*G11C 11/408* (2006.01)
*G11C 11/4091* (2006.01)
*H10B 12/00* (2023.01)

(52) U.S. Cl.
CPC ................ *H01L 2924/1431* (2013.01); *H01L 2924/1436* (2013.01)

(56) References Cited

U.S. PATENT DOCUMENTS

| | | |
|---|---|---|
| 8,153,499 B2 | 4/2012 | Or-Bach et al. |
| 8,184,471 B2 | 5/2012 | Woo et al. |
| 8,546,188 B2 | 10/2013 | Liu et al. |
| 8,716,116 B2 | 5/2014 | Parekh et al. |
| 9,543,433 B2 | 1/2017 | Anathan et al. |
| 10,366,740 B1 | 7/2019 | Kim et al. |
| 10,636,813 B1 * | 4/2020 | Xiao ................ H01L 21/02598 |
| 2019/0244933 A1 | 8/2019 | Or-Bach et al. |
| 2020/0066730 A1 | 2/2020 | Guo et al. |
| 2022/0130846 A1 * | 4/2022 | Kim ....................... H10B 41/27 |
| 2022/0399308 A1 | 12/2022 | Simsek-Ege et al. |
| 2022/0399358 A1 * | 12/2022 | Mizutani ............... H10B 41/27 |
| 2023/0018127 A1 | 1/2023 | Gandhi et al. |

* cited by examiner

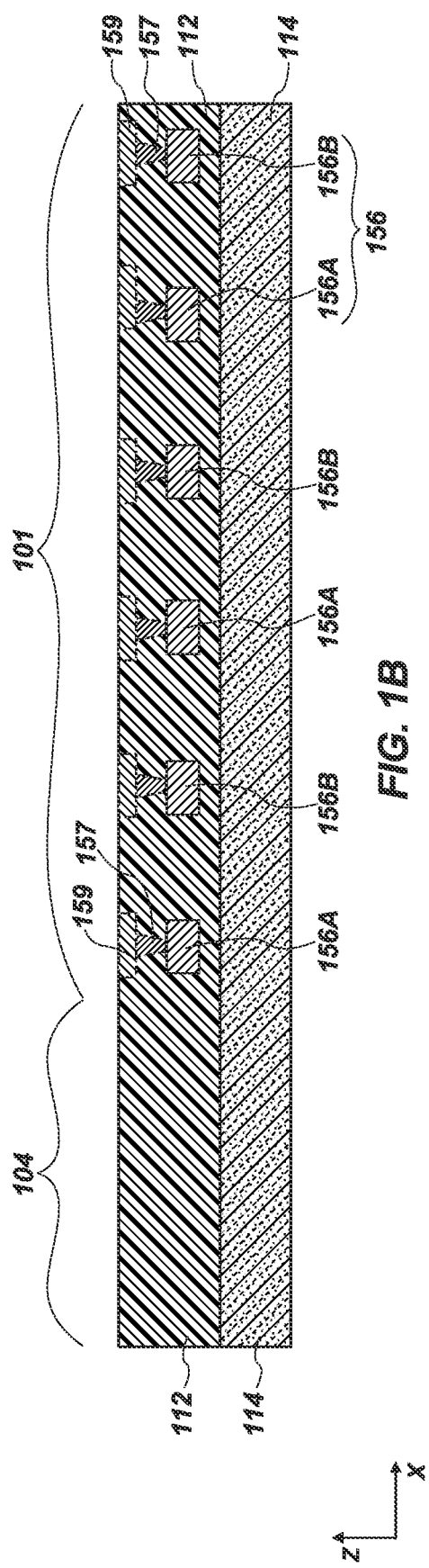
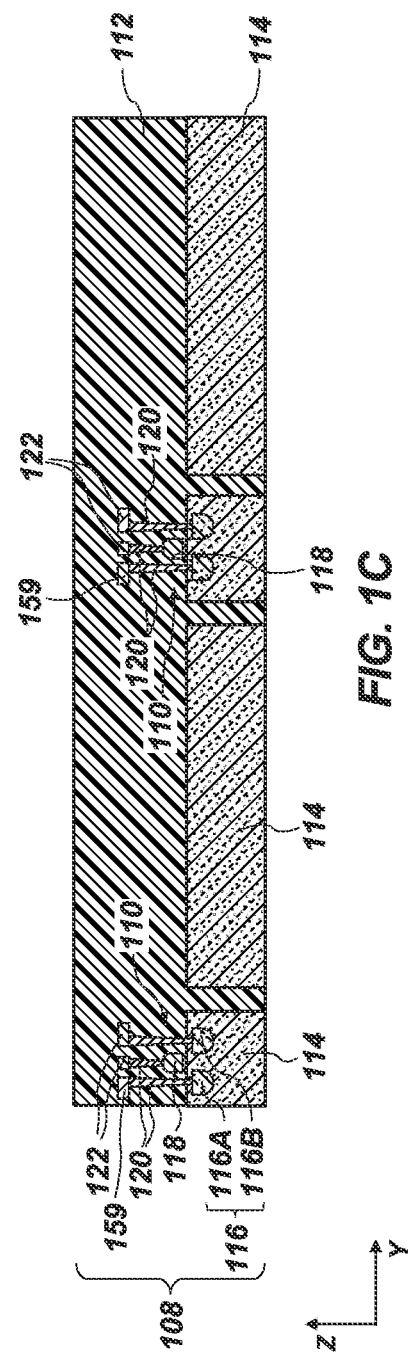
FIG. 1B
FIG. 1C

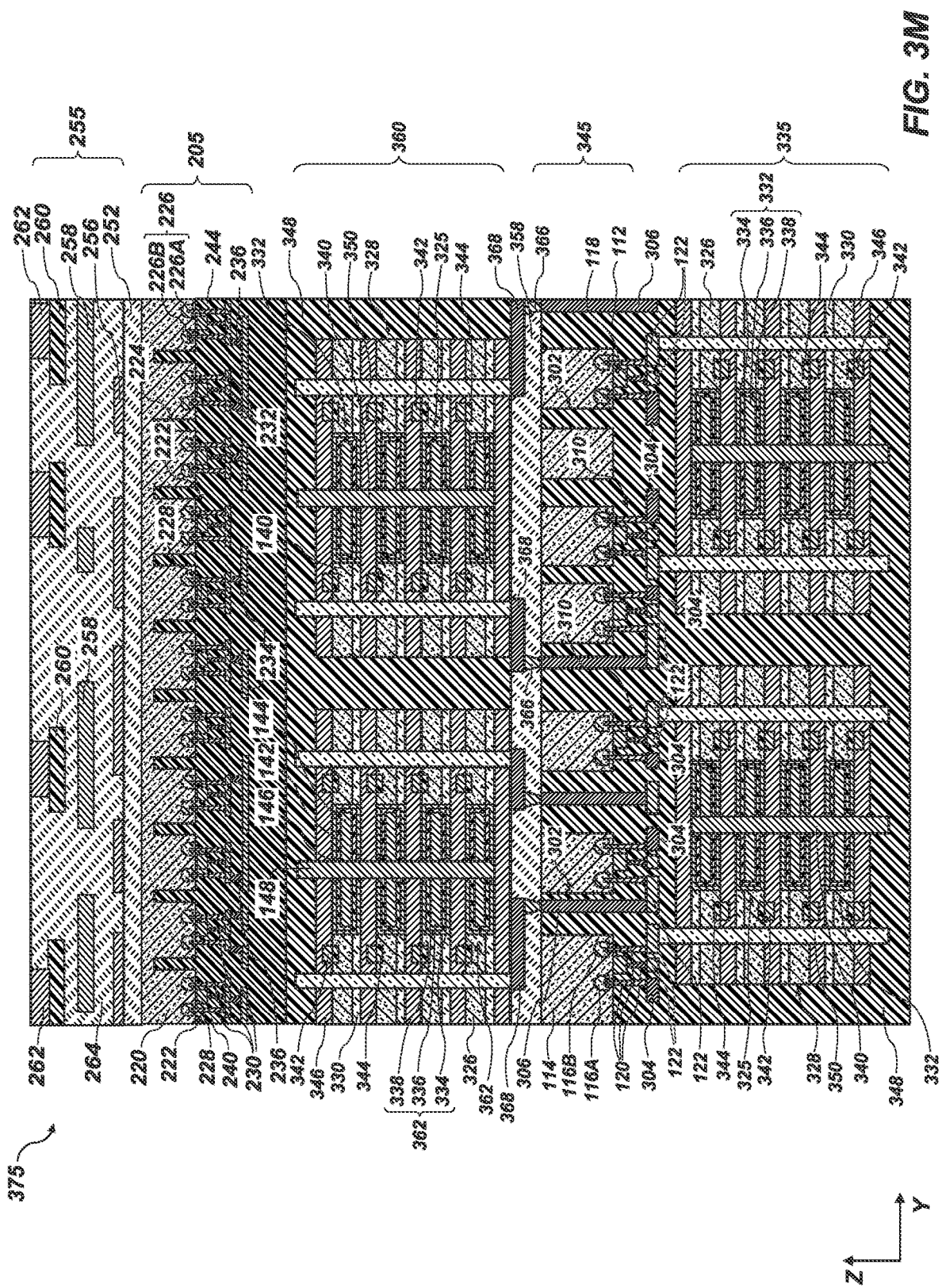

_US 11,916,032 B2_

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

BRIEF DESCRIPTION OF THE DRAWINGS

FIG. 1A through FIG. 1K include simplified partial top-down views (FIG. 1A, FIG. 1E) and simplified partial cross-sectional views (FIG. 1B through FIG. 1D, FIG. 1F through FIG. 1K) illustrating embodiments of a method of forming a first microelectronic device structure, in accordance with embodiments of the disclosure;

DETAILED DESCRIPTION

Figure 1A:
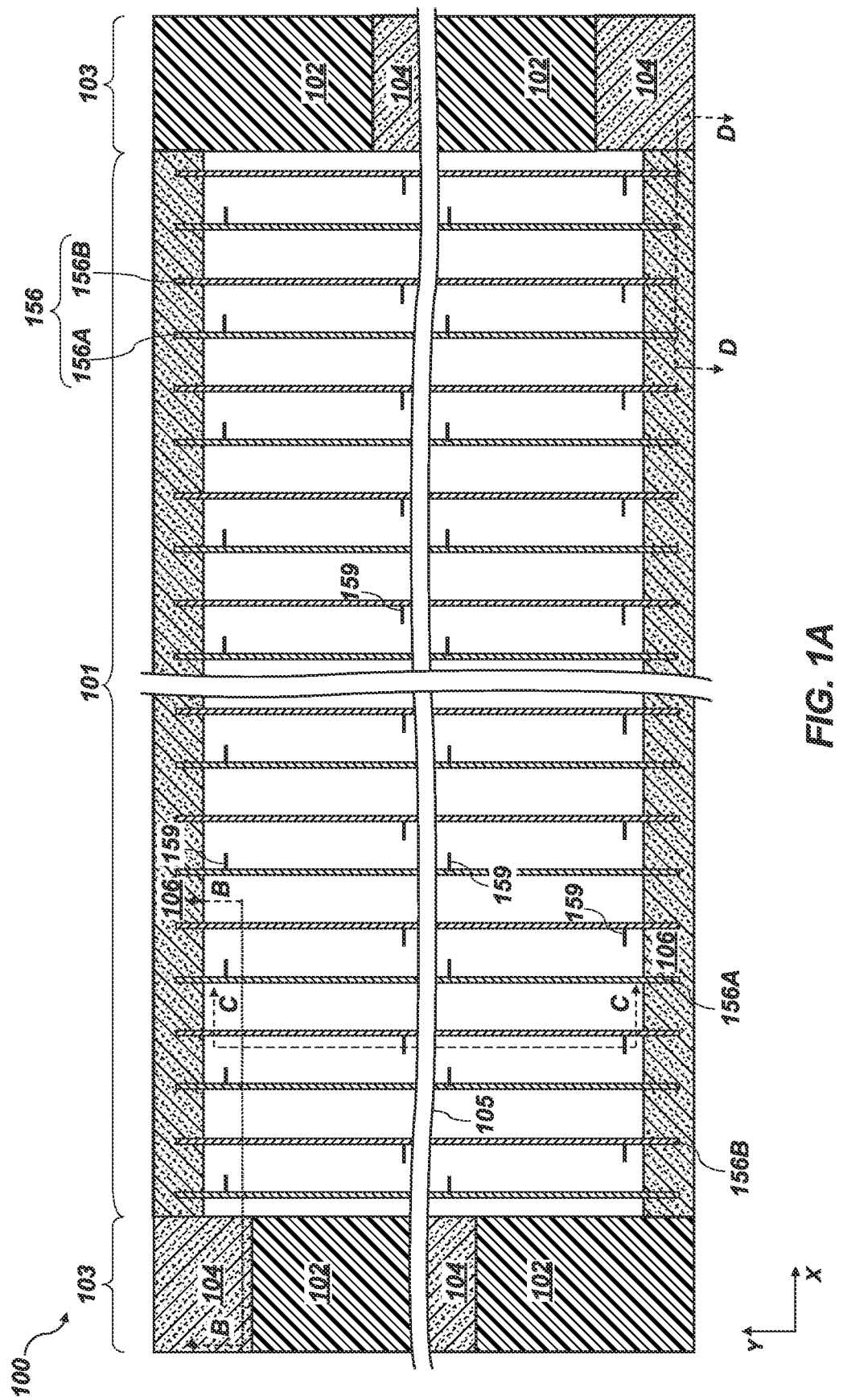

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide (AlO$_x$), a hafnium oxide (HfO$_x$), a niobium oxide (NbO$_x$), a titanium oxide (TiO$_x$), a zirconium oxide (ZrO$_x$), a tantalum oxide (TaO$_x$), and a magnesium oxide (MgO$_x$)), at least one dielectric nitride material (e.g., a silicon nitride (SiN$_y$)), at least one dielectric oxynitride material (e.g., a silicon oxynitride (SiO$_x$N$_y$)), and at least one dielectric carboxynitride material (e.g., a silicon carboxynitride (SiO$_x$C$_z$N$_y$)). Formulae including one or more of "x," "y," and "z" herein (e.g., SiO$_x$, AlO$_x$, HfO$_x$, NbO$_x$, TiO$_x$, SiN$_y$, SiO$_x$N$_y$, SiO$_x$C$_z$N$_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include, for example, global digit lines extending in a horizontal direction and a multiplexer region comprising transistor structures (e.g., multiplexers) proximate (e.g., vertically neighboring, horizontally neighboring) and in electrical communication with the global digit lines. A memory array vertically overlies the global digit lines and the multiplexer region, the memory array including vertical stacks of memory cells, each stack of memory cells comprising a stack of storage devices (e.g., capacitor structures), each storage device operably coupled to an access device (e.g., a transistor) of a stack of access devices. The access devices and the storage devices may be vertically spaced from each other by one or more insulative structures. A stack structure comprising vertically alternating levels of conductive structures and insulative structures laterally neighbors the storage devices and extends through and intersects the stack of access devices. Conductive structures of the stack structure may be operably coupled to the access devices. In some embodiments, each access device may be configured to be operably coupled to a conductive structure (also referred to as a "first conductive line," an "access line," or a "word line") vertically neighboring the respective access device. Lateral ends of the stack structure may comprise a staircase structure including steps, each step defined at a lateral edge of a conductive structure. Each step may individually be in electrical communication with a first conductive contact structure that is, in turn, in electrical communication with additional circuitry of the microelectronic device, such as one or more components of the second microelectronic device structure. A conductive pillar structure (also referred to as a "second conductive line," a "local digit line," a "digit line pillar structure," or a "vertical digit line.") may vertically extend through each vertical stack of memory cells, such as through the access devices of the stack of access devices and be in electrical communication with the multiplexers of the multiplexer region. The conductive pillar structures may be in electrical communication with the global digit lines through the multiplexers. Accordingly, the multiplexers may each individually be in electrical communication with one of the global digit lines and one of the second conductive lines. The global digit lines are, in turn, in electrical communication with second conductive contacts that are configured to be in electrical communication with the one or more components of the second microelectronic device structure. The first microelectronic device structure may further include first conductive contact exit regions and second conductive contact exit regions for electrically connecting the first conductive contact structures and the second conductive contact structures, respectively, with circuitry of a second microelectronic device structure. The first microelectronic device additionally includes socket regions including electrical connections for coupling to back end of the line (BEOL) structures and circuitry of the microelectronic device.

In some embodiments, the first microelectronic device structure further comprises an additional memory array vertically below the global digit lines and the multiplexer region. The additional memory array may be substantially similar to the memory array vertically above the global digit lines and comprises, for example, additional vertical stacks of memory cells including vertical stacks of additional storage devices horizontally neighboring vertical stacks of additional access devices and additional conductive structures vertically extending through the stack of additional access devices and electrically coupled to the global digit lines.

In some such embodiments, the global digit lines and the multiplexer region may be vertically interposed between the memory array and the additional memory array. In some embodiments, the first microelectronic device structure does not include control logic circuitry other than the multiplexers of the multiplexer region.

The second microelectronic device structure may include control logic devices configured to effectuate at least a portion of control operations for the stacks of memory cells. The second microelectronic device may include various high performance complementary metal oxide semiconductor (CMOS) circuitry, such as, for example, sense amplifier circuitry, word line driver circuitry (e.g., sub word line driver circuitry, main word line driver circuitry), other CMOS circuitry, and BEOL structures. The first conductive contact structures of the first microelectronic device structure are vertically below (e.g., directly vertically below and within horizontal boundaries (e.g., a horizontal area) of the) sub word line driver circuitry of the second microelectronic device structure. The second conductive contact structures of the first microelectronic device structure are vertically below (e.g., directly vertically below) and within horizontal boundaries (e.g., a horizontal area) of the sense amplifier circuitry of the second microelectronic device structure. Placing the first conductive contact structures and the second conductive contact structures directly vertically below the respective sub word line driver circuitry and the sense amplifier circuitry may facilitate reducing a distance between the first conductive contact structures and the second conductive contact structures and the respective sub word line driver circuitry and the sense amplifier circuitry, facilitating an increased operating speed of the microelectronic device.

FIG. 1A through FIG. 1K are simplified partial top-down views (FIG. 1A, FIG. 1E) and simplified partial cross-sectional views (FIG. 1B through FIG. 1D, FIG. 1F through FIG. 1K) illustrating different processing stages of a method of forming a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1K may be used in various devices and electronic systems. The first microelectronic device structure 100 may also be referred to herein as a die or a wafer.

Figure 1D:
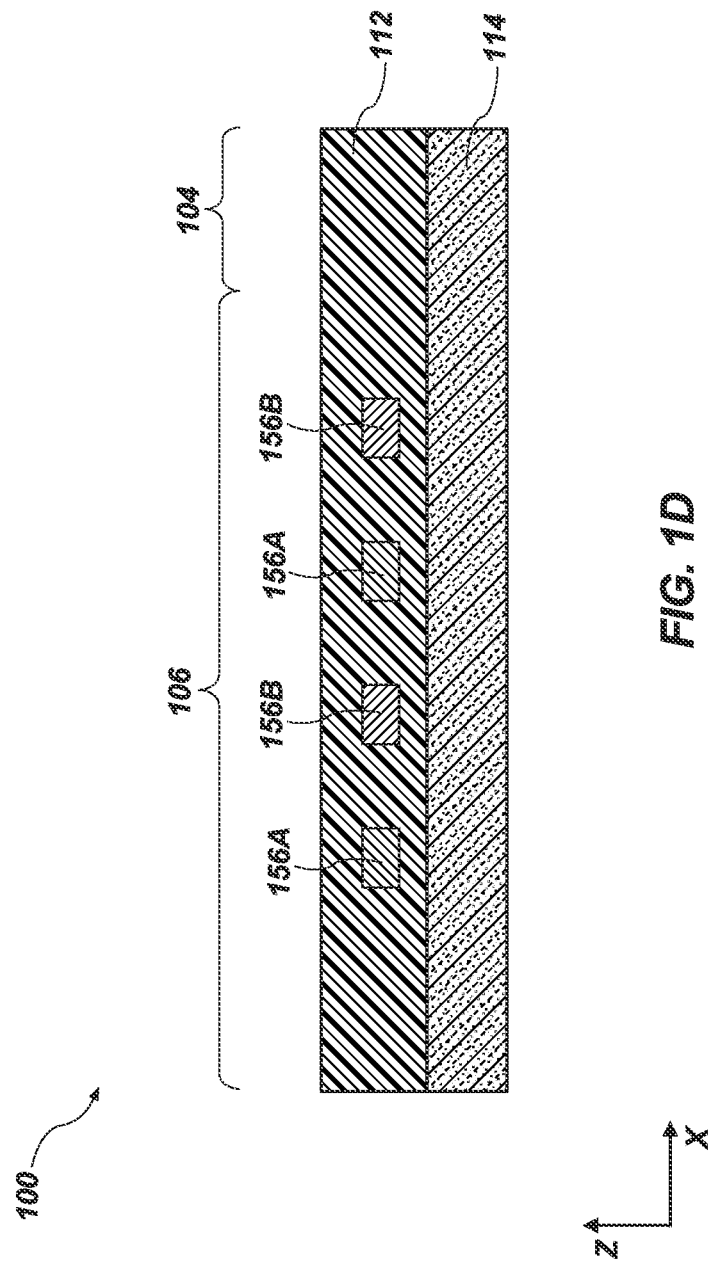

FIG. 1A through FIG. 1D illustrate different portions of the first microelectronic device structure 100 during a processing stage of forming the first microelectronic device structure 100. FIG. 1A is a simplified partial top-down view of the first microelectronic device structure 100; FIG. 1B is a simplified partial cross-sectional view of the first microelectronic device structure 100 taken through section line B-B of FIG. 1A; FIG. 1C is a simplified partial cross-sectional view of the first microelectronic device structure 100 taken through section line C-C of FIG. 1A; and FIG. 1D is a simplified partial cross-sectional view of the first microelectronic device structure 100 taken through section line D-D of FIG. 1A.

Referring to FIG. 1A, the first microelectronic device structure 100 includes an array region 101 and one or more peripheral regions 103 located external to the array region 101. In some embodiments, the peripheral regions 103 laterally (e.g., in at least X-direction) surround the array region 101. In some embodiments, the peripheral regions 103 substantially surround all horizontal sides of the array region 101 in a first horizontal direction (e.g., the X-direction). In other embodiments, the peripheral regions 103 substantially surround all horizontal boundaries (e.g., an entire horizontal area) of the array region 101.

The peripheral region 103 may include, for example, socket regions 102 in which one or more electrically conductive contact structures are subsequently formed for forming electrical connections between the first microelectronic device structure 100 and a second microelectronic device structure. Each socket region 102 may individually be horizontally neighbored (e.g., in the Y-direction) by a first conductive contact exit region 104. In some embodiments, the socket regions 102 may electrically connect circuitry of the first microelectronic device structure 100 to BEOL structures of a second microelectronic device structure (e.g., the second microelectronic device structure 200 (FIG. 2A)).

The first conductive contact exit regions 104 may horizontally neighbor (e.g., in the Y-direction) the socket regions 102 and horizontally neighbor (e.g., in the X-direction) the array region 101. The first conductive contact exit regions 104 may be formed to include first conductive contacts for electrically connecting one or more components of the first microelectronic device structure 100 to circuitry of a second microelectronic device structure (e.g., the second microelectronic device structure 200 (FIG. 2A)).

In some embodiments, each of the first conductive contact exit regions 104 exhibits about a same size (e.g., horizontal area in the XY plane) as each other of the first conductive contact exit regions 104. Although FIG. 1A illustrates some of the first conductive contact exit regions 104 as having a different size (due to the location of a break line), it will be understood that the first conductive contact exit regions 104 exhibit substantially the same size in some embodiments.

Second conductive contact exit regions 106 may horizontally neighbor (e.g., in the X-direction) the socket regions 102 and the first conductive contact exit regions 104. In some embodiments, the second conductive contact exit regions 106 are located at horizontal ends (e.g., in the Y-direction) of the array region 101. The second conductive contact exit regions 106 may be formed to include second conductive contacts for electrically connecting one or more components of the first microelectronic device structure 100 to circuitry of a second microelectronic device structure (e.g., the second microelectronic device structure 200 (FIG. 2A)).

Each of the second conductive contact exit regions 106 may exhibit about a same size (e.g., horizontal area in the XY plane) as each other of the second conductive contact exit regions 106. In some embodiments, one or more (e.g., each) of the second conductive contact exit regions 106 exhibits a different size than one or more of (e.g., each of) the first conductive contact exit regions 104.

With collective reference to FIG. 1A, FIG. 1B, and FIG. 1D, global digit lines 156 (also referred to as "conductive lines") horizontally (e.g., in the Y-direction) extend through the array region 101 and horizontally terminate in the second conductive contact exit region 106. The global digit lines 156 are illustrated as having a relatively small size in the view of FIG. 1A for clarity and ease of understanding the description. It will be understood that the global digit lines 156 may have a dimension (e.g., in the X-direction) larger than that illustrated in FIG. 1A.

The global digit lines 156 include a first group 156A and a second group 156B of global digit lines 156, which are collectively referred to herein as global digit lines 156. In some embodiments, the first group 156A of global digit lines 156 constitute about one-half of the total number of global digit lines 156; and the second group 156B of the global digit lines 156 constitute about the other one-half of the total number of global digit lines 156. In some embodiments, every other one of the global digit lines 156 comprises one of the first group 156A of global digit lines 156 and the other every other one of the global digit lines 156 comprises one of the second group 156B of global digit lines 156. As described in further detail below, the first group 156A of global digit lines 156 are electrically coupled to horizontally aligned (e.g., in the X-direction) conductive pillar structures (e.g., conductive pillar structures 152) vertically extending (e.g., in the Z-direction) through the array region 101 and the second group 156B of global digit lines 156 are electrically coupled to other horizontally aligned (e.g., in the X-direction) conductive pillar structures vertically extending (e.g., in the Z-direction) through the array region 101.

With reference to FIG. 1C, the array region 101 may include a multiplexer (MUX) region 108 including transistor structures 110 (also referred to as multiplexers) comprising a first base structure 114 within a first insulative material 112. The multiplexer region 108 comprises multiplexers electrically coupled to multiplexer control logic circuits and/or multiplexer driver circuits. In some embodiments, the multiplexer region 108 comprises a silicon wafer. In addition, the multiplexer region 108 may include different layers, structures, devices, and/or regions formed therein and/or thereon.

The first insulative material 112 may be formed of and include insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfD_2$), zirconium dioxide ($ZrO_2$), hafnium dioxide ($HfD_2$), tantalum oxide ($TaO_2$), magnesium oxide (MgO), aluminum oxide ($Al_2O_3$), or a combination thereof), and amorphous carbon. In some embodiments, the first insulative material 112 comprises silicon dioxide.

The first base structure 114 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 114 comprises a silicon wafer.

In some embodiments, the multiplexer region 108 of the first base structure 114 includes different layers, structures, devices, and/or regions formed therein and/or thereon. In some embodiments, the multiplexer region 108 comprises complementary metal-oxide-semiconductor (CMOS) circuitry. In some embodiments, the first base structure 114 is substantially free of CMOS circuitry other than the transistor structures 110 of the multiplexer region 108. In other words, in some such embodiments, the first base structure 114 may be substantially free of CMOS circuitry other than of multiplexers.

In some embodiments, the first base structure 114 comprises conductively doped regions 116 and undoped regions. The conductively doped regions 116 may, for example, be employed as source regions and drain regions for the transistor structures 110 and the undoped regions may, for example, be employed as channel regions for the transistor structures 110. The conductively doped regions 116 of an individual transistor structure 110 may include a source region 116A and a drain region 116B. In some embodiments, the conductively doped regions 116 of each transistor structure 110 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 116 comprise conductively doped silicon.

The transistor structures 110 include gate structures 118 vertically overlying the first base structure 114 and horizontally extending between conductively doped regions 116. The conductively doped regions 116 and the gate structures 118 may individually be electrically coupled to first conductive interconnect structures 120. In some embodiments, the gate structures 118 are also referred to as "multiplexer gates." In some embodiments, the gate structures 118 are electrically coupled to a multiplexer driver circuit and/or multiplexer control logic. The first conductive interconnect structures 120 may individually electrically couple the conductively doped regions 116 and the gate structures 118 to one or more first routing structures 122 and one or more global digit line routing structures 159.

With reference to FIG. 1B, in some embodiments, within the array region 101, the global digit lines 156 may be coupled to second conductive interconnect structures 157 and global digit line routing structures 159. The second conductive interconnect structures 157 and the global digit line routing structures 159 are illustrated in broken lines in FIG. 1B because the second conductive interconnect structures 157 and the global digit line routing structures 159 may be in a different plane than that illustrated in FIG. 1B. For example, the second conductive interconnect structures 157 and the global digit line routing structures 159 may be in the XZ plane, but horizontally offset (e.g., in the Y-direction) from the view illustrated in FIG. 1B. As described in further detail below, the global digit line routing structures 159 electrically couple one of the global digit lines 156 (FIG. 1A, FIG. 1B) by to a transistor structure 110. For example, with collective reference to FIG. 1A through FIG. 1C, the global digit lines 156 (FIG. 1A, FIG. 1B) are electrically coupled to global digit line routing structures 159 (FIG. 1B) that are, in turn, in electrical communication with a transistor structure 110, such as the source region 116A of the transistor structure 110. In other embodiments, the global digit line routing structures 159 may be electrically connected to the drain region 116B or to the gate structure 118.

The first conductive interconnect structures 120, the first routing structures 122, the second conductive interconnect structures 157, and the global digit line routing structures 159 may individually be formed of and include conductive material. In some embodiments, the first conductive interconnect structures 120, the second conductive interconnect structures 157, and the global digit line routing structures 159 individually comprise tungsten. In other embodiments, the first conductive interconnect structures 120, the first routing structures 122, the second conductive interconnect structures 157, and the global digit line routing structures 159 individually comprise copper.

In some embodiments, the digit line routing structures 159 are individually formed of and include a material exhibiting a relatively low RC value to facilitate an increased speed of data transmission. In some embodiments, the digit line routing structures 159 individually comprise copper.

The global digit lines 156 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 156 individually comprise tungsten. In other embodiments, the global digit lines 156 individually comprise copper.

Figure 1E:
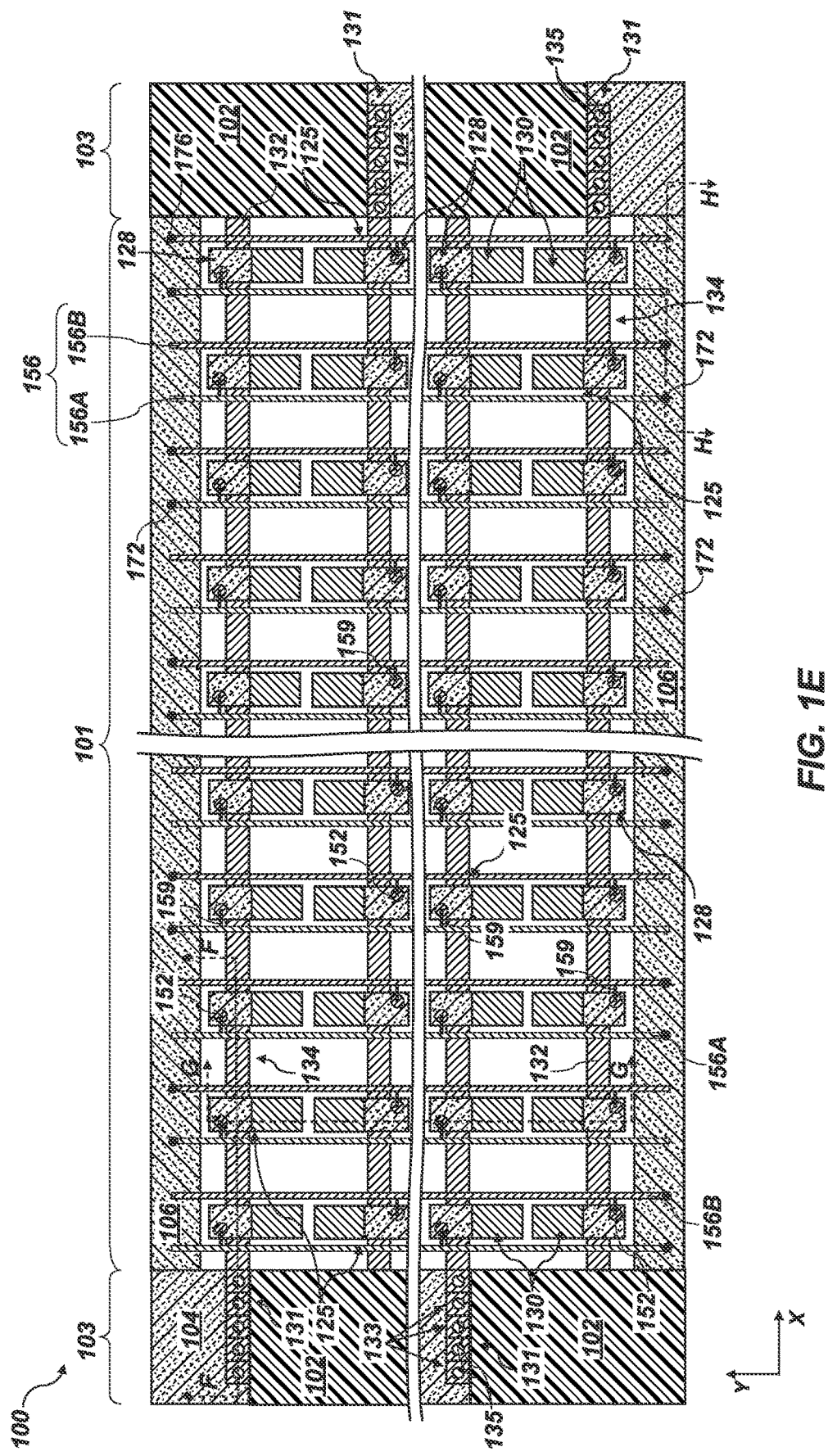
Figure 1F:
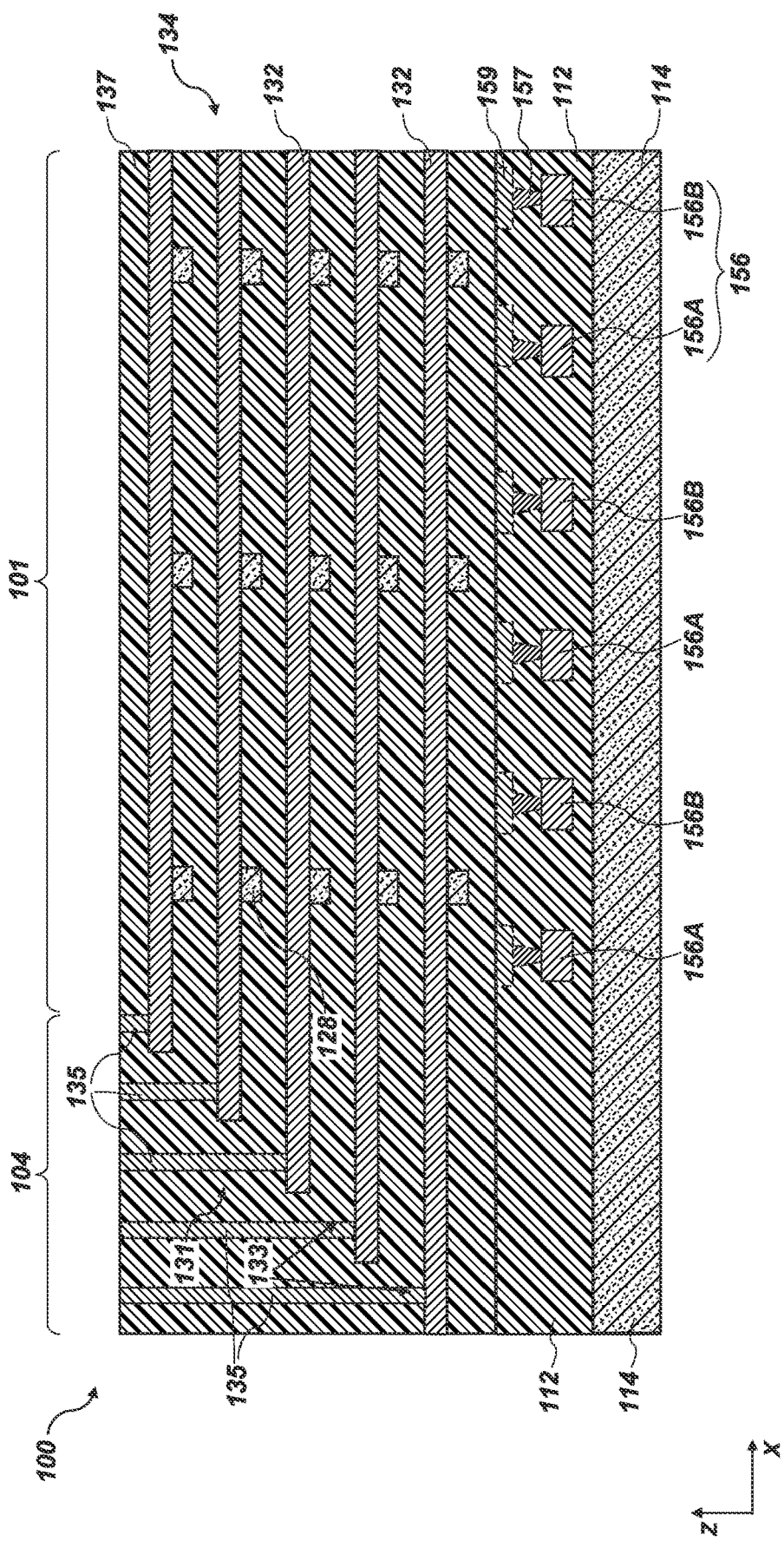
Figure 1G:
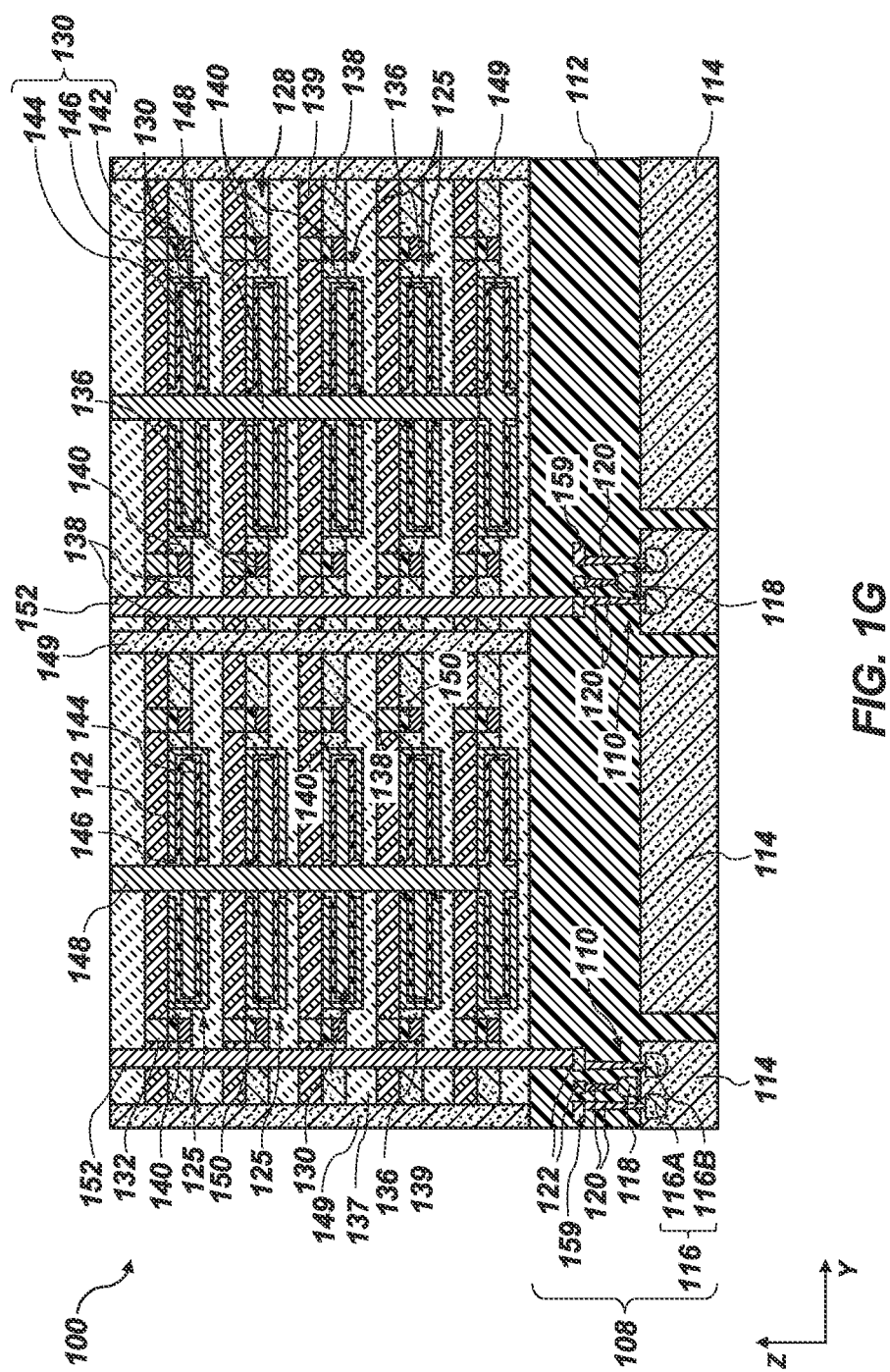
Figure 1H:
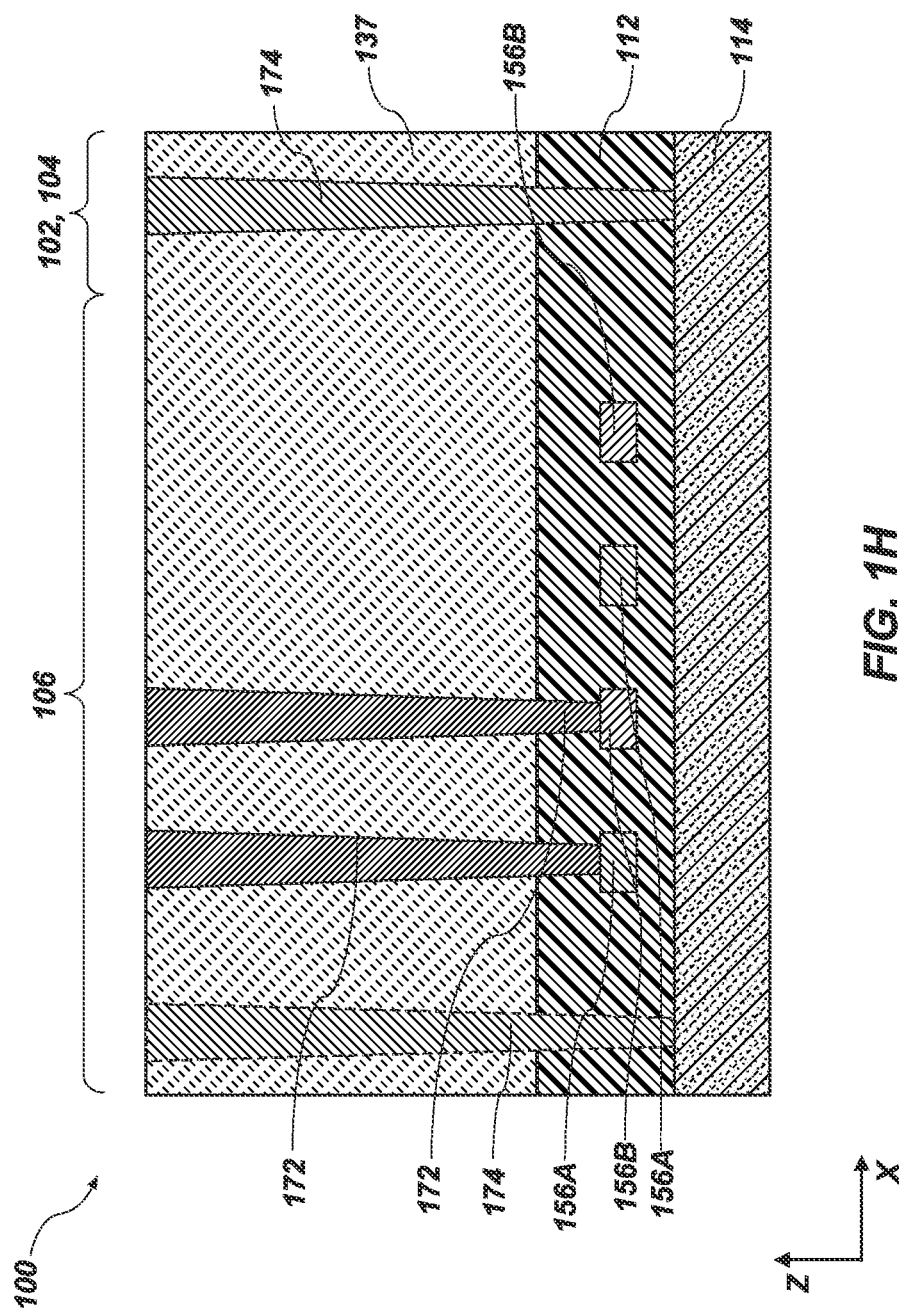

Referring now to FIG. 1E through FIG. 1H, after forming the multiplexer region 108, memory cells may be formed in the array region 101; conductive interconnect structures may be formed in each of the socket regions 102 and the second conductive contact exit regions 106; and first conductive contact structures 135 (FIG. 1E, FIG. 1F) and second conductive contact structures 172 (FIG. 1E, FIG. 1H) may be formed in the respective first conductive contact exit regions 104 and second conductive contact exit regions 106. FIG. 1E is a simplified partial top-down view of the first microelectronic device structure; FIG. 1F is a simplified partial cross-sectional view of the first microelectronic device structure 100 taken through section line F-F of FIG. 1E; FIG. 1G is a simplified partial cross-sectional view of the first microelectronic device structure 100 taken through section line G-G of FIG. 1G; and FIG. 1H is a simplified partial cross-sectional view of the first microelectronic device structure 100 taken through section line H-H of FIG. 1E.

With reference to FIG. 1E and FIG. 1G, vertical (e.g., in the Z-direction) stacks of memory cells 125 may be formed over the multiplexer region 108. Each vertical stack of memory cells 125 comprises a vertical stack of access devices 128 and a vertical stack of storage devices 130, the storage devices 130 of the vertical stack of storage devices 130 coupled to the access devices 128 of the vertical stack of access devices 128. Although FIG. 1E illustrates forty (40) vertical stacks of memory cells 125, the disclosure is not so limited, and the array region 101 may include greater than forty vertical stacks of memory cells 125.

With reference to FIG. 1E, the access devices 128 may each individually be operably coupled to a conductive structure 132 (FIG. 1F, FIG. 1G) of a stack structure 134 (FIG. 1F) comprising levels of the conductive structures 132 (also referred to herein as "first conductive lines," "access lines," or "word lines") vertically (e.g., in the Z-direction) spaced from one another by one or more insulative structures 137 (levels of insulative structures 137) (not illustrated in FIG. 1E for clarity and ease of understanding the description). In other words, levels of the conductive structures 132 vertically alternate with levels of the insulative structures 137. The conductive structures 132 may be configured to provide sufficient current through a channel region (e.g., channel material 136 (FIG. 1G)) of each of the access devices 128 to electrically couple a horizontally neighboring and associated storage device 130 to, for example, a conductive pillar structure (e.g., conductive pillar structure 152) vertically (e.g., in the Z-direction) extending through the stack structure 134. The stack structure 134 may intersect the vertical stacks of memory cells 125, such as the vertical stacks of the access devices 128 of the vertical stacks of memory cells 125. In other words, and with reference to FIG. 1E, each stack structure 134 individually extends through several vertical stacks of access devices 128 of the stacks of memory cells 125. In some embodiments, each stack structure 134 extends through horizontally neighboring (e.g., in the X-direction) vertical stacks of memory cells 125. In some embodiments, the stack structures 134 are spaced from each other in a horizontal direction (e.g., in the Y-direction).

With reference to FIG. 1G, each of the storage devices 130 may include a first electrode 142 (also referred to herein as an "outer electrode," "a first electrode plate," or a "first node structure"), a second electrode 144 (also referred to herein as an "inner electrode," "a second electrode plate," or a "second node structure"), and a dielectric material 146 between the first electrode 142 and the second electrode 144. In some such embodiments, the storage devices 130 individually comprise capacitors. However, the disclosure is not so limited and in other embodiments, the storage devices 130 may each individually comprise other structures, such as, for example, phase change memory (PCM), resistance random-access memory (RRAM), conductive-bridging random-access memory (conductive bridging RAM), or another structure for storing a logic state.

The first electrode 142 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 142 comprises titanium nitride.

The second electrode 144 may be formed of and include conductive material. In some embodiments, the second electrode 144 comprises one or more of the materials described above with reference to the first electrode 142. In some embodiments, the second electrode 144 comprises substantially the same material composition as the first electrode 142.

The dielectric material 146 may be formed of and include one or more of silicon dioxide (SiO$_2$), silicon nitride (Si$_3$N$_4$), polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfD$_2$), zirconium oxide (ZrO$_2$), a ferroelectric material (e.g., ferroelectric hafnium oxide, ferroelectric zirconium oxide, lead zirconate titanate (PZT)), and a high-k dielectric material.

The second electrode 144 may be in electrical communication with a conductive structure 148 (not illustrated in FIG. 1E for clarity and ease of understanding the description). The conductive structure 148 may be formed of and include conductive material, such as one or more of the materials described above with reference to the second electrode 144. In some embodiments, the conductive structure 148 comprises substantially the same material composition as the second electrode 144. In other embodiments, the conductive structure 148 comprises a different material composition than the second electrode 144.

With continued reference to FIG. 1G, the access devices 128 may each individually comprise the channel material 136 between a source material 138 and a drain material 140. The channel material 136 may be laterally (e.g., in the X-direction) between the source material 138 and the drain material 140. The source material 138 and the drain material 140 may each individually comprise a semiconductive material (e.g., polysilicon) doped with at least one N-type dopant, such as one or more of arsenic ions, phosphorous ions, and antimony ions. In other embodiments, the source material 138 and the drain material 140 each individually comprise a semiconductive material doped with at least one P-type dopant, such as boron ions.

In some embodiments, the channel material 136 comprises a semiconductive material (e.g., polysilicon) doped with at least one N-type dopant or at least one P-type dopant. In some embodiments, the channel material 136 is doped with one of at least one N-type dopant and at least one P-type dopant and each of the source material 138 and the drain material 140 are each individually doped with the other of the at least one N-type dopant and the at least one P-type dopant.

In some embodiments, insulative structures 137 and additional insulative structures 139 vertically (e.g., in the Z-direction) intervene between vertically neighboring access devices 128 and vertically neighboring storage devices 130. The additional insulative structures 139 may laterally (e.g., in the Y-direction) neighbor each of the conductive structures 132.

The insulative structures 137 may be formed of and include insulative material. In some embodiments, the insulative structures 137 may each individually be formed of and include, for example, an insulative material, such as one or more of an oxide material (e.g., silicon dioxide (SiO$_2$), phosphosilicate glass, borosilicate glass, borophosphosilicate glass, fluorosilicate glass, titanium dioxide (TiO$_2$), hafnium oxide (HfD$_2$), zirconium dioxide (ZrO$_2$), hafnium dioxide (HfD$_2$), tantalum oxide (TaO$_2$), magnesium oxide (MgO), aluminum oxide (Al$_2$O$_3$), or a combination thereof), and amorphous carbon. In some embodiments, the insulative structures 137 comprise silicon dioxide. Each of the insulative structures 137 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 137 exhibits a substantially homogeneous distribution of insulative material. In additional embodiments, at least one of the insulative structures 137 exhibits a substantially heterogeneous distribution of at least one insulative material. The insulative structures 137 may, for example, be formed of and include a stack (e.g., laminate) of at least two different insulative materials. The insulative structures 137 may each be substantially planar, and may each individually exhibit a desired thickness.

The additional insulative structures 139 may be formed of and include an insulative material that is different than, and that has an etch selectivity with respect to, the insulative structures 137. In some embodiments, the additional insulative structures 139 are formed of and include a nitride material (e.g., silicon nitride (Si$_3$N$_4$)) or an oxynitride material (e.g., silicon oxynitride). In some embodiments, the additional insulative structures 139 comprise silicon nitride.

In some embodiments, the source material 138 of each access device 128 is electrically connected to a conductive plate 149 (not illustrated in FIG. 1E for clarity and ease of understanding the description) and the drain material 140 of each access device 128 is electrically connected to a laterally (e.g., in the Y-direction) neighboring storage device 130, such as to the first electrode 142 of the laterally neighboring storage device 130.

The conductive plate 149 may be configured to enable excess carriers (e.g., holes) to drain from a body region of the access devices 128 during operation of the memory cells 125. The conductive plate 149 may comprise conductive material, such as, for example, a metal, a conductive metal silicide, a conductive metal nitride, or conductively doped semiconductive material (e.g., silicon, germanium).

The conductive structures 132 may extend laterally (e.g., in the X-direction) through the vertical stacks of memory cells 125 as lines and may be each be configured to be operably coupled to a vertically (e.g., in the Z-direction) neighboring channel material 136 of the vertically neighboring (e.g., in the Z-direction) access devices 128. In other words, a conductive structure 132 may be configured to operably couple to a vertically neighboring access device 128.

The channel material 136 may be separated from the conductive structures 132 by a dielectric material 150, which may also be referred to herein as a "gate dielectric material." The dielectric material 150 may be formed of and include insulative material. By way of non-limiting example, the dielectric material 150 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride (Si$_3$N$_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)). In other embodiments, the channel material 136 directly contacts a vertically neighboring conductive structure 132.

With continued reference to FIG. 1E and FIG. 1G, the first microelectronic device structure 100 may include conductive pillar structures 152 vertically (e.g., in the Z-direction) extending through the first microelectronic device structure 100. The conductive pillar structures 152 may also be referred to herein as "digit lines," "second conductive lines," "digit line pillar structures," "local digit lines," or "vertical digit lines." The conductive pillar structures 152 may be electrically coupled to the access devices 128 to facilitate operation of the memory cells 125.

With reference to FIG. 1E, in some embodiments, the conductive pillar structures 152 in horizontally neighboring (e.g., in the Y-direction) stack structures 134 may be horizontally offset (e.g., in the X-direction) from one another. Accordingly, with reference to FIG. 1G, a conductive pillar structure 152 is not shown in electrical communication with the access devices 128 on one side (e.g., the right side) of the conductive structures 148. However, it will be understood that the conductive pillar structure 152 is in electrical communication with the conductive structures 148 through the access devices 128 in a different plane than that illustrated in the cross-sectional view of FIG. 1G.

The conductive pillar structures 152 may each individually be in electrical communication with a transistor 110 (e.g., multiplexer) of the multiplexer region 108. By way of non-limiting example, in some embodiments the conductive pillar structures 152 are in electrical communication with a first routing structure 122 that is, in turn, in electrical communication with the drain region 116B.

The conductive pillar structures 152 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 152 comprise tungsten.

With continued reference to FIG. 1E through FIG. 1G, in some embodiments, each global digit line 156 (FIG. 1E, FIG. 1F) may be in electrical communication with a global digit line routing structures 159 (FIG. 1E through FIG. 1G) that is, in turn, is in electrical communication with one of the transistor structures 110 (FIG. 1G) to selectively couple the global digit lines 156 with the conductive pillar structures 152 through the transistor structure 110. In some embodiments, the transistor structures 110 may facilitate the selective provision of power (e.g., a current) to the conductive pillar structure 152 to which it is coupled (by means of the global digit line routing structure 159). Accordingly, the global digit lines 156 are configured to be selectively electrically connected to the conductive pillar structure 152 by means of the transistor structures 110. The transistors 110 may be driven by a multiplexer driver and/or a multiplexer control logic operably coupled to the gate structures 118.

In some embodiments, the first group 156A of global digit lines 156 are electrically coupled to horizontally aligned (e.g., in the X-direction) conductive pillar structures 152 and the second group 156B of global digit lines 156 are electrically coupled to other horizontally aligned (e.g., in the X-direction) conductive pillar structures 152. In some such embodiments, the conductive pillar structures 152 in electrical communication with the first group 156A of global digit lines 156 are horizontally offset (e.g., in the X-direction) from the conductive pillar structures 152 in electrical communication with the second group 156B of global digit lines 156. With reference to FIG. 1E, in some embodiments, each global digit line 156 may be configured to be selectively coupled to more than one of the conductive pillar structures 152 by means of transistor structures 110 coupled to each of the conductive pillar structures 152. In some embodiments, each global digit line 156 is configured to be in electrical communication with four (4) of the conductive pillar structures 152. In other embodiments, each of the global digit lines is configured to be in electrical communication with eight (8) of the conductive pillar structures 152 or sixteen (16) of the conductive pillar structures 152.

With reference to FIG. 1E and FIG. 1F, the conductive structures 132 of the stack structure 134 may laterally (e.g., in the X-direction) terminate at staircase structures 131 located at horizontally (e.g., in the X-direction) terminal portions of the stack structure 134. While the staircase structures 131 are illustrated in FIG. 1E, it will be understood that the staircase structures 131 are located beneath a vertically upper (e.g., in the Z-direction) surface of the first microelectronic device structure 100. With reference to FIG. 1F, vertically (e.g., in the Z-direction) higher conductive structures 132 may have a smaller lateral dimension (e.g., in the X-direction) than vertically lower conductive structures 132, such that horizontal edges of the conductive structures 132 at least partially define steps 133 of the staircase structures 131.

The staircase structures 131 may be located within the first conductive contact exit regions 104 of the peripheral regions 103. With reference to FIG. 1E, in some embodiments, the staircase structure 131 of a first stack structure 134 is located at a diagonally opposing corner of the staircase structure 131 of a horizontally (e.g., in the Y-direction) neighboring stack structure 134. In other words, in some such embodiments, every other stack structure 134 includes a staircase structure 131 at a first horizontal end (e.g., in the X-direction) of the first microelectronic device structure 100 while the other of the stack structures 134 individually includes a staircase structure 131 at a second horizontal end (e.g., in the X-direction) of the first microelectronic device structure 100 opposite the first horizontal end. Stated another way, the staircase structures 131 of horizontally neighboring (e.g., in the Y-direction) stack structures 134 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

With reference to FIG. 1E, in some embodiments, the socket regions 102 are horizontally between (e.g., in the Y-direction) a pair of first conductive contact exit regions 104. In some embodiments, each socket region 102 is located on a horizontal side (e.g., in the Y-direction) of a staircase structure 131.

Although FIG. 1E illustrates one staircase structure 131 for every stack structure 134 (e.g., a staircase structure 131 at one horizontal (e.g., in the X-direction) end of each stack structure 134), the disclosure is not so limited. In other embodiments, the stack structures 134 may include one staircase structure 131 at each horizontal end (e.g., in the X-direction) of the stack structure 134. In some such embodiments, the stack structure 134 includes two (2) staircase structures 131.

Although FIG. 1E and FIG. 1F illustrate that the staircase structures 131 individually comprise a particular number (e.g., five (5)) steps 133, the disclosure is not so limited. In other embodiments, the staircase structures 131 each individually include a desired quantity of the steps 133, such as within a range from thirty-two (32) of the steps 133 to two hundred fifty-six (256) of the steps 133. In some embodiments, the staircase structures 131 each individually include sixty-four (64) of the steps 133. In other embodiments, the staircase structures 131 each individually include a different number of the steps 133, such as less than sixty-four (64) of the steps 133 (e.g., less than or equal to sixty (60) of the steps 133, less than or equal to fifty (50) of the steps 133, less than about forty (40) of the steps 133, less than or equal to thirty (30) of the steps 133, less than or equal to twenty (20) of the steps 133, less than or equal to ten (10) of the steps 133); or greater than sixty-four (64) of the steps 133 (e.g., greater than or equal to seventy (70) of the steps 133, greater than or equal to one hundred (100) of the steps 133, greater than or equal to about one hundred twenty-eight (128) of the steps 133, greater than two hundred fifty-six (256) of the steps 133).

With continued reference to FIG. 1E and FIG. 1F, first conductive contact structures 135 may be in electrical communication with individual conductive structures 132 at the steps 133. In some embodiments, each step 133 may be in electrical communication with a first conductive contact structure 135 at the horizontal (e.g., in the X-direction) end of the staircase structure 131. In other embodiments, every other step 133 of the staircase structures 131 may include a first conductive contact structure 135 in contact therewith. In other words, every other step 133 of the staircase structures 131 may individually be in contact with a first conductive contact structure 135. In some such embodiments, each stack structure 134 may include one staircase structure 131 at each horizontal (e.g., in the X-direction) end thereof and each step 133 of a first staircase structure 131 at a first lateral end of the stack structure 134 not in electrical communication with a first conductive contact structure 135 may individually be in electrical communication with a first conductive contact structure 135 at a second staircase structure 131 at a second, opposite horizontal end of the stack structure 134.

The first conductive contact structures 135 may individually be formed of and include conductive material, such as one or more of the materials described above with reference to the conductive pillar structures 152. In some embodiments, the first conductive contact structures 135 comprise substantially the same material composition as the conductive pillar structures 152. In other embodiments, the first conductive contact structures 135 comprise a different material composition than the conductive pillar structures 152. In some embodiments, the first conductive contact structures 135 comprises tungsten.

With reference to FIG. 1H, one or more second conductive contact structures 172 vertically extend (e.g., in the Z-direction) through the insulative structures 137 to electrically connect to the global digit lines 156. In FIG. 1H, the second conductive contact structures 172 are illustrated as electrically connected to one pair of global digit lines 156, the pair comprising one global digit line 156 of each of the first group 156A of global digit lines 156 and the second group 156B of the global digit lines 156. With collective reference to FIG. 1E and FIG. 1G, in some embodiments, the global digit lines 156 of every other pair of global digit lines 156 (each pair comprising one global digit line 156 of the first group 156A of global digit lines 156 and one global digit line 156 of the second group 156B of the global digit lines 156) are electrically connected to the second conductive contact structures 172 in a second conductive contact exit region 106. The alternating pairs of the global digit lines 156 not in contact with the second conductive contact structures 172 in a second conductive contact exit region 106 are in electrical contact with the second conductive contact structures 172 at a horizontally opposing (e.g., in the Y-direction) second conductive contact exit region 106. In some embodiments, horizontally neighboring (e.g., in the X-direction) memory cells 125 are electrically coupled to global digit lines 156 that horizontally terminate (e.g., in the Y-direction) and are electrically connected second conductive contact structures 172 at opposing horizontal ends (e.g., in the Y-direction) of the first microelectronic device structure 100.

With continued reference to FIG. 1H, the first conductive contact exit region 104 may further include third conductive interconnect structures 174 vertically extending (e.g., in the Z-direction) through the insulative structures 137 and the first insulative material 112 to contact the first base structure 114. In some embodiments, the socket region 102 includes one or more of the third conductive interconnect structures 174. In some such embodiments, the third conductive interconnect structures 174 are located in a plane different than the plane illustrated in FIG. 1H. Since both of the first conductive contact exit region 104 and the socket region 102 may include the third conductive interconnect structures 174, FIG. 1H illustrates both the first conductive contact exit region 104 and the socket region 102. It will be understood that the socket region 102 is in a different plane than the first conductive contact exit region 104, as illustrated in FIG. 1E.

In some embodiments, the second conductive contact exit region 106 includes one or more third conductive interconnect structures 174 vertically extending through the insulative structures 137 and the first insulative material 112. In some such embodiments, the third conductive interconnect structures 174 may be in a different plane than second conductive contact structures 172 and are illustrated in broken lines in FIG. 1H.

The second conductive contact structures 172 and the third conductive interconnect structures 174 may individually be formed of and include conductive material, such as, for example, one or more of the materials described above with reference to the first conductive interconnect structures 120. In some embodiments, the second conductive contact structures 172 and the third conductive interconnect structures 174 individually comprise tungsten.

Figure 1I:
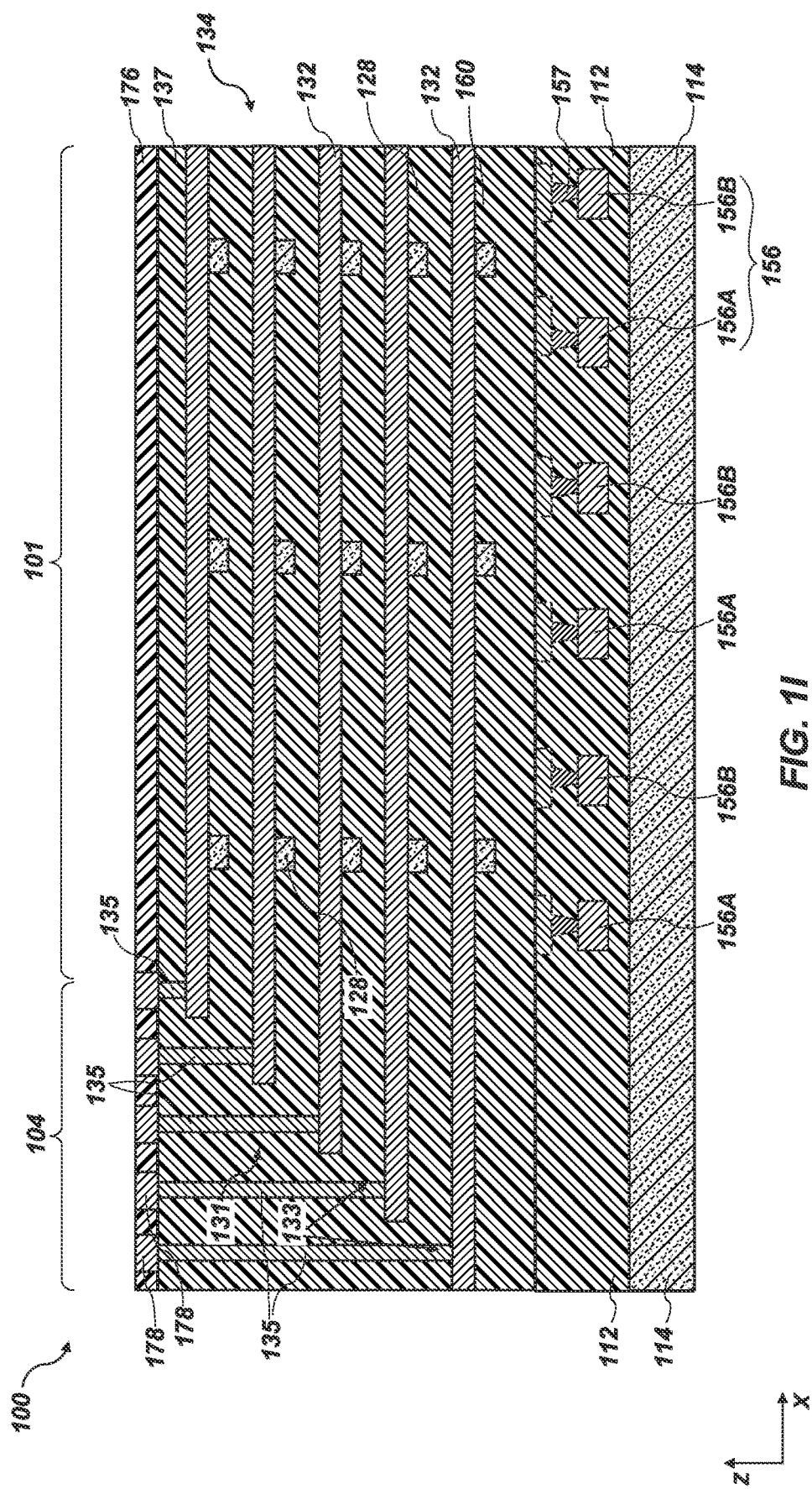
Figure 1J:
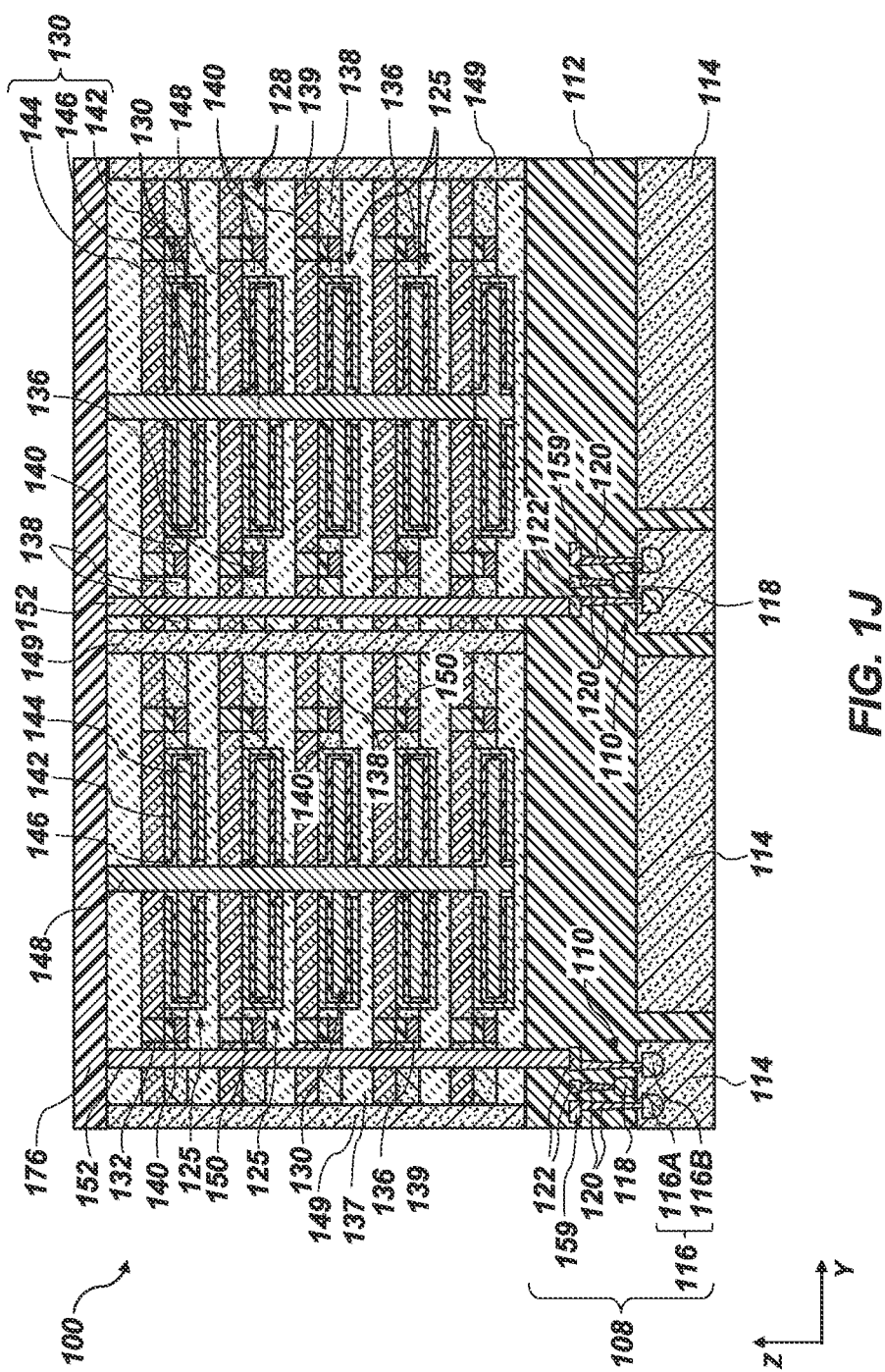
Figure 1K:
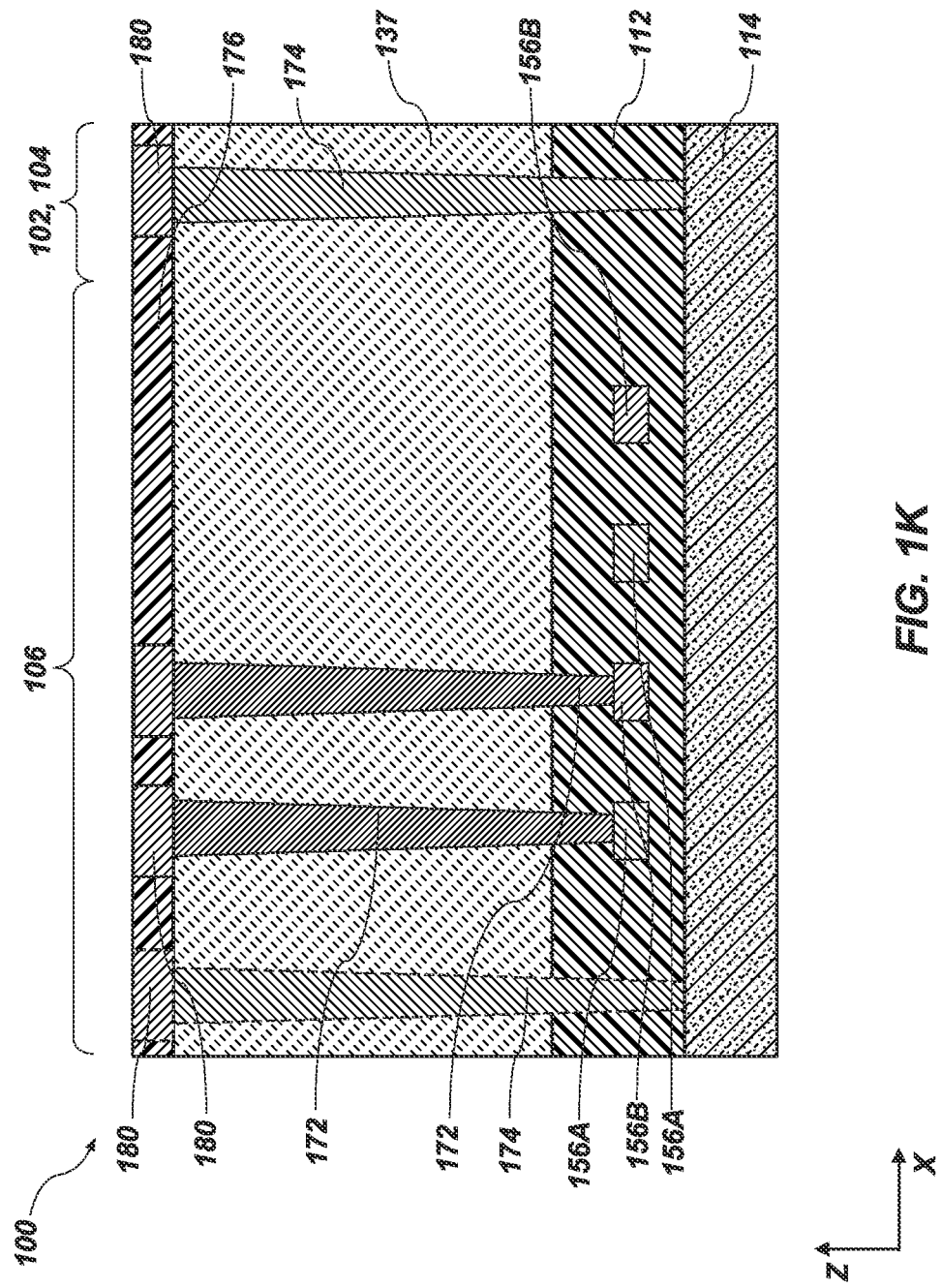

FIG. 1I through FIG. 1K illustrate the first microelectronic device structure 100 after forming a second insulative material 176 over the first microelectronic device structure 100; forming first pad structures 178 vertically overlying and in electrical communication with of the first conductive contact structures 135; and forming second pad structures 180 vertically overlying and in electrical communication with the second conductive contact structures 172 and the third conductive interconnect structures 174. FIG. 1I is a simplified partial cross-sectional view of the first microelectronic device structure 100 illustrating the same cross-section as FIG. 1F; FIG. 1J is a simplified partial cross-sectional view of the first microelectronic device structure 100 illustrating the same cross-section as FIG. 1G; and FIG. 1K is a simplified partial cross-sectional view of the first microelectronic device structure 100 illustrating the same cross-section as FIG. 1H.

With reference to FIG. 1I, each of the first conductive contact structures 135 is individually in electrical communication with one of the first pad structures 178. Referring to FIG. 1K, each of the second conductive contact structures 172 and the third conductive interconnect structures 174 are individually in electrical communication with one of the second pad structures 180.

The first pad structures 178 and the second pad structures 180 are individually formed of and include conductive material. In some embodiments, the first pad structures 178 and the second pad structures 180 are formed of and include tungsten. In other embodiments, the first pad structures 178 and the second pad structures 180 are formed of and include copper.

The second insulative material 176 may be formed of and include one or more of the materials described above with reference to the first insulative material 112. In some embodiments, the second insulative material 176 comprises substantially the same material composition as the first insulative material 112. In some embodiments, the second insulative material 176 comprises silicon dioxide.

Figure 2A:
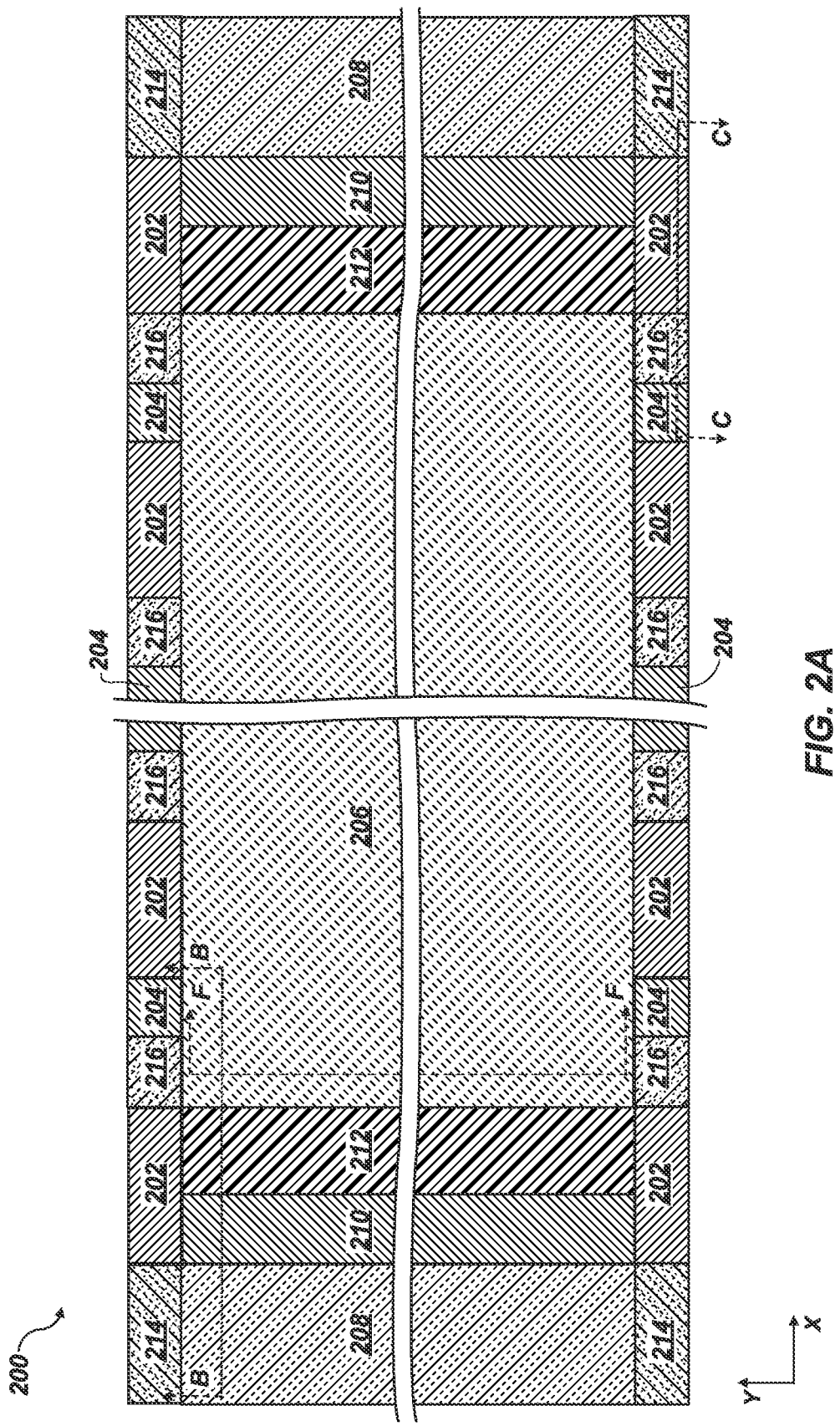
FIG. 2A through FIG. 2I include a simplified partial top-down view (FIG. 2A) and simplified partial cross-sectional views (FIG. 2B through FIG. 2I) illustrating a method of forming a microelectronic device, in accordance with embodiments of the disclosure.
Figure 2B:
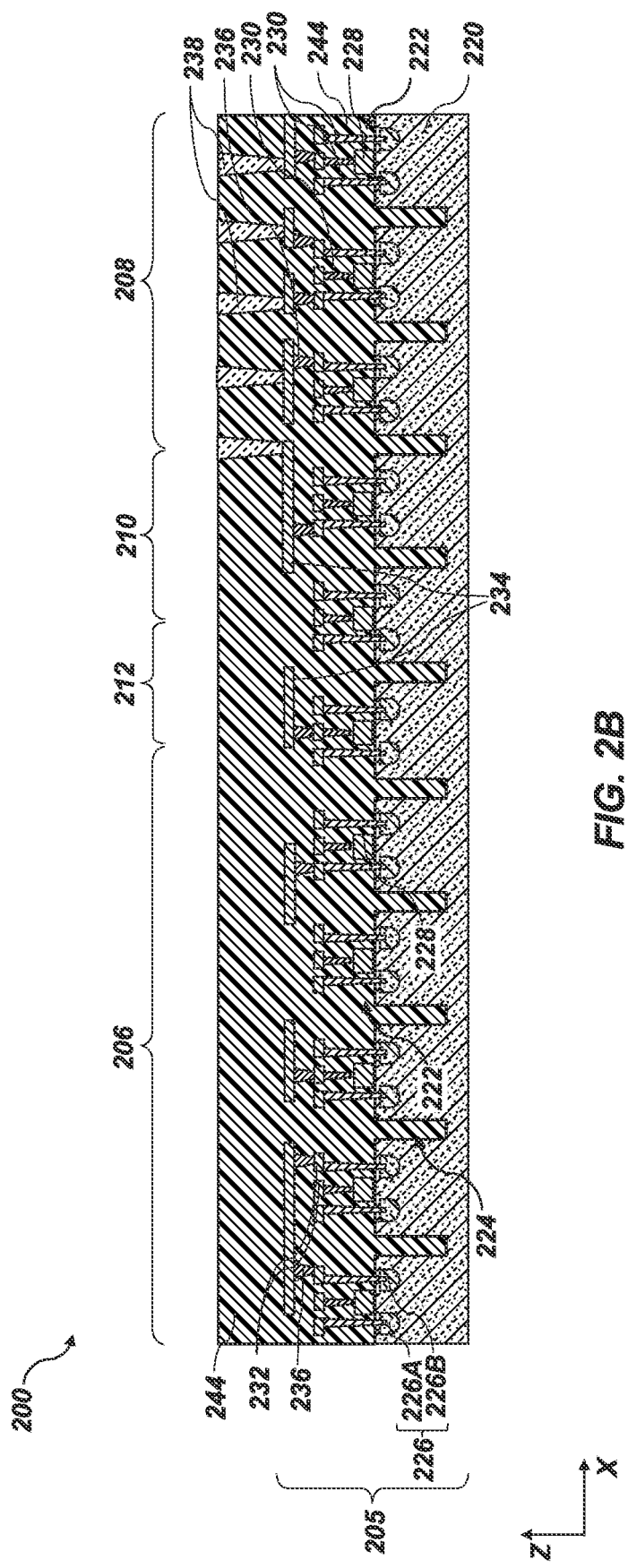
Figure 2C:
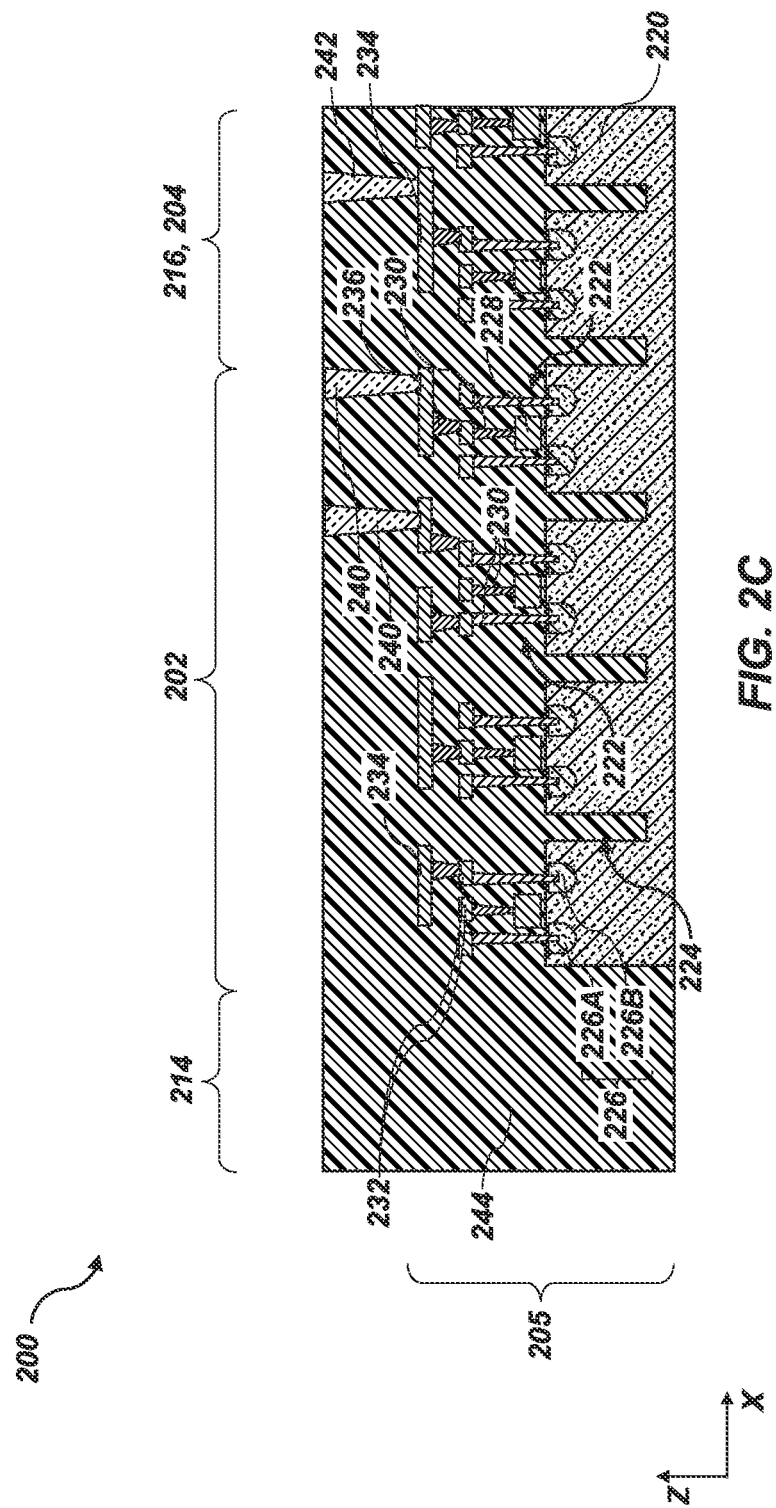

FIG. 2A is a simplified partial top-down view of a second microelectronic device structure 200; FIG. 2B is a simplified partial cross-sectional view of the second microelectronic device structure 200 taken through section line B-B of FIG. 2A; and FIG. 2C is a simplified partial cross-sectional view of the second microelectronic device structure 200 taken through section line C-C of FIG. 2A. With reference to FIG. 2A, in some embodiments, the second microelectronic device structure 200 exhibits substantially the same horizontal cross-sectional area as the first microelectronic device structure 100 (FIG. 1E). The second microelectronic device structure 200 may also be referred to herein as a second die or a second wafer.

The second microelectronic device structure 200 may include one or more control logic devices (e.g., CMOS devices) and circuitry. In some embodiments, the second microelectronic device structure 200 includes so-called high performance control logic devices. For example, the circuitry of the second microelectronic device structure 200 may be configured to operate at applied voltages less than or equal to (e.g., less than) about 1.4 volts (V), such as within a range of from about 0.7 V to about 1.4 V (e.g., from about 0.7 V to about 1.3 V, from about 0.7 V to about 1.2 V, from about 0.9 V to about 1.2 V, from about 0.95 V to about 1.15 V, or about 1.1 V).

With reference to FIG. 2A, the second microelectronic device structure 200 may include one or more sense amplifier (SA) regions 202 including one or more sense amplifier devices (e.g., equalization (EQ) amplifiers, isolation (ISO) amplifiers, NMOS sense amplifiers (NSAs), PMOS sense amplifiers (PSAs)), one or more column decoder regions 204, one or more sense amplifier driver regions 206, one or more sub word line driver regions 208 including one or more sub word line driver devices, one or more main word line driver regions 210 including one or more main word line driver devices, one or more row decoder regions 212 including one or more row decoder devices, one or more input/output device regions 214, and one or more additional CMOS device regions 216.

The sense amplifier regions 202 may, for example, include or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers).

As described in additional detail below, the sense amplifier regions 202 are configured to be vertically above (e.g., directly vertically above) and within horizontal areas of the second conductive contact exit regions 106 of the first microelectronic device structure 100, such that the sense amplifier devices of the sense amplifier region 202 are vertically above (e.g., directly vertically above) and within horizontal areas of the second conductive contact structures 172 (FIG. 1K) in electrical communication with the global digit lines 156. In some embodiments, the sense amplifier devices of the sense amplifier region 202 are electrically coupled to the second conductive contact structures 172 without horizontally (e.g., in the X-direction, in the Y-direction) rerouting (e.g., by way of intervening, conductive routing structures) the second conductive contact structures 172.

In some embodiments, the one or more additional CMOS device regions 216 comprises one or more column select devices. In some such embodiments, the one or more additional CMOS device regions 216 are individually in electrical communication with one or more components of a horizontally neighboring (e.g., in the X-direction) sense amplifier region 202.

The one or more additional CMOS device regions 216 may each individually directly horizontally neighbor (e.g., in the X-direction) one of the sense amplifier regions 202. In some embodiments, each additional CMOS device region 216 directly horizontally neighbors (e.g., in the X-direction) one of the column decoder regions 204. Each of the one or more additional CMOS device regions 216 may horizontally intervene between a sense amplifier region 202 and a column decoder region 204.

The one or more column decoder regions 204 may horizontally neighbor (e.g., in the X-direction) one of the additional CMOS device regions 216 and one of the sense amplifier regions 202. In some embodiments, the column decoder regions 204 horizontally intervene (e.g., in the X-direction) between a sense amplifier region 202 and one additional CMOS device regions 216. In some embodiments, such as where the one or more additional CMOS device regions 216 comprise a column select device, the column decoder regions 204 are in electrical communication with a horizontally neighboring additional CMOS device region 216. The column decoder regions 204 may include one or more column decoders configured to receive an address signal from, for example, an address decoder and send a signal to a horizontally neighboring sense amplifier region 202.

With continued reference to FIG. 2A, the sense amplifier driver regions 206 may include NMOS sense amplifier drivers (RNL) and PMOS sense amplifier drivers (ACT). The NMOS sense amplifier drivers may generate, for example, activation signals for driving the NMOS sense amplifiers of the sense amplifier regions 202 and the PMOS sense amplifier drivers may generate, for example, activation signals for driving the PMOS sense amplifiers of the sense amplifier regions 202. By way of non-limiting example, NMOS sense amplifier drivers generate a low potential (e.g., ground) activation signal for activating an NMOS sense amplifier of the sense amplifier region 202 and the PMOS sense amplifier drivers generate a high potential (e.g., $V_{cc}$) activation signal for activating a PMOS sense amplifier of the sense amplifier region 202. However, the disclosure is not so limited and the NMOS sense amplifier drivers and the PMOS sense amplifier drivers may generate sense amplifier activation signals other than those described.

In some embodiments, the sense amplifier drive region 206 horizontally neighbors (e.g., in the Y-direction) the sense amplifier regions 202. In some such embodiments, devices and circuitry of the sense amplifier driver region 206 may be electrically coupled to devices and circuitry of the sense amplifier regions 202 by way of conductive structures.

The one or more sub word line driver regions 208 may be configured to be electrically coupled to the memory cells 125 (FIG. 1J) of the first microelectronic device structure 100 (FIG. 1J). In some embodiments, as described in further detail below, the sub word line driver regions 208 may be electrically coupled to the first conductive contact structures 135 (FIG. 1I) in electrical communication with the first conductive contact structures 135 (FIG. 1I). Each sub word line driver region 208 is, in turn, electrically coupled to a main word line driver region 210 by electrical connections. The main word line driver region 210 is electrically coupled to row decoders of the row decoder region 212 by additional electrical connections. The row decoder region 212 may be configured to receive an address signal from, for example, an address decoder, as described above with reference to the column decoders of the column decoder region 204.

The one or more sub word line driver regions 208 may be horizontally interposed between (e.g., in the Y-direction) the one or more input/output device regions 214. The main word line driver region 210 may be horizontally between (e.g., in the X-direction) one of the sub word line driver regions 208 and one of the row decoder regions 212. The row decoder regions 212 may horizontally neighbor (e.g., in the X-direction) the sense amplifier driver region 206. In some embodiments, each row decoder region 212 is individually horizontally between (e.g., in the X-direction) a main word line driver region 210 and the sense amplifier driver region 206.

The one or more input/output device regions 214 may include one or more local input/output devices and/or one or more equalization (EQ) amplifiers. As described in further detail below, in some embodiments, the one or more input/output device regions 214 are electrically connected to BEOL structures to be formed over the second microelectronic device structure 200.

As described in further detail below, each of the sense amplifier regions 202, the column decoder regions 204, sense amplifier driver regions 206, sub word line driver regions 208, main word line driver regions 210, row decoder regions 212, and additional CMOS device regions 216 individually include circuitry including transistors.

FIG. 2B is a simplified partial cross-sectional view of the second microelectronic device structure 200 taken through section line B-B of FIG. 2A. FIG. 2C is a simplified cross-sectional view of the second microelectronic device structure 200 taken through section line C-C of FIG. 2A. The cross-section of FIG. 2B illustrates portions of each of the sense amplifier driver region 206, the row decoder region 212, the main word line driver region 210, and the sub word line driver region 208. The cross-section of FIG. 2C illustrates portions of each of the sense amplifier region 202, the additional CMOS device regions 216, the column decoder region 204, and the input/output device regions 214.

With collective reference to FIG. 2B and FIG. 2C, the second microelectronic device structure 200 includes a CMOS region 205 including one or more CMOS devices. The CMOS region 205 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, control devices configured to control column operations and/or row operations for arrays (e.g., the array region 101) of the first microelectronic device structure 100, such as decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. The devices and circuitry included in the CMOS region 205 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

In some embodiments, each of the sense amplifier regions 202, the sense amplifier driver region 206, the row decoder regions 212, the main word line driver regions 210, the sub word line driver regions 208, and the additional CMOS device region 216 include transistor structures 222 separated from each other by isolation trenches 224 within a second base structure 220 (e.g., a second semiconductive wafer). The second base structure 220 may include a base material or construction upon which additional materials and structures of the second microelectronic device structure 200 are formed. The second base structure 220 may comprise a semiconductive structure (e.g., a semiconductive wafer), or a base semiconductive material on a supporting structure. For example, the second base structure 220 may comprise a conventional silicon substrate (e.g., a conventional silicon wafer), or another bulk substrate comprising a semiconductive material. In some embodiments, the second base structure 220 comprises a silicon wafer. In addition, the second base structure 220 may include one or more layers, structures, and/or regions formed therein and/or thereon.

The transistor structures 222 may each include conductively doped regions 226, each of which includes a source region 226A and a drain region 226B. The conductively doped regions 226 may be substantially similar to the conductively doped regions 116 (FIG. 1C). Gate structures 228 horizontally extend between the conductively doped regions 226 and may be formed of and include one or more of the materials described above with reference to the gate structures 118 (FIG. 1C).

The conductively doped regions 226 and the gate structures 228 may be electrically coupled to fourth conductive interconnect structures 230. The fourth conductive interconnect structures 230 may be formed of and include conductive material. In some embodiments, the fourth conductive interconnect structures 230 individually comprise tungsten.

The fourth conductive interconnect structures 230 may individually electrically couple the conductively doped regions 226 and the gate structures 228 to one or more third routing structures 232 and third pad structures 234. The third pad structures 234 may be in electrical communication with the third routing structures 232 by means of fifth conductive interconnect structures 236.

The third routing structures 232 and the third pad structures 234 may be substantially similar to the respective first routing structures 122 (FIG. 1C) and the first pad structures 178 (FIG. 1I) described above. Each of the fourth conductive interconnect structures 230 and the fifth conductive interconnect structures 236 may be formed of and include conductive material, such as one or more of the materials described above with reference to the first conductive interconnect structures 120 (FIG. 1C).

With continued reference to FIG. 2B, at least some of the third routing structures 232 within the sub word line driver region 208 are electrically coupled to sixth conductive interconnect structures 238. The sixth conductive interconnect structures 238 may be formed of and include conductive material, such as one or more of the materials described above with reference to the first conductive interconnect structures 120 (FIG. 1C). In some embodiments, the sixth conductive interconnect structures 238 are formed of and include tungsten. In other embodiments, the sixth conductive interconnect structures 238 are formed of and include copper. In other embodiments, the sixth conductive interconnect structures 238 are individually directly coupled to one of the third routing structures 232, one of the gate structures 228, or one of the conductively doped regions 226.

With reference to FIG. 2C, seventh conductive interconnect structures 240 may be formed in electrical communication with at least some of the transistor structures 222 in the sense amplifier region 202 and eighth conductive interconnect structures 242 may be formed in electrical communication with at least some of the transistors structures 222 in the column decoder region 204 one or more additional CMOS device regions 216. By way of non-limiting example, the seventh conductive interconnect structures 240 and eighth conductive interconnect structures 242 may be formed in electrical communication with the third pad structures 234.

Each of the seventh conductive interconnect structures 240 and eighth conductive interconnect structures 242 may individually be formed of and include conductive material. In some embodiments, each of the seventh conductive interconnect structures 240 and eighth conductive interconnect structures 242 are individually be formed of and include tungsten.

The second microelectronic device structure 200 may include a third insulative material 244 between the transistor structures 222 and electrically isolating different portions of the transistor structures 222, the fourth conductive interconnect structures 230, the third routing structures 232, the third pad structures 234, the fifth conductive interconnect structures 236, the sixth conductive interconnect structures 238, and the seventh conductive interconnect structures 240, and the eighth conductive interconnect structures 242.

The third insulative material 244 may be formed of and include one or more of the materials described above with reference to the first insulative material 112 (FIG. 1B, FIG. 1C). In some embodiments, the third insulative material 244 comprises substantially the same material composition as the first insulative material 112. In some embodiments, the third insulative material 244 comprises silicon dioxide.

Figure 2D:
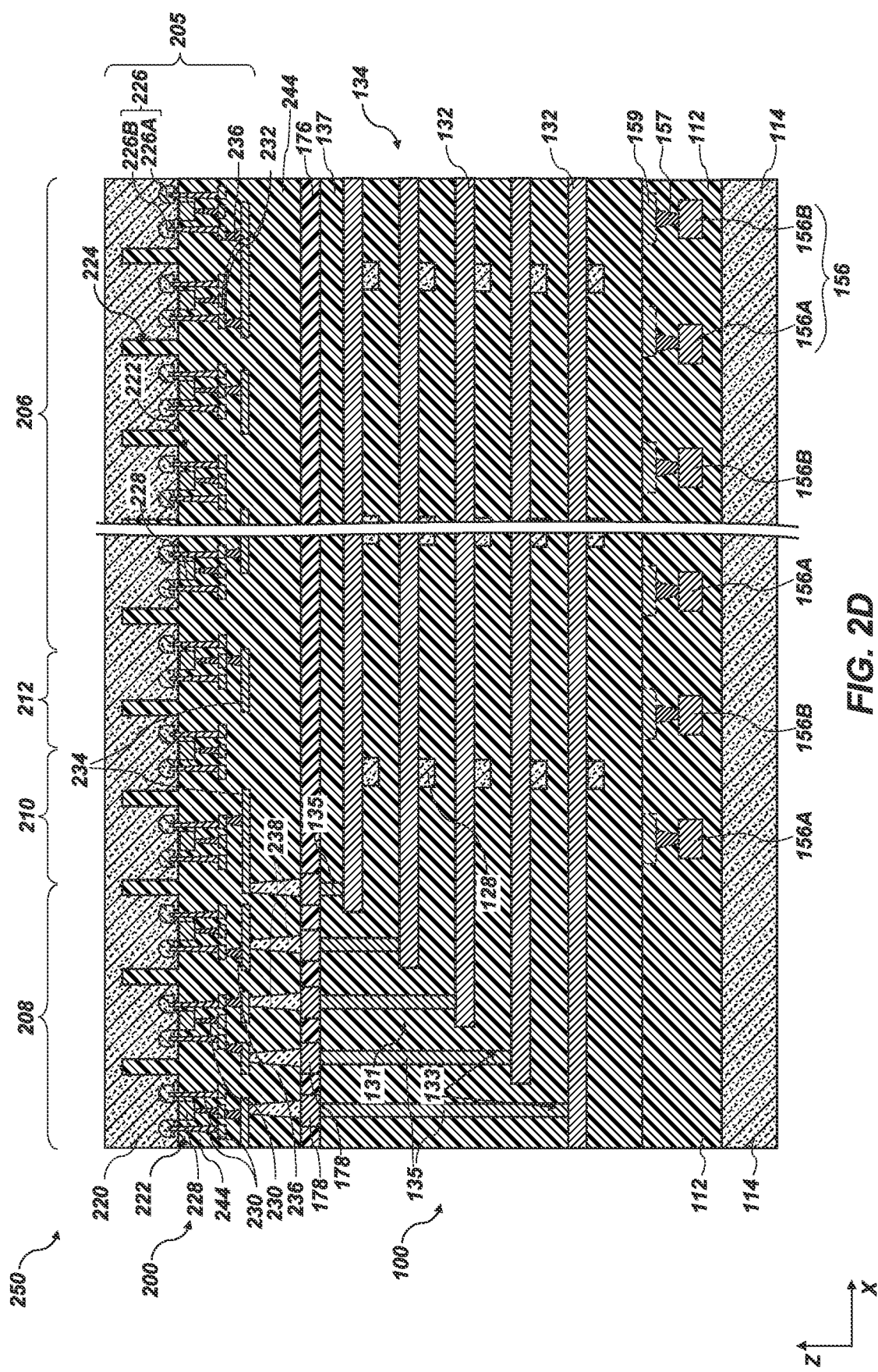
Figure 2E:
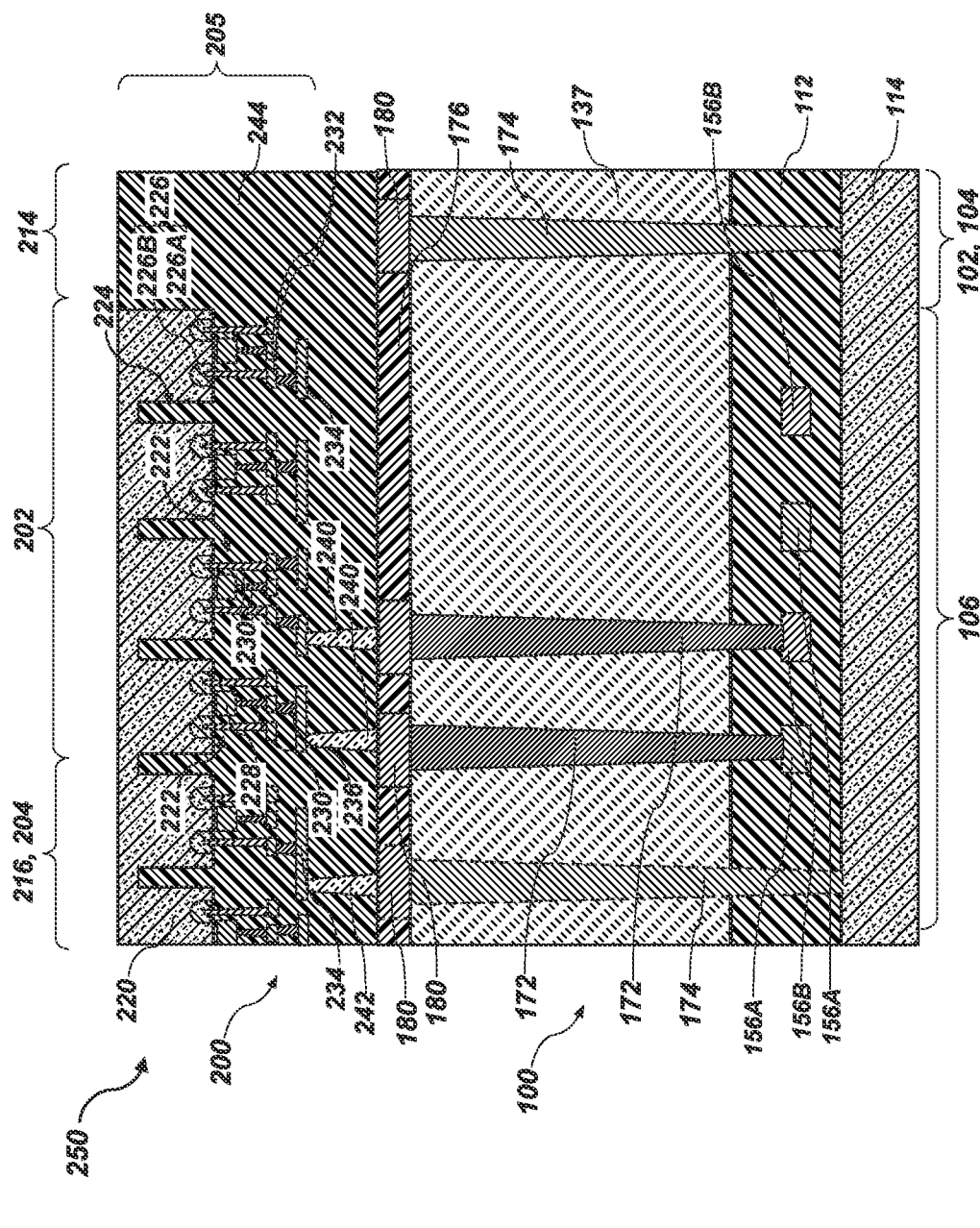
Figure 2F:
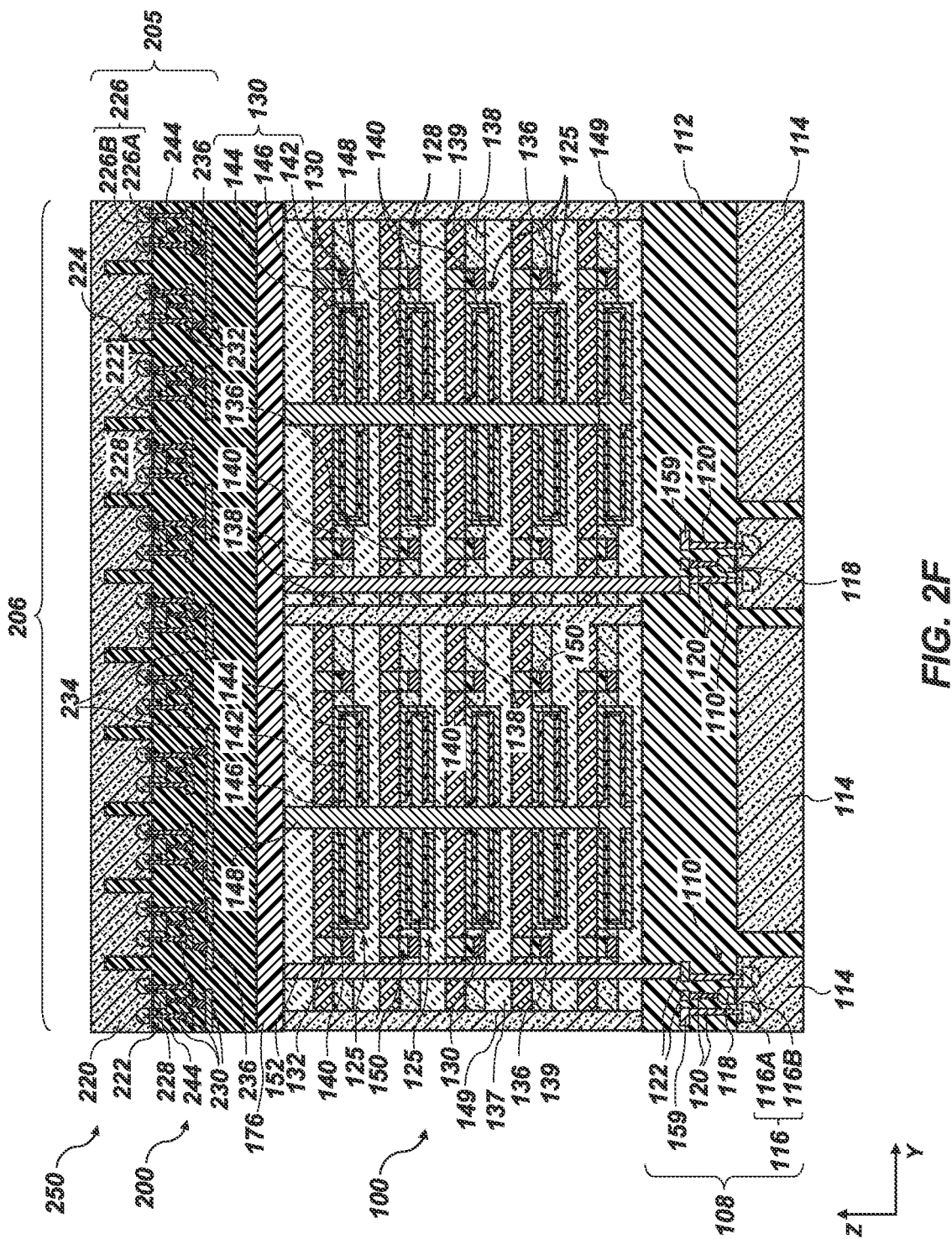

Referring now to FIG. 2D through FIG. 2F, the second microelectronic device structure 200 may be vertically (e.g., in the Z-direction) inverted (e.g., flipped) and attached to the first microelectronic device structure 100 to form a microelectronic device structure assembly 250 comprising the first microelectronic device structure 100 and the second microelectronic device structure 200 attached to the first microelectronic device structure 100. In some embodiments, the second microelectronic device structure 200 is flipped (e.g., vertically flipped), and the third insulative material 244 of the second microelectronic device structure 200 is bonded to the second insulative material 176 of the first microelectronic device structure 100 to attach the first microelectronic device structure 100 to the second microelectronic device structure 200.

FIG. 2D illustrates the same cross-sectional view of the first microelectronic device structure 100 and the second microelectronic device structure 200 illustrated in FIG. 1I and FIG. 2B, respectively; FIG. 2E illustrates the same cross-sectional view of the first microelectronic device structure 100 and the second microelectronic device structure 200 illustrated in FIG. 1K and FIG. 2C, respectively; and FIG. 2F illustrates the same cross-sectional view of the first microelectronic device structure 100 illustrated in FIG. 1J and through section line F-F of FIG. 2A.

For clarity and ease of understanding the description, in FIG. 2D through FIG. 2F the size of the microelectronic device structure assembly 250 is reduced relative to the first microelectronic device structure 100 and the second microelectronic device structure 200 illustrated in FIG. 1A through FIG. 1K and FIG. 2A through FIG. 2C, respectively so that the previously described components and structures of the first microelectronic device structure 100 and second microelectronic device structure 200 are illustrated in the microelectronic device structure assembly 250 of FIG. 2D through FIG. 2F.

The first microelectronic device structure 100 is attached to the second microelectronic device structure 200 by contacting the second insulative material 176 of the first microelectronic device structure 100 with the third insulative material 244 of the second microelectronic device structure 200. In some embodiments, the second microelectronic device structure 200 is horizontally (e.g., in the X-direction, in the Y-direction) aligned with the first microelectronic device structure 100 (e.g., such as within less than about 100 nanometers (nm)). For example, in some embodiments, the sixth conductive interconnect structures 238 (FIG. 2D) of the second microelectronic device structure 200 are horizontally aligned with the first pad structures 178 of the first microelectronic device structure 100; the seventh conductive interconnect structures 240 (FIG. 2E) of the second microelectronic device structure 200 are horizontally aligned with the second pad structures 180 of the first microelectronic device structure 100; and the eighth conductive interconnect structures 242 (FIG. 2E) of the second microelectronic device structure 200 are horizontally aligned with the second pad structures 180 of the first microelectronic device structure 100.

After the second insulative material 176 and the third insulative material 244 are in contact, the first microelectronic device structure 100 and the second microelectronic device structure 200 may be exposed to annealing conditions to form bonds (e.g., oxide to oxide bonds) between the second insulative material 176 of the first microelectronic device structure 100 and the third insulative material 244 of the second microelectronic device structure 200 to form the microelectronic device structure assembly 250. In some embodiments, the first microelectronic device structure 100 and the second microelectronic device structure 200 are exposed to a temperature greater than, for example, 800° C., to form the oxide to oxide bonds and attach the first microelectronic device structure 100 to the second microelectronic device structure 200.

After attaching the first microelectronic device structure 100 to the second microelectronic device structure 200, the second base structure 220 may be thinned, such as by exposing the second base structure 220 to a CMP process. In some embodiments, thinning the second base structure 220 may expose portions of the third insulative material 244. In some embodiments, after thinning the second base structure 220, a vertical (e.g., in the Z-direction) thickness of the second base structure 220 may be within a range from about 300 nm to about 500 nm.

In some embodiments, and with reference to FIG. 1E and FIG. 2A, attaching the second microelectronic device structure 200 to the first microelectronic device structure 100 may form the sense amplifier driver regions 206, the one or more row decoder regions 212, and the one or more main word line driver regions 210 directly vertically (e.g., in the Z-direction) above the array region 101; the sub word line driver regions 208 directly vertically above the socket regions 102 and the first conductive contact exit regions 104 (e.g., above the staircases structures 131); each of the sense amplifier regions 202, the column decoder regions 204, and the one or more additional CMOS device regions 216 directly vertically above the second conductive contact exit regions 106; and the input/output device regions 214 directly vertically above the socket regions 102 and the first conductive contact exit regions 104.

The first conductive contact structures 135 in electrical communication with the conductive structures 132 of the memory cells 125 are horizontally aligned (e.g., in the X-direction, in the Y-direction) with the sub word line driver regions 208 of the second microelectronic device structure 200. In some embodiments, the sub word line driver regions 208 directly vertically (e.g., in the Z-direction) overlie the first conductive contact structures 135 in electrical communication with the conductive structures 132. In some such embodiments, the first conductive contact structures 135 are electrically coupled to the sub word line driver regions 208 without rerouting the first conductive contact structures 135. Forming the sub word line driver regions 208 directly vertically above the first conductive contact structures 135 facilitates a shorter data path between the memory cells 125 and the sub word line driver regions 208, increasing the operating speed of the microelectronic device formed from the first microelectronic device structure 100 and the second microelectronic device structure 200.

The sense amplifier regions 202 may be horizontally aligned (e.g., in the X-direction, in the Y-direction) with and directly vertically overlie (e.g., in the Z-direction) the second conductive contact exit regions 106 including the second conductive contact structures 172 electrically connected to the global digit lines 156. In some embodiments, the sense amplifier regions 202 are electrically connected to second conductive contact structures 172 without rerouting the second conductive contact structures 172. Forming the sense amplifier regions 202 directly vertically over the second conductive contact exit regions 106 facilitates a shorter data path between the memory cells 125 and the sense amplifier regions 202, improving operation and the operating speed of the microelectronic device formed from the first microelectronic device structure 100 and the second microelectronic device structure 200.

Figure 2G:
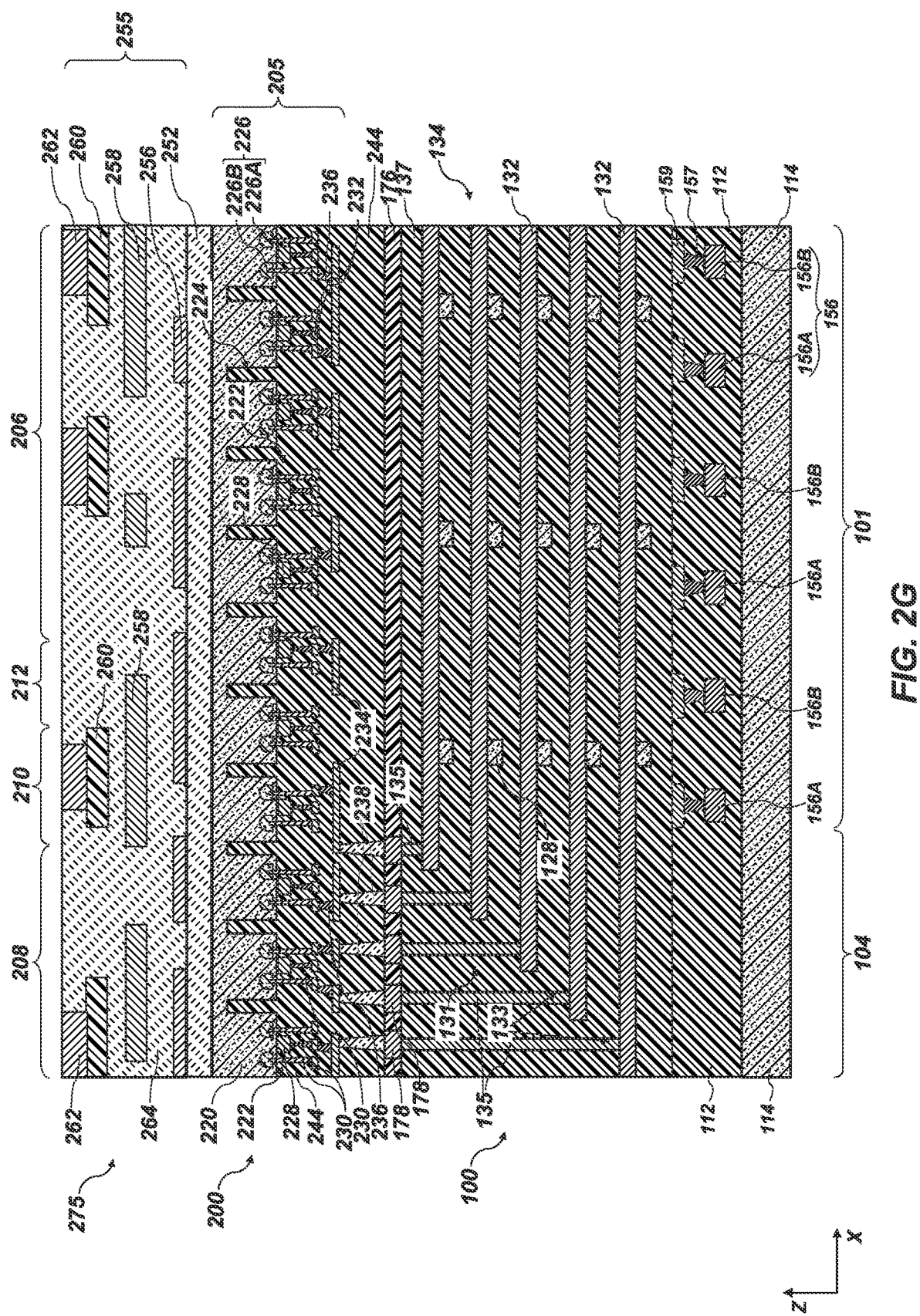
Figure 2H:
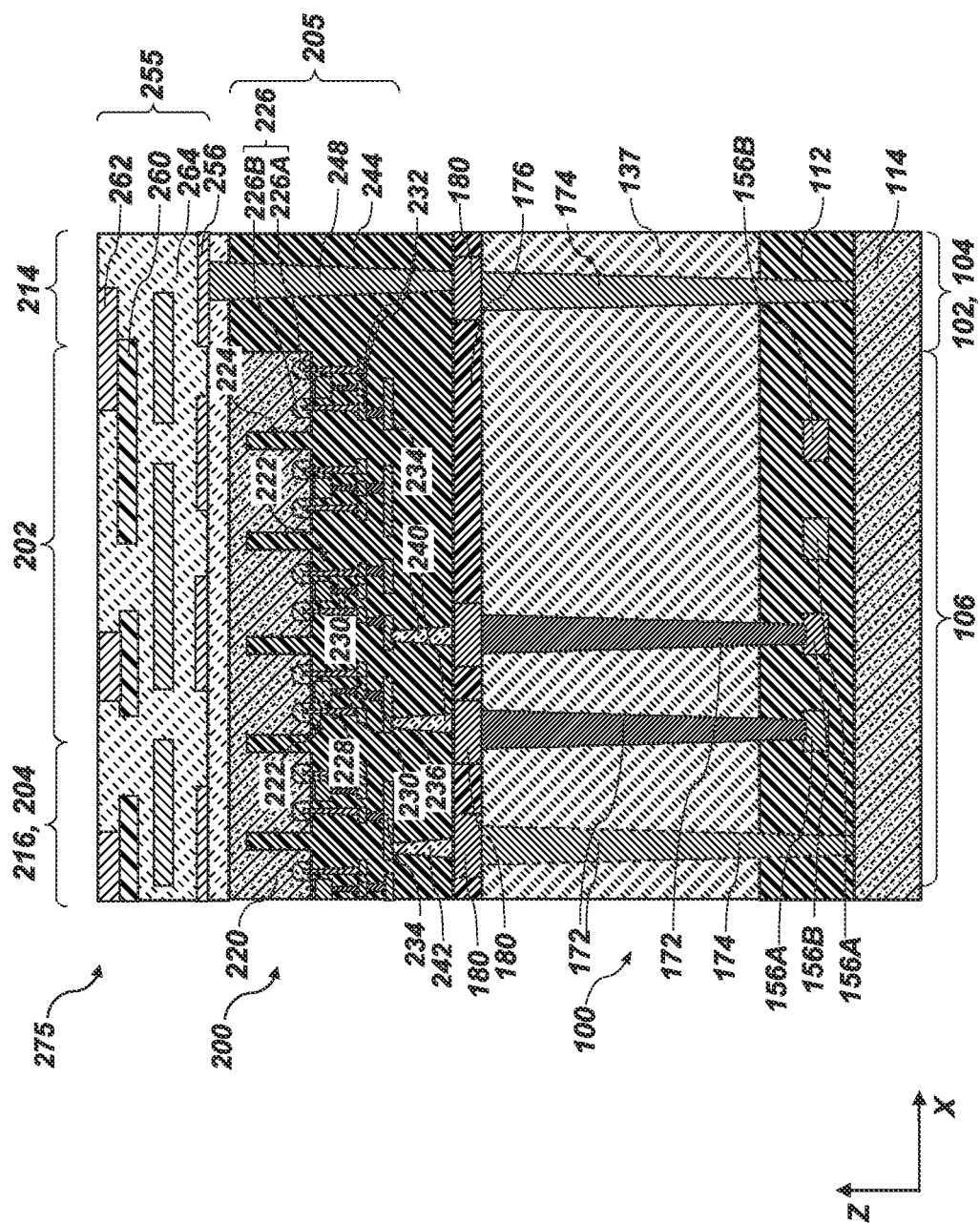
Figure 2I:
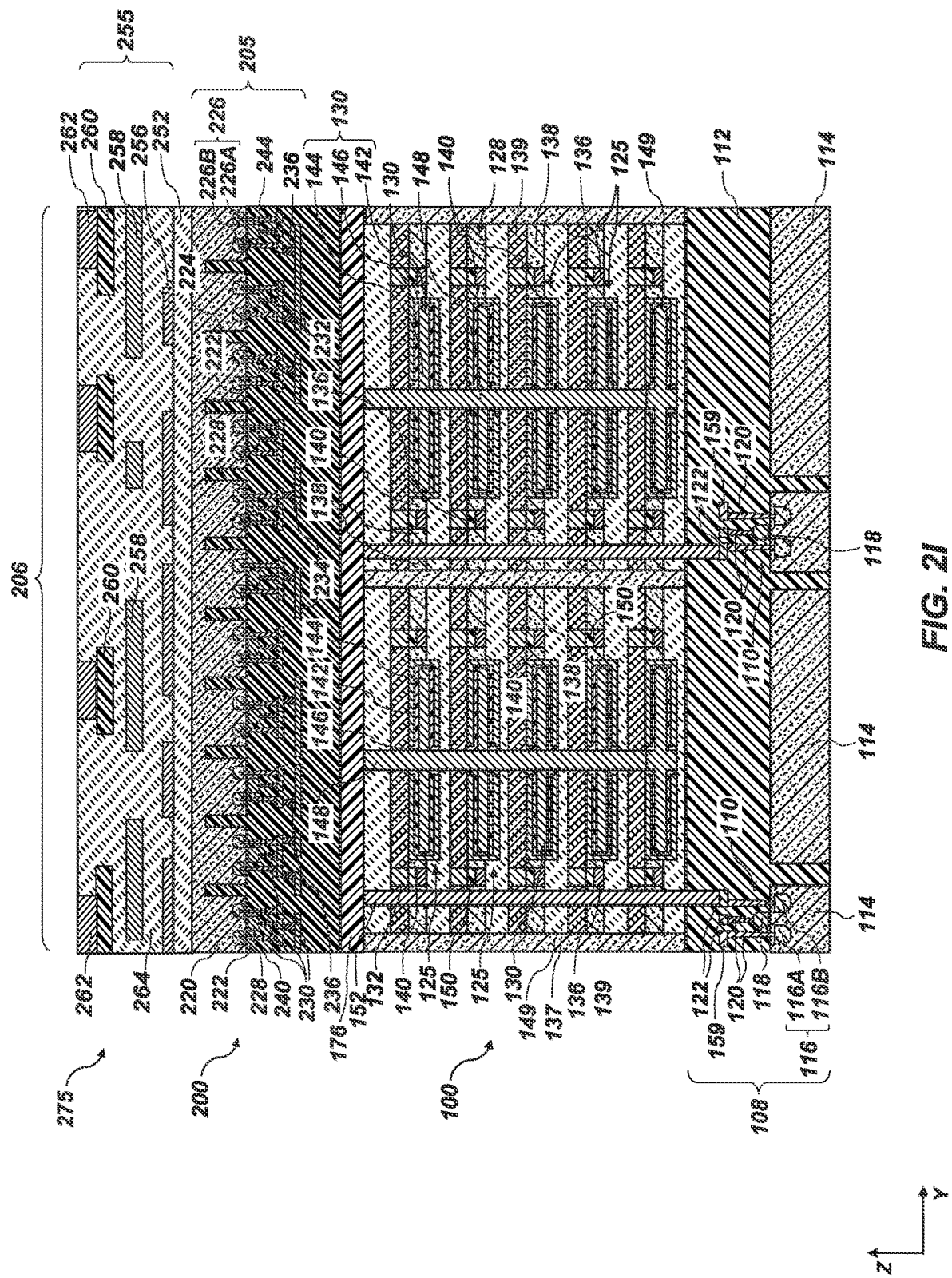

FIG. 2G through FIG. 2I illustrate the microelectronic device structure assembly 250 after forming a back end of line (BEOL) structures over the second microelectronic device structure 200 to form a microelectronic device 275.

FIG. 2G is a simplified partial cross-sectional view of the microelectronic device structure assembly 250 illustrating the same cross-sectional view of FIG. 2D; and FIG. 2H is a simplified partial cross-sectional view of the microelectronic device structure assembly 250 illustrating the same cross-sectional view of FIG. 2E; and FIG. 2I is a simplified partial cross-sectional view of the microelectronic device structure assembly illustrating the same cross-sectional view of FIG. 2F. With reference to FIG. 2G through FIG. 2I, a fourth insulative material 252 may be formed over the microelectronic device structure assembly 250. The fourth insulative material 252 may be formed of and include insulative material, such as one or more of the materials described above with reference to the first insulative material 112. In some embodiments, the fourth insulative material 252 comprises silicon dioxide.

With reference to FIG. 2H, ninth conductive interconnect structures 248 may be formed through the fourth insulative material 252 and the third insulative material 244 in the socket regions 102 vertically underlying the input/output device region 214. The ninth conductive interconnect structures 248 may be formed in electrical communication with the second pad structures 180. The ninth conductive interconnect structures 248 may individually be formed of and include conductive material, such as, for example, tungsten.

With collective reference to FIG. 2G through FIG. 2I, after forming the fourth insulative material 252, back end of line (BEOL) structures may be formed over the microelectronic device structure assembly 250 in a back end of line region 255 to form the microelectronic device 275. The BEOL region 255 may include, for example, fourth pad structures 256, one or more conductive line structures 258, one or more fifth pad structures 260, and one or more landing pad structures 262. Each of the fourth pad structures 256, conductive line structures 258, and fifth pad structures 260 may be located within an insulative material 264, such as, for example, silicon dioxide.

At least some of the fourth pad structures 256 may overlie and be in contact with, for example, the second pad structures 180 through the ninth conductive interconnect structures 248 that are, in turn, in electrical communication with one or more components of the first microelectronic device structure 100 (e.g., the first base structure 114). For example, with reference to FIG. 2H, at least one of the fourth pad structures 256 is in electrical communication with a ninth conductive interconnect structure 248 that is, in turn, in electrical communication with one of the second pad structures 180. At least additional fourth pad structures 256 vertically (e.g., in the Z-direction) overlie the transistor structures 222.

Each of the fourth pad structures 256, the conductive line structures 258, and the fifth pad structures 260 may individually be formed of and include conductive material. In some embodiments, the fourth pad structures 256, the conductive line structures 258, the fifth pad structures 260 individually comprise copper. In other embodiments, each of the fourth pad structures 256, the conductive line structures 258, the fifth pad structures 260 comprise copper.

The landing pad structures 262 may be formed of and include conductive material. In some embodiments, the landing pad structures 262 comprise aluminum. In other embodiments, the landing pad structures 262 comprise copper. In yet other embodiments, the landing pad structures 262 comprise tungsten.

Although the microelectronic device 275 has been described and illustrated as including one first microelectronic device structure 100 including one vertical stack of memory cells 125 (FIG. 1J), the disclosure is not so limited. In other embodiments, the microelectronic device 275 includes more than one microelectronic device structure including memory cells.

Figure 3A:
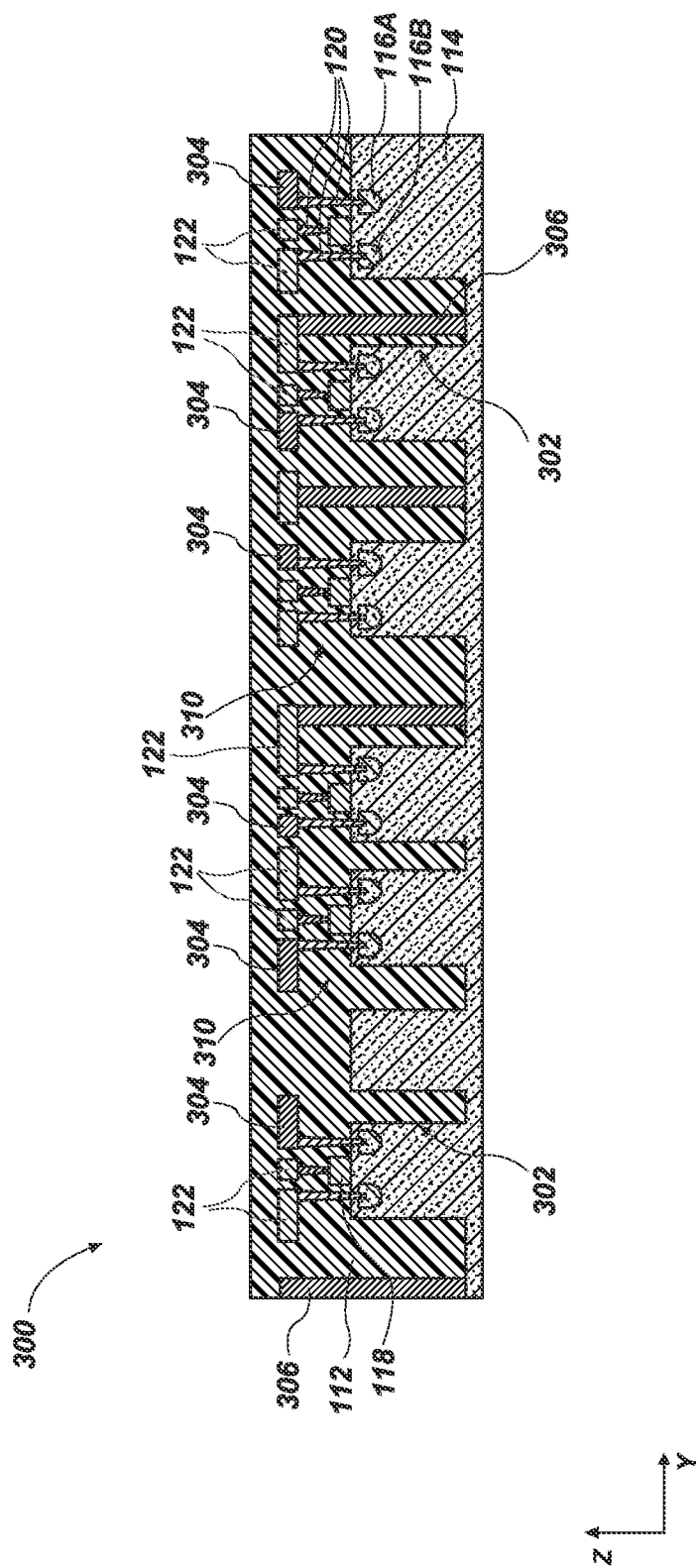
FIG. 3A through FIG. 3N include a simplified partial cross-sectional views illustrating a method of forming a microelectronic device, in accordance with embodiments of the disclosure.
Figure 3B:
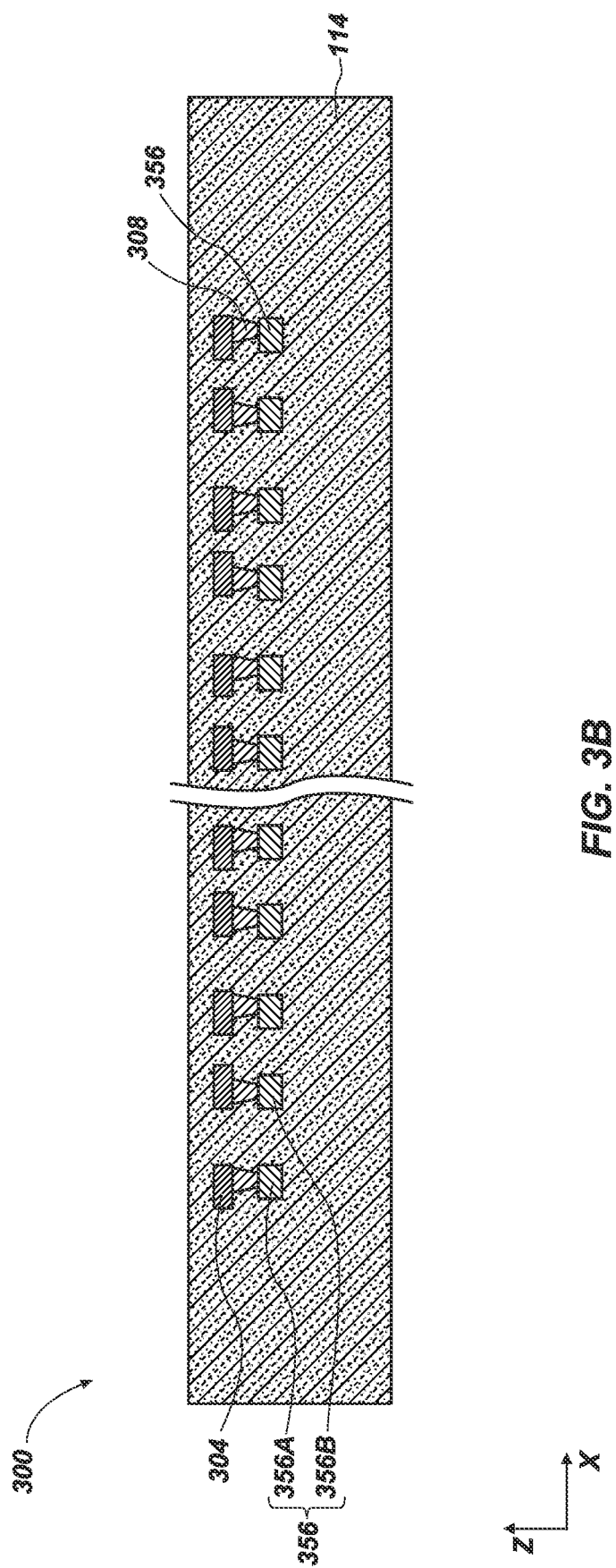
Figure 3C:
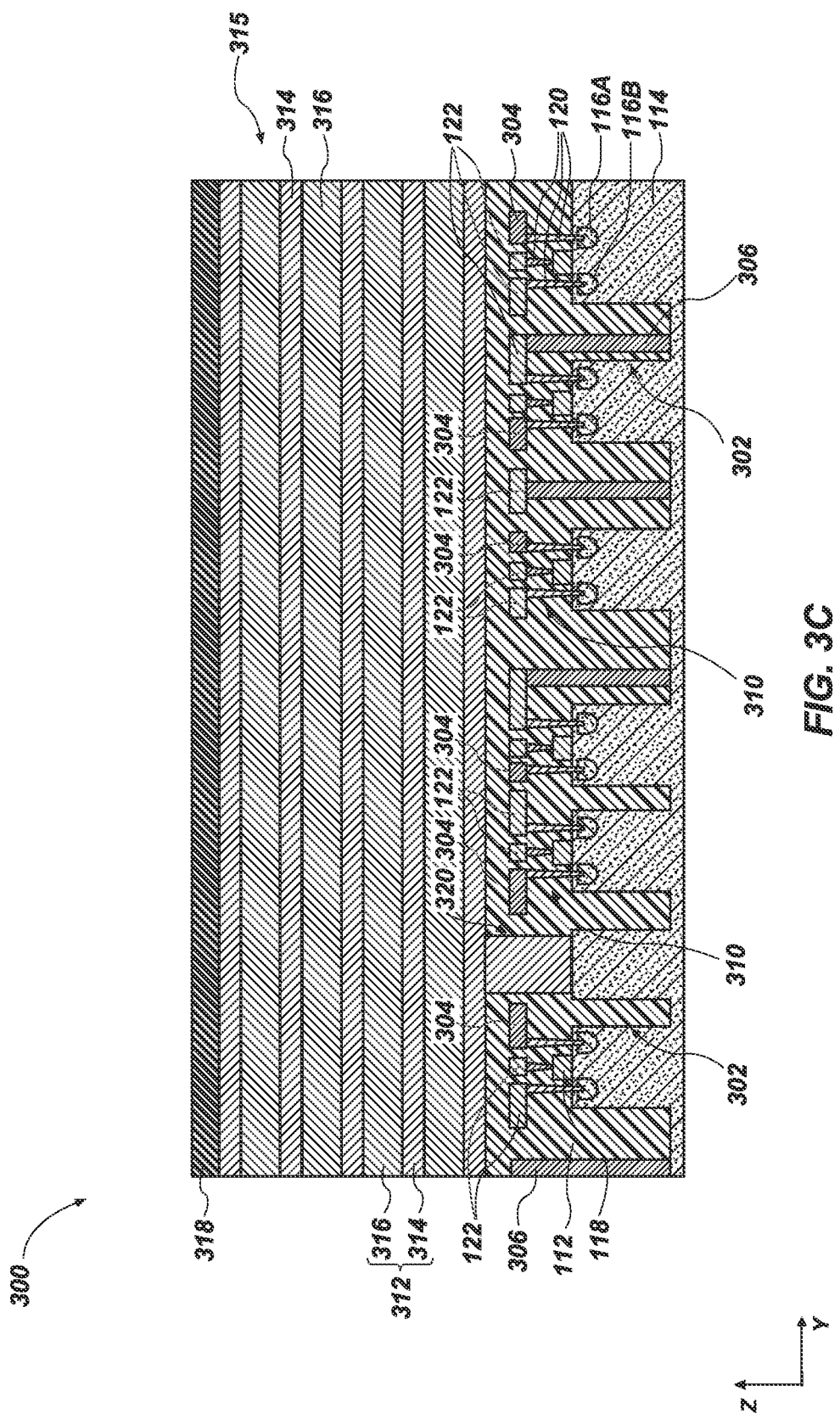
Figure 3D:
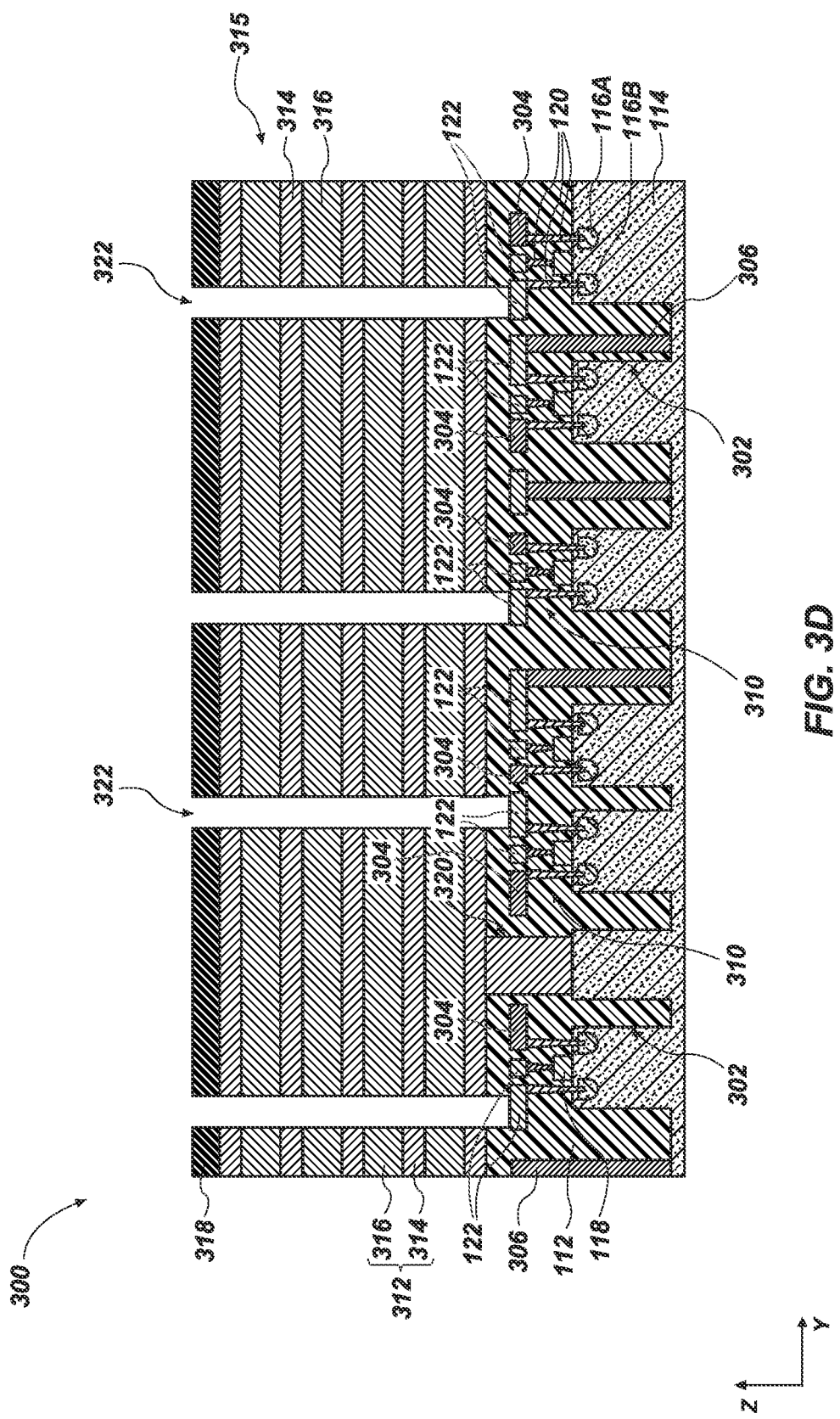
Figure 3E:
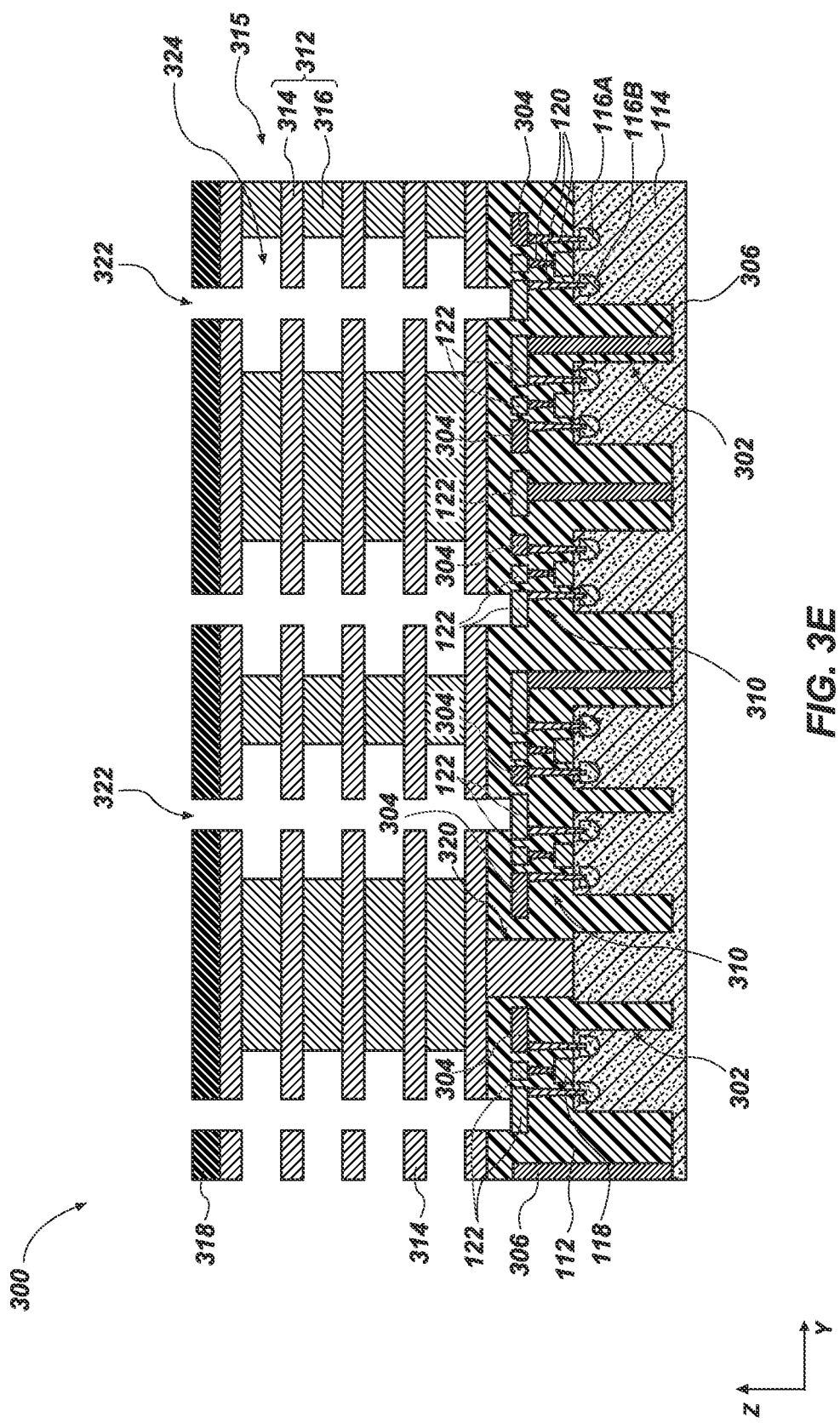
Figure 3F:
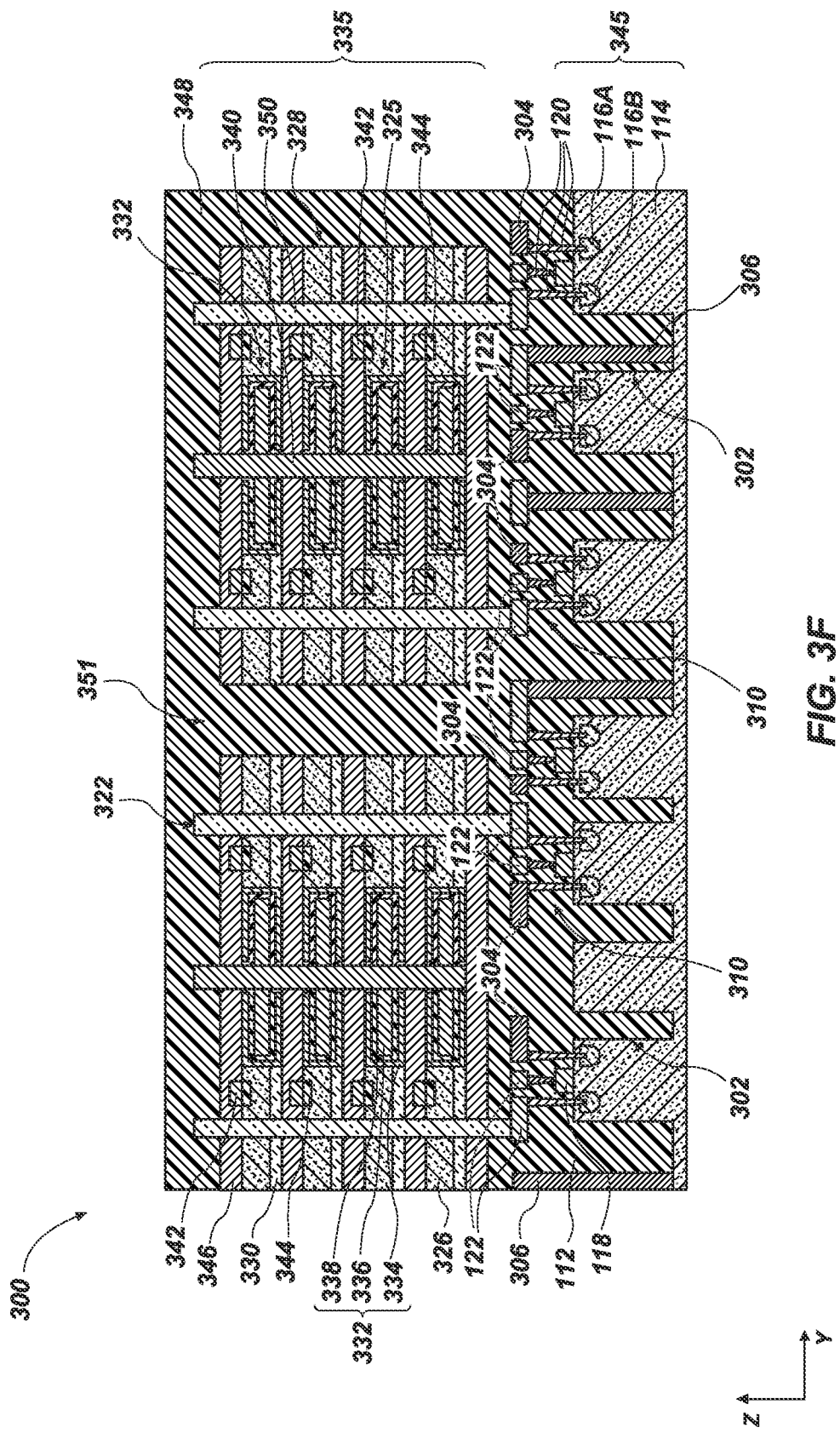
Figure 3G:
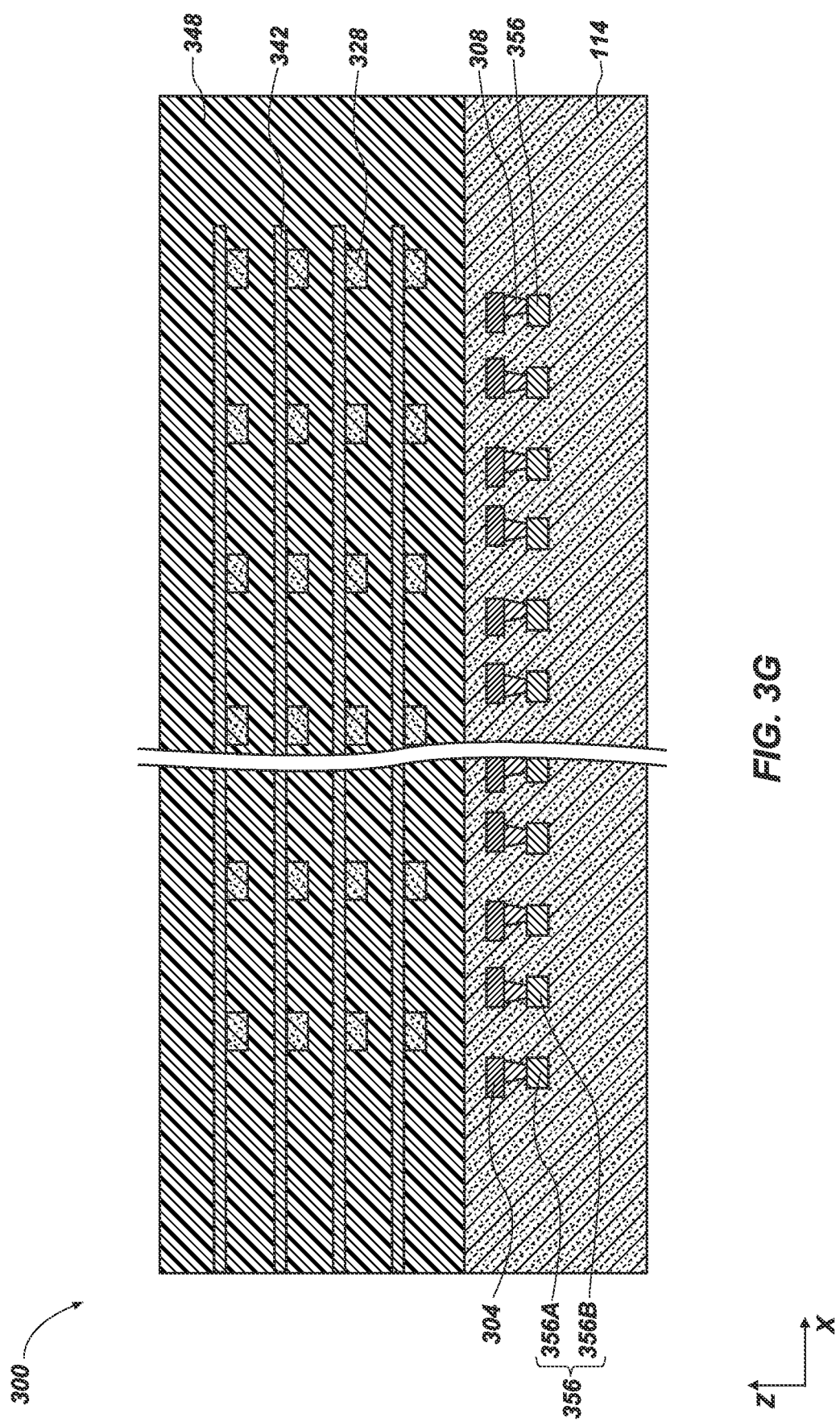
Figure 3H:
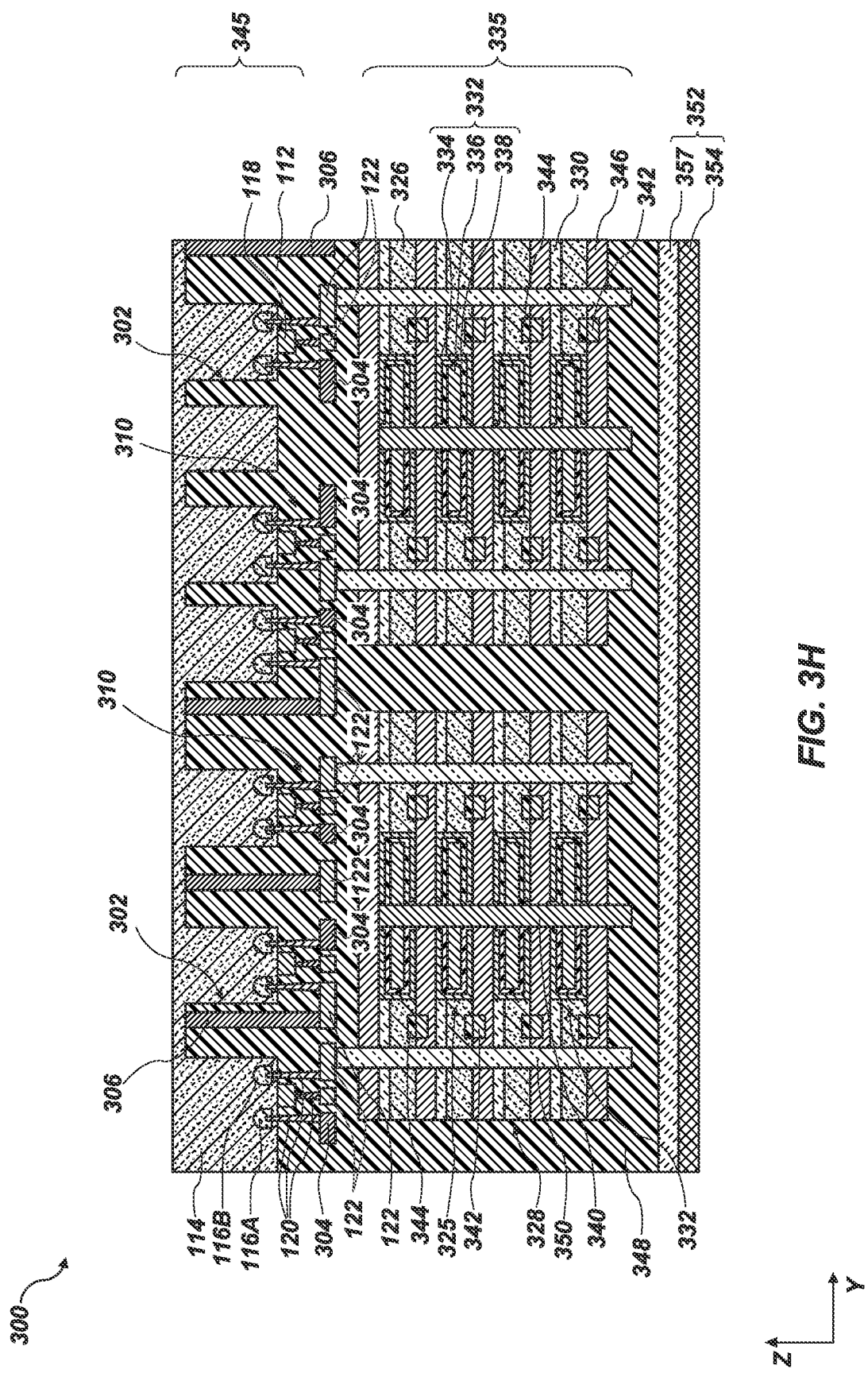
Figure 3I:
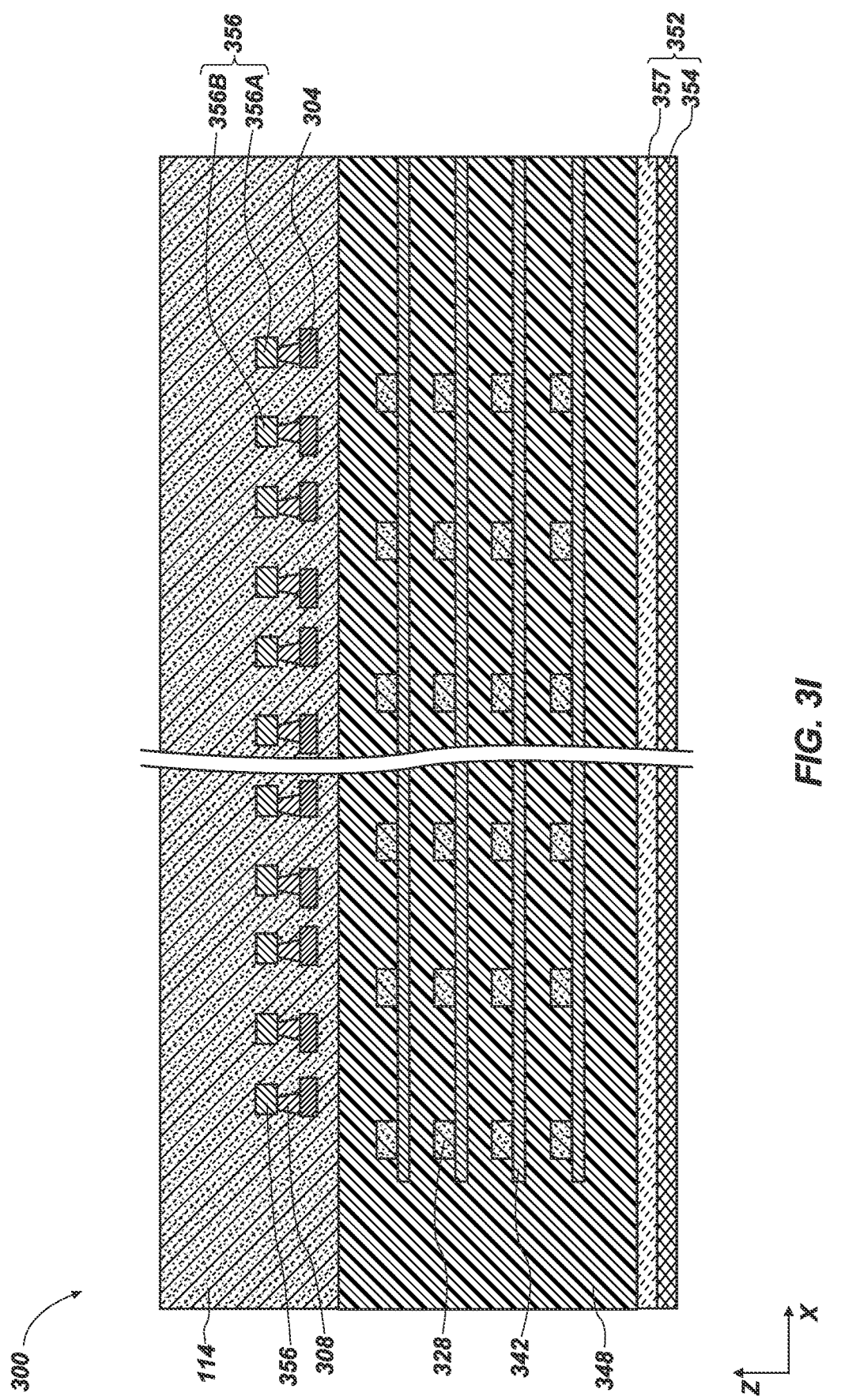
Figure 3J:
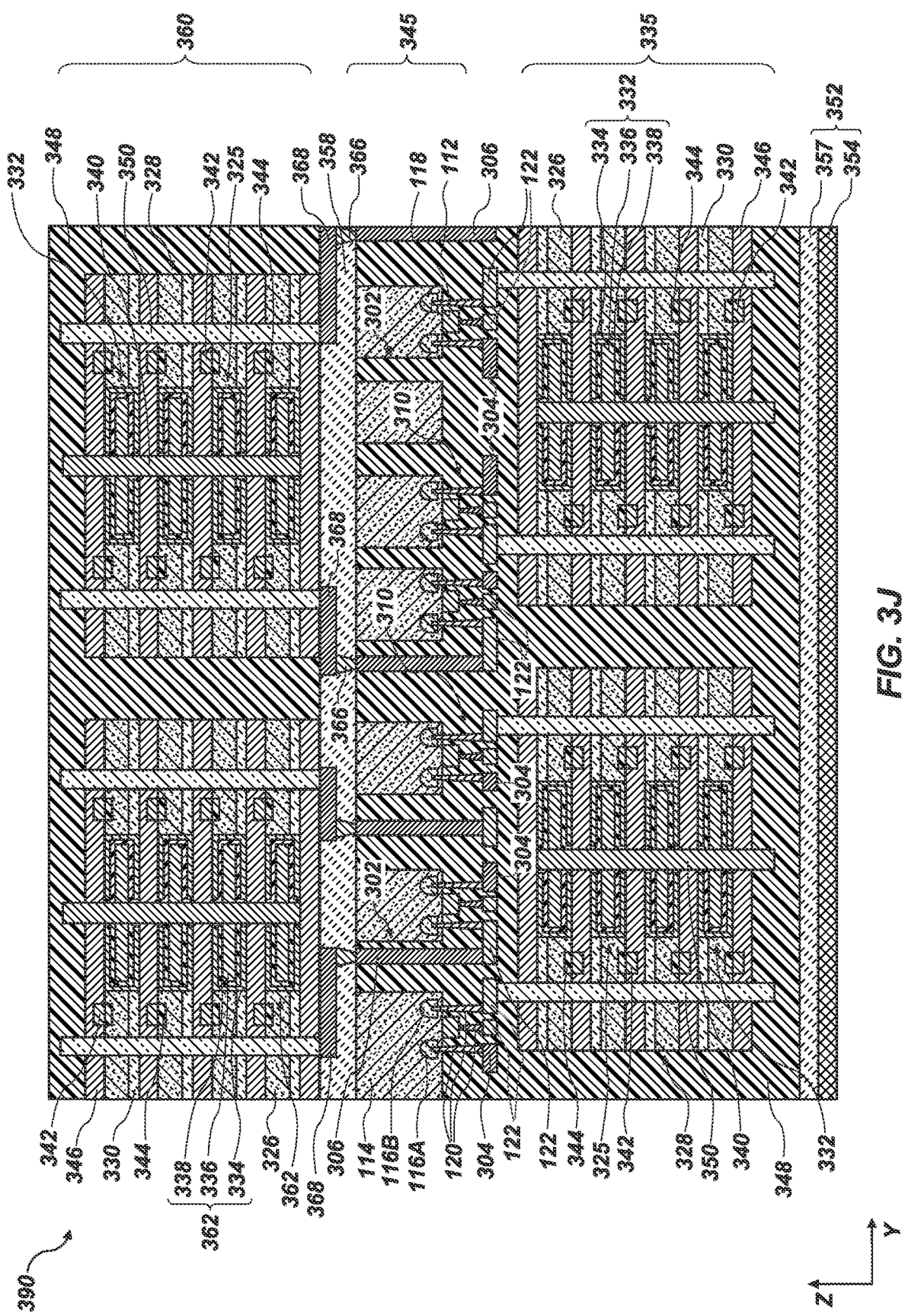
Figure 3K:
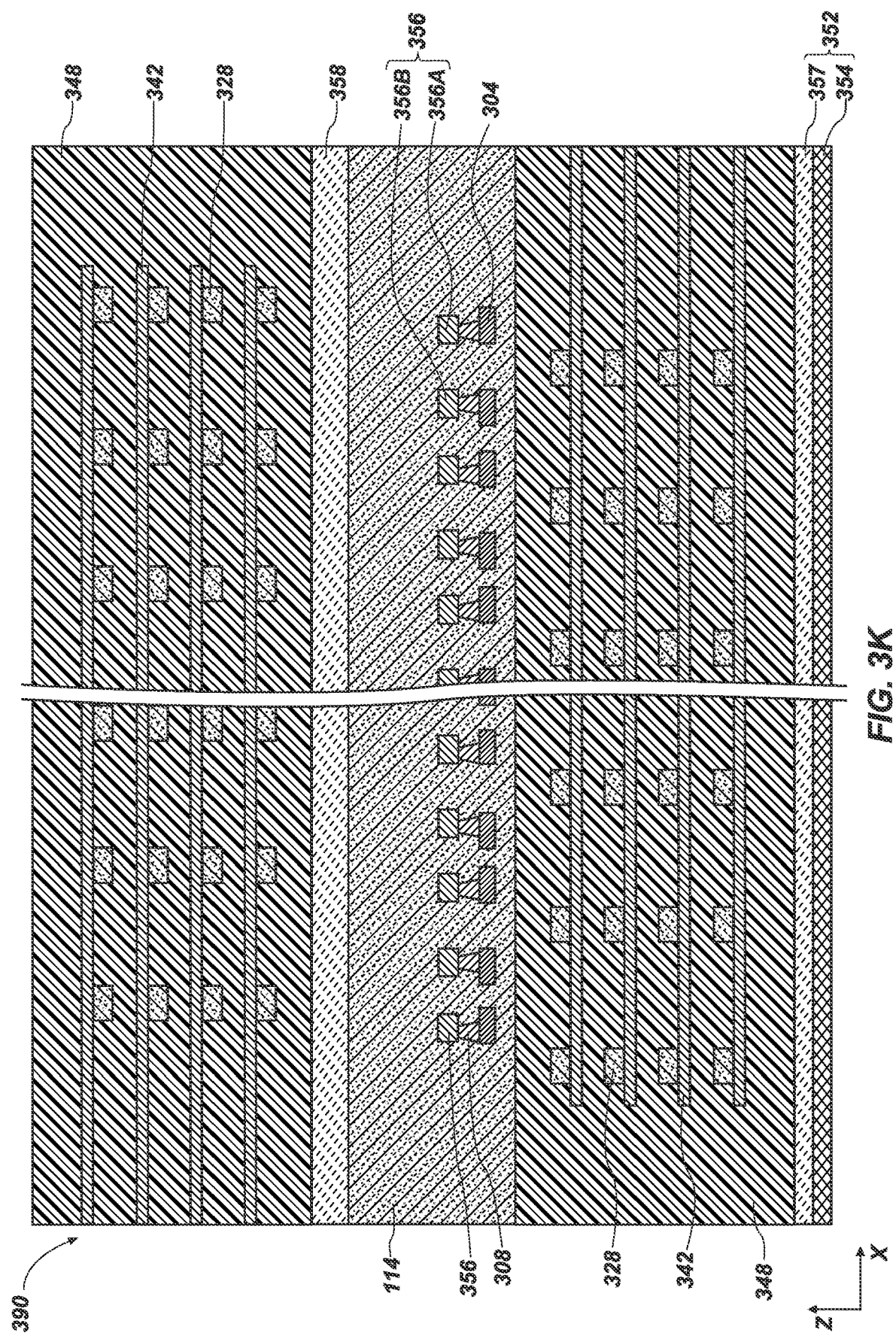
Figure 3L:
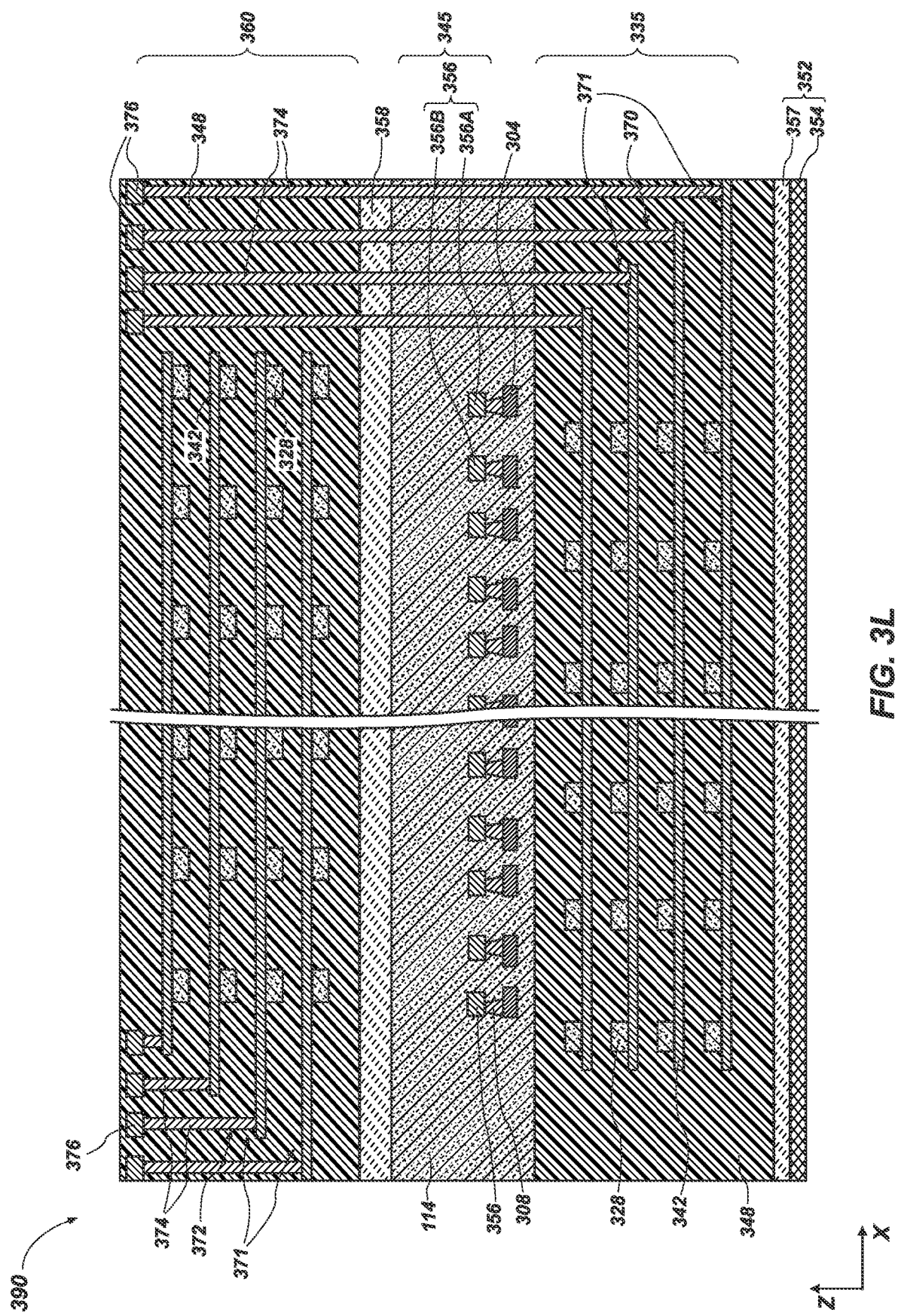
Figure 3N:
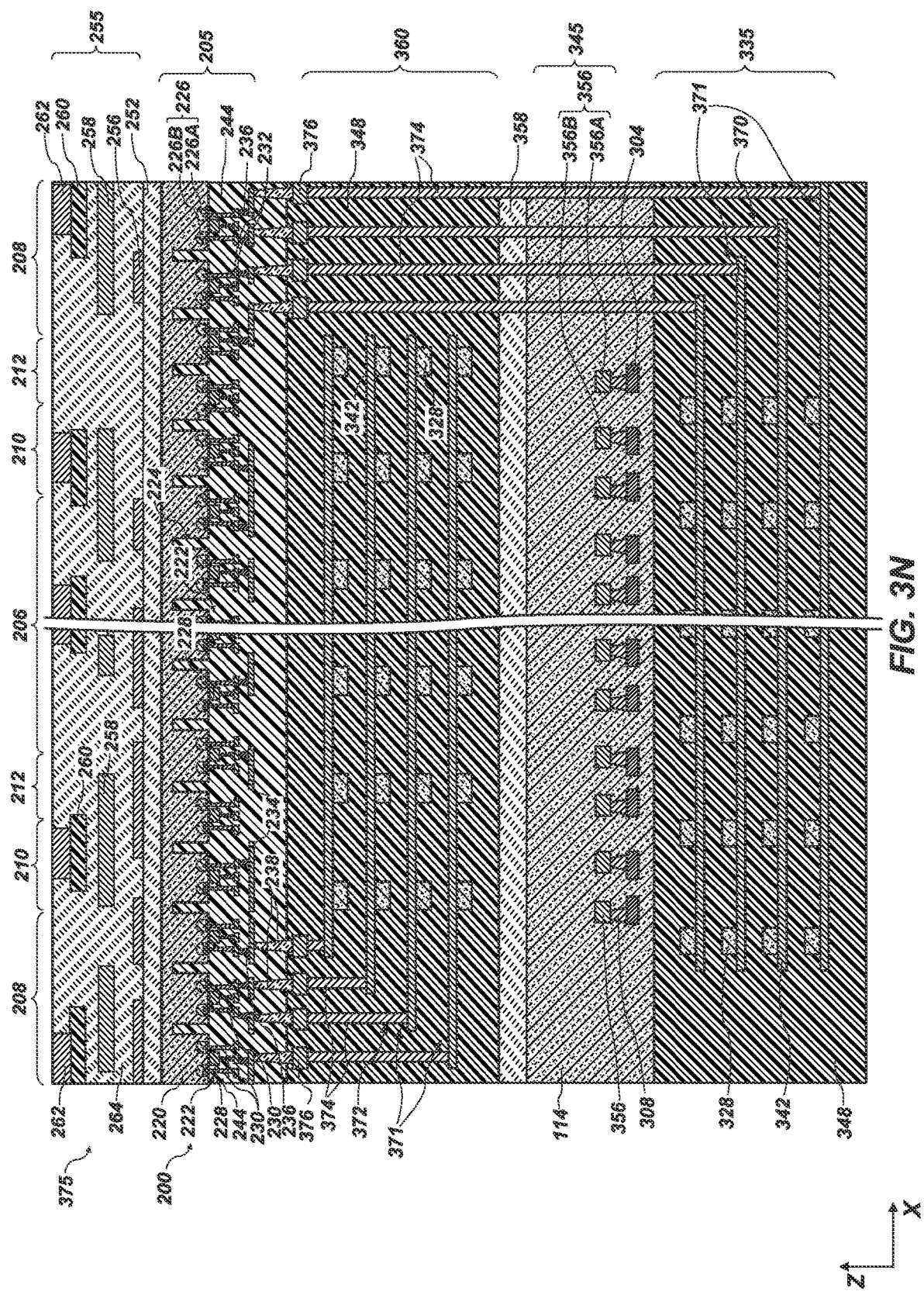

FIG. 3A through FIG. 3N illustrate different processing stages of a method of forming a microelectronic device (e.g., a memory device, such as a 3D DRAM memory device), in accordance with additional embodiments of the disclosure. FIG. 3A is a simplified partial cross-sectional view of a first microelectronic device structure 300 illustrating substantially the same cross-sectional view of the first microelectronic device structure 100 of FIG. 1G; and FIG. 3B is a simplified partial cross-sectional view of the first microelectronic device structure 300 illustrating substantially the same cross-sectional view of the first microelectronic device structure 100 of FIG. 1F.

With reference to FIG. 3A, the first microelectronic device structure 300 comprises the first base structure 114 and includes transistor structures 310, as described above with reference to FIG. 1C. The transistor structures 310 may be substantially similar to the transistor structures 110 (FIG. 1C) and include the first base structure 114, the conductively doped regions 116 (including source regions 116A and drain regions 116B), and the gate structures 118, as described above with reference to FIG. 1C. The transistor structures 310 may be referred to as "multiplexers." The transistor structures 310 may be isolated from each other by shallow trench isolation (STI) structures 302 comprising the first insulative material 112. In some embodiments, at least some of the STI structures 302 exhibit a width (e.g., in the X-direction, in the Y-direction) that is different than a width of other STI structures 302.

The first conductive interconnect structures 120 are in electrical communication with the gate structures 118 and the conductively doped regions 116. In some embodiments, first routing structures 122 may be in electrical communication with the first conductive interconnect structures 120. In some embodiments, some of the first routing structures 122 are in electrical communication with global digit lines 356 (FIG. 3B) and are configured for providing electrical communication between the global digit lines 356 and the transistor structures 310. The first routing structures 122 in electrical communication with global digit lines 356 may be referred to herein as "global digit line routing structures 304" and correspond to the global digit line routing structures 159 (FIG. 1E through FIG. 1G).

With reference to FIG. 3A, at least some of the first routing structures 122 are electrically coupled to second conductive interconnect structures 306 extending vertically (e.g., in the Z-direction) below the upper surface of the first base structure 114 and into some of the STI structures 302 (e.g., at least some of the relatively wider STI structures 302).

Referring to FIG. 3B, the global digit lines 356 are individually in electrical communication with the global digit line routing structures 304 by means of third conductive interconnect structures 308. With reference to FIG. 3A and FIG. 3B, the global digit line routing structures 304 may electrically connect each global digit line 356 to one of the transistor structures 310.

Each of the global digit lines 356, the global digit line routing structures 304, the second conductive interconnect structures 306, and the third conductive interconnect structures 308 may be formed of and include conductive material. The global digit lines 356 may be formed of and include one or more of the materials described above with reference to the global digit lines 156 (FIG. 1A, FIG. 1D). In some embodiments, the global digit lines 356 comprise tungsten. In other embodiments, the global digit lines 356 comprise copper. In some embodiments, each of the global digit line routing structures 304 comprise tungsten. In other embodiments, each of the global digit line routing structures 304 comprise copper. Each of the second conductive interconnect structures 306 and the third conductive interconnect structures 308 may individually be formed of and include one or more of the materials described above with reference to the first conductive interconnect structures 120. In some embodiments, each of the second conductive interconnect structures 306 and the third conductive interconnect structures 308 comprise tungsten.

FIG. 3C is a simplified partial cross-sectional view of the first microelectronic device structure 300 illustrating the same cross-sectional view as FIG. 3A after forming a stack structure 315 comprising tiers 312 of a semiconductive structure 314 and a sacrificial structure 316. A mask material (e.g., a cap material) 318 may be formed over the tiers 312 of the semiconductive structure 314 and the sacrificial structure 316. The stack structure 315 may include vertically (e.g., in the Z-direction) alternating levels of the semiconductive structures 314 and the sacrificial structures 316.

The stack structure 315 may be formed by forming openings through portions of the first insulative material 112 to expose portions of the first base structure 114. A semiconductive material 320, from which the semiconductive structures 314 are formed, may be grown from the exposed surfaces of the first base structure 114. In some embodiments, the semiconductive material 320 is grown epitaxially from the exposed surfaces of the first base structure 114.

The semiconductive structures 314 may be formed of and include semiconductive material. In some embodiments, the semiconductive material of the semiconductive structures 314 comprises silicon (e.g., monocrystalline silicon, polycrystalline silicon). In some embodiments, the semiconductive structures 314 and the semiconductive material 320 comprise the same material composition. The sacrificial structures 316 may be formed of and include a material exhibiting an etch selectivity with respect to the semiconductive structures 314. In some embodiments, the sacrificial structures 316 are formed of and include silicon germanium.

The mask material 318 may be formed of and include a material exhibiting an etch selectivity with respect to the semiconductive structures 314 and the sacrificial structures 316. In some embodiments, the mask material 318 comprises silicon nitride.

With reference to FIG. 3D, openings 322 may be formed through the stack structure 315 to expose at least some of the first routing structures 122. As described in further detail below, the openings 322 may be used to form memory cells (e.g., memory cells 325 (FIG. 3F)) each individually comprising access devices (e.g., access devices 328 (FIG. 3F)) and storage devices (e.g., storage devices 332 (FIG. 3F)).

FIG. 3E illustrates the first microelectronic device structure 300 after selectively removing portions of the sacrificial structures 316 through the openings 322. The portions of the sacrificial structures 316 may be selectively removed with respect to the semiconductive structures 314. In some embodiments, the portions of the sacrificial structures 316 are selectively removed with a wet etchant, such as with one or more of acetic acid, hydrogen peroxide, ammonium hydroxide, and hydrofluoric acid.

With reference to FIG. 3F, additional processing acts may be performed on the first microelectronic device structure 300 to form a first memory cell stack 335 vertically overlying a multiplexer region 345 comprising the transistor structures 310 (e.g., the multiplexers). For example, the recesses 324 (FIG. 3E) may be filled with a semiconductive material 326 to form access devices 328 and remaining portions of the recesses 324 may be filled with insulative structures 330. The access device 328 may be substantially similar to the access devices 128 (FIG. 1G) and may include a channel material (e.g., channel material 136 (FIG. 1G)), a source material (e.g., source material 138 (FIG. 1G)), and a drain material (e.g., drain material 140 (FIG. 1G)). The insulative structures 330 may be substantially the same as the insulative structures 137 (FIG. 1G). In some embodiments, the insulative structures 330 comprise silicon dioxide.

In some embodiments, after forming the access devices 328, conductive pillar structures 350 may be formed within remaining portions of the openings 322 (FIG. 3E). The conductive pillar structures 350 may be substantially the same as the conductive pillar structures 152 (FIG. 1G) and may be referred to as "digit lines," "second conductive lines," "digit line pillar structures," "local digit lines," or "vertical digit lines."

In some embodiments, after forming the access devices 328, openings may be formed through portions of the first microelectronic device structure 300 (at locations corresponding to conductive structures 340) and remaining portions of the sacrificial structures 316 (FIG. 3E) may be removed and replaced with storage devices 332. The storage devices 332 may be substantially similar to the storage devices 130 (FIG. 1G). For example, the storage devices 332 may include a first electrode 334, a second electrode 336, and a dielectric material 338 between the first electrode 334 and the second electrode 336. The first electrode 334, the second electrode 336, and the dielectric material 338 may be substantially the same as the respective first electrode 142 (FIG. 1G), the second electrode 144 (FIG. 1G), and the dielectric material 146 (FIG. 1G).

After forming the storage devices 332, conductive structures 340 may be formed through the openings through which the storage devices 332 were formed. The conductive structures 340 may be substantially similar to the conductive structures 148 (FIG. 1G). In some embodiments, the conductive structures 340 comprise substantially the same material composition as the second electrode 336.

In some embodiments, conductive structures 342 (e.g., first conductive lines, such as word lines) are formed over portions of the access devices 328, such as over channel regions of the access devices 328. The conductive structures 342 may be separated from the access devices by a dielectric material 344. The conductive structures 342 may be substantially the same as the conductive structures 132 (FIG. 1G) and the dielectric material 344 may be substantially the same as the dielectric material 150 (FIG. 1G).

Additional openings (at locations 351) may be formed through the first microelectronic device structure 300. In some embodiments, the semiconductive structures 314 (FIG. 3E) may be removed through the additional openings and replaced with insulative structures 346. The insulative structures 346 may be substantially the same as the insulative structures 137 (FIG. 1G). In some embodiments, the insulative structures 346 comprise silicon dioxide. After forming the insulative structures 346, the openings may be filled with a second insulative material 348. In some embodiments, the second insulative material 348 comprises substantially the same material composition as the insulative structures 346. In some embodiments, the second insulative material 348 comprises silicon dioxide.

With continued reference to FIG. 3F, the first microelectronic device structure 300 may include the first memory cell stack 335 vertically overlying the multiplexer region 345, the first memory cell stack 335 comprising vertical stacks of access devices 328 neighboring vertical stacks of storage devices 332.

FIG. 3G is a simplified partial cross-sectional view of the first microelectronic device structure 300 illustrating the same cross-sectional view as FIG. 3B. With reference to FIG. 3G, the conductive structures 342 may extend in the X-direction, as described above with reference to the conductive structures 132 (FIG. 1F).

With reference to FIG. 3H and FIG. 3I, in some embodiments, a carrier wafer assembly 352 may be bonded to the first microelectronic device structure 300 and the first microelectronic device structure 300 may be vertically (e.g., in the Z-direction) inverted (e.g., flipped). The carrier wafer assembly 352 may include a wafer structure 354 and a third insulative material 357 over the wafer structure 354. The wafer structure 354 may comprise, for example, a glass substrate. The third insulative material 357 may comprise an oxide material, such as, for example, silicon dioxide. In some embodiments, the third insulative material 357 comprises substantially the same material composition as the second insulative material 348.

The carrier wafer assembly 352 may be attached to the first microelectronic device structure 300 by placing the third insulative material 357 in contact with the second insulative material 348 and exposing the first microelectronic device structure 300 and the carrier wafer assembly 352 to annealing conditions to form bonds (e.g., oxide to oxide bonds) between the third insulative material 357 in contact with the second insulative material 348. In some embodiments, the first microelectronic device structure 300 and the carrier wafer assembly 352 are exposed to a temperature greater than, for example, 800° C., to form the oxide to oxide bonds and attach the first microelectronic device structure 300 to the carrier wafer assembly 352.

With reference to FIG. 3H and FIG. 3I, after attaching the carrier wafer assembly 352 to the first microelectronic device structure 300 and vertically inverting the first microelectronic device structure 300, the first microelectronic device structure 300 may be thinned, such as by exposing the first microelectronic device structure 300 to a CMP process. In some embodiments, thinning the first microelectronic device structure 300 may include removing (e.g., thinning) portions of the first base structure 114 and the first insulative material 112. Removing portions of the first base structure 114 may include isolating portions of the first base structure 114 from each other by the STI structures 302.

Referring now to FIG. 3J and FIG. 3K, a second memory cell stack 360 may be formed vertically (e.g., in the Z-direction) over the multiplexer region 345 to form a microelectronic device structure assembly 390. In some embodiments, a fourth insulative material 358 is formed over the first base structure 114 and the first insulative material 112. The fourth insulative material 358 may be formed of and include one or more of the materials described above with reference to the first insulative material 112. In some embodiments, the fourth insulative material 358 comprises silicon dioxide.

Fourth conductive interconnect structures 366 may be formed through the fourth insulative material 358 and in electrical communication with the second conductive interconnect structures 306 extending through the multiplexer region 345. Routing structures 368 may be in electrical communication with the fourth conductive interconnect structures 366.

The fourth conductive interconnect structures 366 and the routing structures 368 may individually be formed of and include conductive material, such as one or more of the materials described above with reference to the second conductive interconnect structures 306. In some embodiments, the fourth conductive interconnect structures 366 and the routing structures 368 individually comprise the same material composition as the second conductive interconnect structures 306. In some embodiments, the fourth conductive interconnect structures 366 and the routing structures 368 individually comprise tungsten. In other embodiments, the fourth conductive interconnect structures 366 and the routing structures 368 individually comprise copper.

After forming the fourth insulative material 358, the second memory cell stack 360 may be formed vertically (e.g., in the Z-direction) over the multiplexer region 345. In some embodiments, the multiplexer region 345 vertically intervenes between the first memory cell stack 335 and the second memory cell stack 360.

The second memory cell stack 360 may be substantially similar to the first memory cell stack 335 and may be formed in a manner substantially similar to the formation of the first memory cell stack 335. For example, the second memory cell stack 360 may include additional memory cells 362 comprising access devices 328 and storage devices 332, as described above with reference to the memory cells 325 of the first memory cell stack 335. The second memory cell stack 360 may include substantially the same materials and structures as described above with reference to the first memory cell stack 335.

The conductive pillar structures 350 of the second memory cell stack 360 may be formed in electrical communication with the routing structures 368. Accordingly, the conductive pillar structures 350 of the second memory cell stack 360 may be in electrical communication with the global digit lines 356 through the global digit line routing structures 304 by means of the second conductive interconnect structures 306 and the routing structures 368.

In some embodiments, the first microelectronic device structure 300 comprises global digit lines 356 in electrical communication with the transistor structures 310 of the multiplexer region 345. At least some of the transistor structures 310 are in electrical communication with the conductive pillar structures 350 of the first memory cell stack 335 and at least other transistor structures 310 are in electrical communication with the conductive pillar structures 350 of the second memory cell stack 360. In some embodiments, at least some of (e.g., about one-half of) the global digit lines 356 are in electrical communication with the conductive pillar structures 350 of the first memory cell stack 335 and at least other of (e.g., the other about one-half of) the global digit lines 356 are in electrical communication with the conductive pillar structures 350 of the second memory cell stack 360. Accordingly, each transistor structure 310 is configured to selectively electrically connect one of the conductive pillar structures 350 to one of the global digit lines 356, such as responsive to application of a drive voltage to the gate structure 118.

Referring now to FIG. 3L, a first staircase structure 370 may be formed in the first memory cell stack 335 and a second staircase structure 372 may be formed in the second memory cell stack 360. Each of the first staircase structure 370 and the second staircase structure 372 individually comprises steps 371 comprising horizontal (e.g., in the X-direction) edges of the conductive structures 342.

The first staircase structure 370 may be formed by, for example, forming a mask material over portions of the microelectronic device structure assembly 390 and selectively removing portions of the conductive structures 342 of the first memory cell stack 335 to form the steps 371 of the first staircase structure 370. In some embodiments, after forming the first staircase structure 370, the mask material over other portions of the microelectronic device structure assembly 390 may be removed and an additional mask material is formed over portions of the microelectronic device structure assembly 390 that are outside of horizontal boundaries of the second staircase structure 372. The second staircase structure 372 may be formed through the additional mask material.

After forming the first staircase structure 370, conductive contact structures 374 (substantially similar to the first conductive contact structures 135 (FIG. 1F)) may be formed through the first microelectronic device structure 300 (e.g., through portions of the second insulative material 348 of the second memory cell stack 360, through the fourth insulative material 358, through the first insulative material 112, and through the second insulative material 348 of the first memory cell stack 335) to the conductive structures 342 of the first staircase structure 370. In addition, after forming the second staircase structure 372, additional conductive contact structures 374 may be formed through the second insulative material 348 of the second memory cell stack 360 and in contact with the conductive structures 342 of the second staircase structure 372.

The conductive contact structures 374 may individually be formed of and include conductive material, such as one or more of the materials described above with reference to the first conductive contact structures 135 (FIG. 1F). In some embodiments, the conductive contact structures 374 are individually formed of and comprise tungsten.

In some embodiments, the steps 371 of the first staircase structure 370 are horizontally (e.g., in the X-direction) offset from the steps 371 of the second staircase structure 372. In some embodiments, the steps 371 of the first staircase structure 370 are formed at an opposing horizontal (e.g., in the X-direction) than the steps 371 of the second staircase structure 372. In other embodiments, the steps 371 of the first staircase structure 370 may be horizontally offset (e.g., in the Y-direction) from the steps 371 of the second staircase structure 372.

With continued reference to FIG. 3L, after forming the conductive contact structures 374 in contact with conductive structures 342, conductive pad structures 376 may be formed in electrical communication with the conductive contact structures 374 of each of the first staircase structure 370 and the second staircase structure 372, as described above with reference to the first pad structures 178 (FIG. 1I).

The conductive pad structures 376 may individually be formed of and include conductive material, such as one or more of the materials described above with reference to the first pad structures 178. In some embodiments, the conductive pad structures 376 individually comprise tungsten. In other embodiments, the conductive pad structures 376 individually comprise copper.

With reference to FIG. 3M and FIG. 3N, the second microelectronic device structure 200 may be attached to the microelectronic device structure assembly 390 (FIG. 3K, FIG. 3L) to form a microelectronic device 375 as described above with reference to attachment of the second microelectronic device structure 200 to the first microelectronic device structure 100 with reference to FIG. 2D through FIG. 2F.

The second microelectronic device structure 200 may be attached to the microelectronic device structure assembly 390 (FIG. 3K, FIG. 3L) by, for example, contacting the second insulative material 348 of the microelectronic device structure assembly 390 with the third insulative material 244 of the second microelectronic device structure 200 and exposing the second insulative material 348 and the third insulative material 244 to annealing conditions to form bonds (e.g., oxide to oxide bonds) between the second insulative material 348 and the third insulative material 244. For example, the microelectronic device structure assembly 390 and the second microelectronic device structure 200 may be exposed to a temperature greater than, for example, 800° C., to form the oxide to oxide bonds and attach the second microelectronic device structure 200 to the microelectronic device structure assembly 390.

After attaching the second microelectronic device structure 200 to the microelectronic device structure assembly 390, a BEOL region 255 including back end of line structures may be formed over the second microelectronic device structure 200 to form the microelectronic device 375, as described above with reference to FIG. 2G through FIG. 2I. After forming the back end of line region 255, the carrier wafer assembly 352 (FIG. 3K, FIG. 3L) may be removed from the microelectronic device structure assembly 390 to form the microelectronic device 375.

Forming the microelectronic devices 275, 375 to include the first conductive contact exit regions 104 vertically below (e.g., directly vertically below) the sub word line driver regions 208 of the second microelectronic device structure 200 may facilitate a shorter data path between the memory cells 125 and the sub word line driver regions 208, increasing the operating speed of the microelectronic device 275, 375 formed from the first microelectronic device structure 100 and the second microelectronic device structure 200.

Similarly, forming the microelectronic devices 275, 375 to include the second conductive contact exit regions 106 vertically below (e.g., directly vertically below) the sense amplifier regions 202 of the second microelectronic device structure 200 may facilitate a shorter data path between the memory cells 125 and the sense amplifier regions 202, improving operation and the operating speed of the microelectronic device 275, 375 formed from the first microelectronic device structure 100 and the second microelectronic device structure 200.

Thus, in accordance with some embodiments, a microelectronic device comprises a first microelectronic device structure comprising multiplexers within a base structure, a stack structure vertically overlying the base structure and comprising conductive structures vertically alternating with insulative structures, a staircase structure within the stack structure, and vertical stacks of memory cells. Each vertical stack of memory cells individually comprises transistor structures each individually neighboring a capacitor structure of the capacitor structures, and a conductive pillar structure vertically extending through the transistor structures. The microelectronic device further comprises a second microelectronic device structure attached to the first microelectronic device structure, the second microelectronic device structure comprising a sub word line driver region comprising complementary metal-oxide-semiconductor (CMOS) circuits vertically overlying and within a horizontal area of the staircase structure, and conductive contact structures vertically extending between steps of the staircase structure and the sub word line driver region.

Furthermore, in accordance with additional embodiments of the disclosure, a memory device comprises a first die comprising a memory array region comprising vertical stacks of memory cells, a stack structure comprising alternating conductive structures and insulative structures intersecting the vertical stacks of memory cells, horizontal edges of the conductive structures and the insulative structures defining steps of a staircase structure, conductive pillar structures vertically extending through access devices of the memory array region, and global digit lines vertically underlying the vertical stacks of memory cells and extending from a conductive contact exit region at a first horizontal end of the memory array region to an additional conductive contact exit region at a second horizontal end of the memory array region opposite the first horizontal end of the memory array region. The memory device further comprises a second die bonded to the first die. The second die comprises a sub word line driver vertically overlying the staircase structure of the first die, the staircase structure of the first die within a horizontal area of the sub word line driver, and sense amplifier regions comprising one or more sense amplifiers vertically overlying the conductive contact exit region and the additional conductive contact exit region. The memory device also comprises conductive contacts vertically extending between the sense amplifier regions and each of the conductive contact exit region and the additional conductive contact exit region.

Moreover, in accordance with some embodiments of the disclosure, a method of forming a microelectronic device comprises forming a first microelectronic device structure comprising a multiplexer region formed in a base structure, a memory array region comprising vertical stacks of memory cells vertically neighboring the multiplexer region, a stack structure intersecting the vertical stacks of memory cells, conductive structures of the stack structure in electrical communication with memory cells of the vertical stacks of memory cells, horizontal ends of the conductive structures defining steps of a staircase structure, first conductive contact structures in electrical communication with the conductive structures of the stack structure, conductive pillar structures vertically extending through the vertical stacks of memory cells and in electrical communication with multiplexers of the multiplexer region, global digit lines extending in a horizontal direction vertically below the vertical stacks of memory cells, second conductive contact structures in electrical communication with the global digit lines, and a first oxide material overlying the memory array region and the stack structure. The method further comprises forming a second microelectronic device structure comprising a sense amplifier region comprising one or more sense amplifiers, and a second oxide material overlying the sense amplifier region. The method further comprises attaching the first microelectronic device structure to the second microelectronic device structure, wherein attaching the first microelectronic device structure to the second microelectronic device structure comprises horizontally aligning the second conductive contact structures with circuitry of the sense amplifier region, and bonding the first oxide material to the second oxide material.

Figure 4:
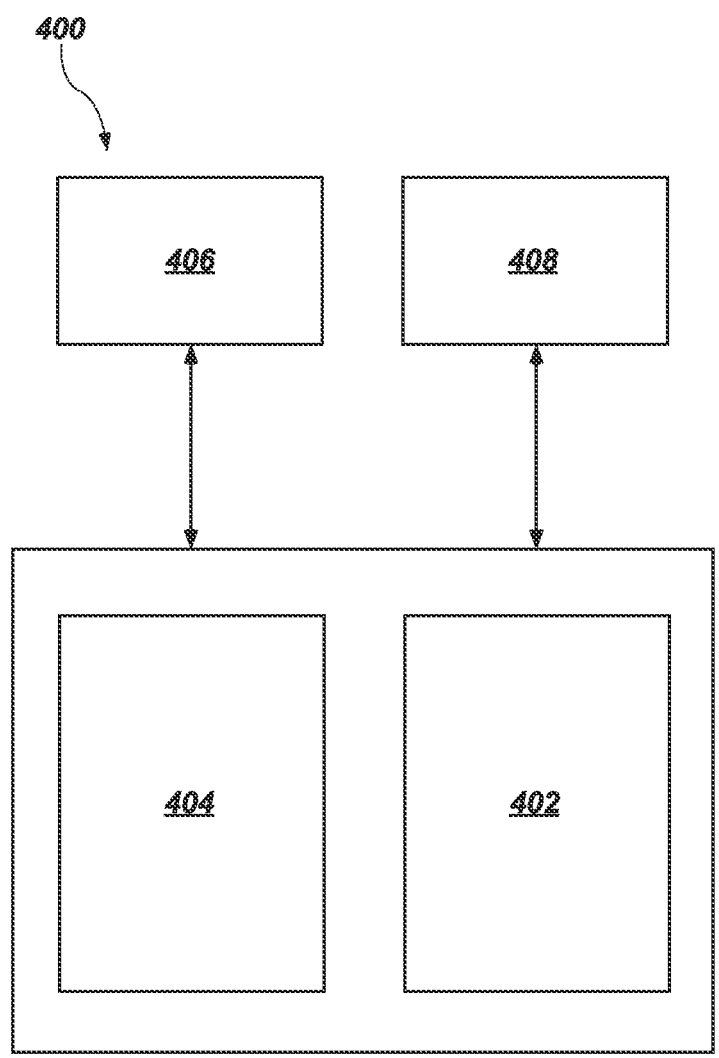
FIG. 4 is a schematic block diagram of an electronic system, in accordance with an embodiment of the disclosure.

Structures, assemblies, and devices in accordance with embodiments of the disclosure may be included in electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 3N. The electronic system 400 may further include at least one electronic signal processor device 404 (often referred to as a "microprocessor"). The electronic signal processor device 404 may, optionally, include an embodiment of one or more of a microelectronic device structure, a microelectronic device structure assembly, a relatively larger microelectronic device structure assembly, and a microelectronic device previously described herein with reference to FIG. 1A through FIG. 3N. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 3N. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises a first die and a second die. The first die comprises a multiplexer region within a base structure, global digit lines vertically above the multiplexer region, the global digit lines horizontally extending in a first direction, vertical stacks of memory cells vertically overlying the multiplexer region, and a stack structure horizontally extending in a second direction and comprising a vertically alternating sequence of conductive structures and insulative structures intersecting the vertical stacks of memory cells. The second die comprises a second die comprising a complementary metal-oxide-semiconductor (CMOS) region comprising a sense amplifier. The memory device further comprises conductive contact structures in electrical communication with the global digit lines, the sense amplifier vertically above the conductive contact structures.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
    a first microelectronic device structure comprising:
        multiplexers within a base structure;
        a stack structure vertically overlying the base structure and comprising conductive structures vertically alternating with insulative structures;
        a staircase structure within the stack structure; and
        vertical stacks of memory cells, each vertical stack of memory cells individually comprising:
            a vertical stack of capacitor structures;
            transistor structures each individually neighboring a capacitor structure of the capacitor structures; and
            a conductive pillar structure vertically extending through the transistor structures;
    a second microelectronic device structure attached to the first microelectronic device structure, the second microelectronic device structure comprising a sub word line driver region comprising complementary metal-oxide-semiconductor (CMOS) circuits vertically overlying and within a horizontal area of the staircase structure; and
    conductive contact structures vertically extending between steps of the staircase structure and the sub word line driver region.

2. The microelectronic device of claim 1, wherein the first microelectronic device structure further comprises a conductive contact exit region comprising second conductive contact structures vertically extending from the first microelectronic device structure to the second microelectronic device structure.

3. The microelectronic device of claim 2, wherein the second microelectronic device structure further comprises sense amplifier regions comprising additional CMOS circuits, each of the sense amplifier regions vertically overlying and within a horizontal area of the conductive contact exit region of the first microelectronic device structure.

4. The microelectronic device of claim 1, wherein the first microelectronic device structure further comprises global digit lines vertically below the vertical stacks of memory cells, each of the global digit lines coupled to more than one conductive pillar structure.

5. The microelectronic device of claim 4, wherein the global digit lines horizontally extend between multiple stack structures.

6. The microelectronic device of claim 4, wherein the global digit lines are individually coupled to a second conductive structure at horizontal ends of the global digit lines.

7. The microelectronic device of claim 6, wherein about one-half of the global digit lines are individually coupled to one of the second conductive structures at a first horizontal end of the first microelectronic device structure.

8. The microelectronic device of claim 7, wherein the other about one-half of the global digit lines are individually coupled to one of the second conductive structures at a second horizontal end of the first microelectronic device structure, the second horizontal end opposite the first horizontal end.

9. The microelectronic device of claim 4, wherein the multiplexers are between the global digit lines and the vertical stacks of memory cells.

10. The microelectronic device of claim 1, wherein the second microelectronic device structure comprises a main word line driver region comprising additional CMOS circuits directly horizontally neighboring the sub word line driver region.

11. The microelectronic device of claim 1, wherein the vertical stacks of memory cells are located between the multiplexers and the second microelectronic device structure.

12. The microelectronic device of claim 1, wherein;
    a first portion of the vertical stacks of memory cells vertically neighbor a first vertical boundary of the first base structure; and
    a second portion of the vertical stacks of memory cells vertically neighbor a second, opposite vertical boundary of the first base structure.

13. The microelectronic device of claim 12, wherein the multiplexers are vertically between the first portion of the vertical stacks of memory cells and the second portion of the vertical stacks of memory cells.

14. The microelectronic device of claim 13, further comprising back end of line (BEOL) structures over the second microelectronic device structure, the second microelectronic device structure between the BEOL structures and the first microelectronic device structure.

15. A memory device, comprising:
    a first die comprising:
        a memory array region comprising vertical stacks of memory cells;
        a stack structure comprising alternating conductive structures and insulative structures intersecting the vertical stacks of memory cells, horizontal edges of the alternating conductive structures and insulative structures defining steps of a staircase structure;
        conductive pillar structures vertically extending through access devices of the memory array region; and
        global digit lines vertically underlying the vertical stacks of memory cells and extending from a conductive contact exit region at a first horizontal end of the memory array region to an additional conductive contact exit region at a second horizontal end of the memory array region opposite the first horizontal end of the memory array region;

a second die bonded to the first die, the second die comprising:
  a sub word line driver vertically overlying the staircase structure of the first die, the staircase structure of the first die within a horizontal area of the sub word line driver; and
  sense amplifier regions comprising one or more sense amplifiers vertically overlying the conductive contact exit region and the additional conductive contact exit region; and
conductive contacts vertically extending between the sense amplifier regions and each of the conductive contact exit region and the additional conductive contact exit region.

16. The memory device of claim 15, further comprising additional conductive contacts vertically extending between the sub word line driver and the staircase structure.

17. The memory device of claim 15, wherein each global digit line is electrically connected to more than one conductive pillar structure of the conductive pillar structures.

18. The memory device of claim 15, further comprising additional stack structures comprising additional alternating conductive structures and additional insulative structures intersecting additional vertical stacks of memory cells.

19. The memory device of claim 18, wherein horizontal edges of the additional alternating conductive structures and additional insulative structures define additional steps of an additional staircase structure.

20. The memory device of claim 19, wherein the additional staircase structure is horizontally offset from the staircase structure.

21. The memory device of claim 19, further comprising an additional sub word line driver vertically above the additional staircase structure.

22. The memory device of claim 15, further comprising a multiplexer region vertically between the global digit lines and the stack structure.

23. The memory device of claim 22, wherein the stack structure is vertically between the multiplexer region and the second die.

24. The memory device of claim 15, wherein the global digit lines are vertically between the vertical stacks of memory cells and additional vertical stacks of memory cells.

25. The memory device of claim 24, wherein one half of the global digit lines are electrically coupled to the vertically stacks of memory cells and the other one half of the global digit lines are electrically coupled to the additional vertical stacks of memory cells.

26. A method of forming a microelectronic device, the method comprising:
  forming a first microelectronic device structure comprising:
    a multiplexer region formed in a base structure;
    a memory array region comprising vertical stacks of memory cells vertically neighboring the multiplexer region;
    a stack structure intersecting the vertical stacks of memory cells, conductive structures of the stack structure in electrical communication with memory cells of the vertical stacks of memory cells, horizontal ends of the conductive structures defining steps of a staircase structure;
    first conductive contact structures in electrical communication with the conductive structures of the stack structure;
    conductive pillar structures vertically extending through the vertical stacks of memory cells and in electrical communication with multiplexers of the multiplexer region;
    global digit lines extending in a horizontal direction vertically below the vertical stacks of memory cells;
    second conductive contact structures in electrical communication with the global digit lines; and
    a first oxide material overlying the memory array region and the stack structure;
  forming a second microelectronic device structure comprising:
    a sense amplifier region comprising one or more sense amplifiers; and
    a second oxide material overlying the sense amplifier region; and
  attaching the first microelectronic device structure to the second microelectronic device structure, attaching the first microelectronic device structure to the second microelectronic device structure comprising:
    horizontally aligning the second conductive contact structures with circuitry of the sense amplifier region; and
    bonding the first oxide material to the second oxide material.

27. The method of claim 26, wherein attaching the first microelectronic device structure to the second microelectronic device structure further comprises horizontally aligning the first conductive contact structures with a sub word line driver region of the second microelectronic device structure.

28. The method of claim 26, wherein attaching the first microelectronic device structure to the second microelectronic device structure comprises:
  physically contacting the first oxide material with the second oxide material; and
  thermally annealing the first microelectronic device structure and the second microelectronic device structure to bond the first oxide material with the second oxide material.

29. The method of claim 26, wherein forming a first microelectronic device structure comprises:
  forming the vertical stacks of memory cells vertically neighboring a first side of the first base structure; and
  forming additional vertical stacks of memory cells vertically neighboring a second, opposite side of the first base structure.

30. The method of claim 29, wherein forming the vertical stacks of memory cells vertically neighboring a first side of the first base structure and forming additional vertical stacks of memory cells vertically neighboring a second, opposite side of the first base structure comprises forming the vertical stacks of memory cells and forming the additional vertical stacks of memory cells prior to forming the second microelectronic device structure.

31. The method of claim 26, wherein attaching the first microelectronic device structure to the second microelectronic device structure comprises positioning the stack structure vertically between the multiplexer region and the second microelectronic device structure.

32. The method of claim 26, further comprising forming additional vertical stacks of memory cells vertically below the global digit lines.

33. The method of claim 32, wherein forming a first microelectronic device structure comprises forming the multiplexer region between the vertical stacks of memory cells and the additional vertical stacks of memory cells.

34. The method of claim 26, further comprising forming back end of line (BEOL) structures over the second microelectronic device structure after attaching the first microelectronic device structure to the second microelectronic device structure.

35. The method of claim 34, wherein a first microelectronic device structure comprises forming the first microelectronic device structure prior to forming the back end of line (BEOL) structures.

36. An electronic system, comprising:
   an input device;
   an output device;
   a processor device operably coupled to the input device and the output device; and
   a memory device operably coupled to the processor device and comprising:
      a first die comprising:
         a multiplexer region within a base structure;
         global digit lines vertically above the multiplexer region, the global digit lines horizontally extending in a first direction;
         vertical stacks of memory cells vertically overlying the multiplexer region; and
         a stack structure horizontally extending in a second direction and comprising a vertically alternating sequence of conductive structures and insulative structures intersecting the vertical stacks of memory cells;
      a second die comprising a complementary metal-oxide-semiconductor (CMOS) region comprising a sense amplifier; and
      conductive contact structures in electrical communication with the global digit lines, the sense amplifier vertically above the conductive contact structures.

\* \* \* \* \*

UNITED STATES PATENT AND TRADEMARK OFFICE
CERTIFICATE OF CORRECTION

PATENT NO. : 11,916,032 B2
APPLICATION NO. : 17/562453
DATED : February 27, 2024
INVENTOR(S) : Fatma Arzum Simsek-Ege and Yuan He It is certified that error appears in the above-identified patent and that said Letters Patent is hereby corrected as shown below:

In the Specification

| | | |
|---|---|---|
| Column 8, | Lines 60-61, | change "oxide (HfD$_2$), zirconium" to --oxide (HfO$_2$), zirconium-- |
| Column 8, | Lines 61-62, | change "dioxide (HfD$_2$), tantalum" to --dioxide (HfO$_2$), tantalum-- |
| Column 12, | Line 18, | change "oxide (HfD$_2$), zirconium" to --oxide (HfO$_2$), zirconium-- |
| Column 13, | Line 2, | change "oxide (HfD$_2$), zirconium," to --oxide (HfO$_2$), zirconium-- |
| Column 13, | Line 3, | change "dioxide (HfD$_2$), tantalum" to --dioxide (HfO$_2$), tantalum-- |

Signed and Sealed this
Sixteenth Day of April, 2024

Katherine Kelly Vidal
*Director of the United States Patent and Trademark Office*